US010059087B2

(12) United States Patent
Kaneiwa et al.

(10) Patent No.: US 10,059,087 B2
(45) Date of Patent: Aug. 28, 2018

(54) TRANSFER FILM, METHOD FOR MANUFACTURING TRANSFER FILM, LAMINATE, METHOD FOR MANUFACTURING LAMINATE, CAPACITIVE INPUT DEVICE, AND IMAGE DISPLAY DEVICE

(71) Applicant: FUJIFILM Corporation, Tokyo (JP)

(72) Inventors: Hideki Kaneiwa, Fujinomiya (JP); Kentaro Toyooka, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/379,600

(22) Filed: Dec. 15, 2016

(65) Prior Publication Data

US 2017/0095999 A1    Apr. 6, 2017

Related U.S. Application Data

(63) Continuation of application No. PCT/JP2015/071712, filed on Jul. 30, 2015.

(30) Foreign Application Priority Data

Aug. 12, 2014   (JP) .................................. 2014-164485

(51) Int. Cl.
*B32B 7/02*    (2006.01)
*B32B 37/00*   (2006.01)
(Continued)

(52) U.S. Cl.
CPC .............. *B32B 37/025* (2013.01); *B32B 7/02* (2013.01); *B32B 27/08* (2013.01); *B32B 27/20* (2013.01);
(Continued)

(58) Field of Classification Search
CPC .... G06F 3/03547; G06F 3/041; G06F 3/0412; G06F 3/044; G06F 2203/04104;
(Continued)

(56) References Cited

U.S. PATENT DOCUMENTS

2007/0074316 A1   3/2007   Alden et al.
2008/0283799 A1  11/2008   Alden et al.
(Continued)

FOREIGN PATENT DOCUMENTS

CN      101292362 A    10/2008
JP      2005-208559 A   8/2005
(Continued)

OTHER PUBLICATIONS

International Search Report of PCT/JP2015/071712, dated Oct. 27, 2015. [PCT/ISA/210].
(Continued)

*Primary Examiner* — Bruce H Hess
(74) *Attorney, Agent, or Firm* — Sughrue Mion, PLLC

(57) ABSTRACT

A transfer film according to a first embodiment has a temporary support and a first transparent resin layer containing a metal oxidation inhibitor, in which the first transparent resin layer has a refractive index of 1.60 or higher. A transfer film according to a second embodiment has a temporary support and a first transparent resin layer, in which the first transparent resin layer contains a metal oxidation inhibitor and metal oxide particles.

25 Claims, 8 Drawing Sheets

(51) Int. Cl.
| | |
|---|---|
| *B32B 27/08* | (2006.01) |
| *B32B 27/32* | (2006.01) |
| *B32B 27/30* | (2006.01) |
| *B32B 27/42* | (2006.01) |
| *B32B 27/40* | (2006.01) |
| *B32B 27/20* | (2006.01) |
| *H03K 17/96* | (2006.01) |
| *G06F 3/044* | (2006.01) |

(52) U.S. Cl.
CPC .......... *B32B 27/306* (2013.01); *B32B 27/308* (2013.01); *B32B 27/32* (2013.01); *B32B 27/40* (2013.01); *B32B 27/42* (2013.01); *G06F 3/044* (2013.01); *H03K 17/962* (2013.01); *B32B 2250/03* (2013.01); *B32B 2250/24* (2013.01); *B32B 2255/10* (2013.01); *B32B 2255/205* (2013.01); *B32B 2264/102* (2013.01); *B32B 2305/30* (2013.01); *B32B 2307/412* (2013.01); *B32B 2323/00* (2013.01); *B32B 2329/04* (2013.01); *B32B 2333/08* (2013.01); *B32B 2375/00* (2013.01); *B32B 2457/208* (2013.01); *G06F 2203/04103* (2013.01)

(58) Field of Classification Search
CPC ... B32B 7/02; B32B 7/20; B32B 2203/04103; B32B 2264/102; B32B 2307/412; B32B 2457/208
USPC ...................................................... 428/32.77
See application file for complete search history.

(56) References Cited

U.S. PATENT DOCUMENTS

| | | | |
|---|---|---|---|
| 2008/0286447 | A1 | 11/2008 | Alden et al. |
| 2011/0285019 | A1 | 11/2011 | Alden et al. |

FOREIGN PATENT DOCUMENTS

| | | | |
|---|---|---|---|
| JP | 2009-505358 | A | 2/2009 |
| JP | 2012-133486 | A | 7/2012 |
| JP | 2014-108541 | A | 6/2014 |
| JP | 2014-141592 | A | 8/2014 |
| WO | 2013/084873 | A1 | 6/2013 |
| WO | 2016/002026 | A1 | 1/2016 |

OTHER PUBLICATIONS

Written Opinion of PCT/JP2015/071712, dated Oct. 27, 2015 [PCT/ISA/237].
International Preliminary Report on Patentability and Written Opinion, dated Feb. 14, 2017, in corresponding International Application No. PCT/JP2015/071712, 11 pages in English and Japanese.
Communication dated May 30, 2017, issued from the Japan Patent Office in corresponding Japan Patent Application No. 2015-149713.
Communication dated Jan. 9, 2018, from Japanese Patent Office in counterpart application No. 2015-149713.
Office Action dated May 2, 2018, issued by the State Intellectual Property Office of the P.R.C. In corresponding Chinese Application No. 201580032215.4.

TRANSFER FILM, METHOD FOR MANUFACTURING TRANSFER FILM, LAMINATE, METHOD FOR MANUFACTURING LAMINATE, CAPACITIVE INPUT DEVICE, AND IMAGE DISPLAY DEVICE

CROSS-REFERENCE TO RELATED APPLICATIONS

This application is a Continuation of PCT International Application No. PCT/JP2015/71712, filed on Jul. 30, 2015, which claims priority under 35 U.S.C. § 119(a) to Japanese Patent Application No. 2014-164485, filed on Aug. 12, 2014. Each of the above application(s) is hereby expressly incorporated by reference, in its entirety, into the present application.

BACKGROUND OF THE INVENTION

1. Field of the Invention

The present invention relates to a transfer film, a method for manufacturing a transfer film, a laminate, a method for manufacturing a laminate, a capacitive input device, and an image display device.

2. Description of the Related Art

In recent years, it has been suggested, in regard to capacitive input devices (touch panels), to form a transparent resin layer having a high refractive index on a transparent electrode pattern, in view of lowering visibility of the transparent electrode.

For example, the transfer film described in JP2014-108541A is known.

Furthermore, it has been suggested to laminate a transfer material on a substrate at the time of manufacturing a capacitive input device. For example, the transfer film and photosensitive sheet described in JP2014-108541A or JP2005-208559A are known.

SUMMARY OF THE INVENTION

In regard to the formation of an insulating layer or a protective layer for an electrode pattern film for a touch panel, in order to extract signals, it is necessary to produce a region from which a insulating layer or a protective layer has been removed, in some portions of metal wiring sections around a transparent electrode by means of methods such as pattern developing (patterning). In this region in which the insulating layer or the protective layer is not formed, since metal is exposed, there is a risk that metal parts may be deteriorated in the middle of the subsequent steps.

Prior art technologies disclose methods for forming an insulating layer, a protective layer, or the like using a transfer film; however, in non-pattern-formed areas, oxidation may occur.

An object of the invention is to provide a transfer film which is used for forming an insulating layer or a protective layer, and has excellent pattern concealability and excellent protective properties in a region from which an insulating layer or a protective layer has been removed; a method for manufacturing a transfer film; a laminate; and a method for manufacturing a laminate.

Furthermore, another object of the invention is to provide a capacitive input device manufactured using the transfer film; a capacitive input device including the laminate; and an image display device including such a capacitive input device as a constituent element.

The objects of the invention described above are addressed by the means described in the following items <1>, <3>, <16> to <20>, <27>, <30>, or <32>. Preferred embodiments <2> to <15>, <21> to <26>, <28> to <29>, and <31> will be described together below.

<1> A transfer film comprising a temporary support; and a first transparent resin layer containing a metal oxidation inhibitor, wherein the first transparent resin layer has a refractive index of 1.60 or higher.

<2> The transfer film according to <1>, wherein the first transparent resin layer contains metal oxide particles.

<3> A transfer film comprising a temporary support and a first transparent resin layer, wherein the first transparent resin layer contains a metal oxidation inhibitor and metal oxide particles.

<4> The transfer film according to <2> or <3>, wherein the metal oxide particles are titanium oxide particles, titanium composite oxide particles, zirconium oxide particles, or tin oxide particles.

<5> The transfer film according to any one of <1> to <4>, further comprising a second transparent resin layer between the temporary support and the first transparent resin layer, wherein the second transparent resin layer is photosensitivity.

<6> The transfer film according to <5>, wherein the second transparent resin layer contains a polymerizable compound and a photopolymerization initiator.

<7> The transfer film according to <5> or <6>, wherein the second transparent resin layer is an alkali-developable layer.

<8> The transfer film according to any one of <5> to <7>, wherein the refractive index of the second transparent resin layer is smaller than the refractive index of the first transparent resin layer.

<9> The transfer film according to any one of <5> to <8>, wherein the second transparent resin layer has a refractive index of less than 1.60.

<10> The transfer film according to any one of <1> to <9>, wherein the metal oxidation inhibitor is a compound having an aromatic ring containing a nitrogen atom as a ring member.

<11> The transfer film according to <10>, wherein the aromatic ring containing a nitrogen atom as a ring member is at least one ring selected from the group consisting of an imidazole ring, a triazole ring, a tetrazole ring, a thiadiazole ring, and fused rings of these rings and other aromatic rings.

<12> The transfer film according to <10> or <11>, wherein the aromatic ring containing a nitrogen atom as a ring member is an imidazole ring, a triazole ring, a fused ring of an imidazole ring and another aromatic ring, or a fused ring of a triazole ring and another aromatic ring.

<13> The transfer film according to any one of <1> to <12>, wherein the metal oxidation inhibitor is benzimidazole, benzotriazole, 1-[N,N-bis(2-ethylhexyl)aminomethyl]benzotriazole, 1-[N,N-bis(2-ethylhexyl)aminomethyl]methylbenzotriazole, or carboxybenzotriazole.

<14> The transfer film according to any one of <1> to <13>, wherein the content of the metal oxidation inhibitor is 0.1% by mass or more with respect to the total mass of the first transparent resin layer.

<15> The transfer film according to any one of <1> to <14>, wherein the first transparent resin layer has photo-curing properties and/or thermosetting properties.

<16> A method for manufacturing a transfer film, the method comprising a step of forming a second transparent resin layer on a temporary support; and a step of forming a first transparent resin layer on the second transparent resin layer, wherein the first transparent resin layer contains a metal oxidation inhibitor, and the first transparent resin layer has a refractive index of 1.60 or higher.

<17> A method for manufacturing a transfer film, the method comprising a step of forming a second transparent resin layer on a temporary support; and a step of forming a first transparent resin layer on the second transparent resin layer, wherein the first transparent resin layer contains a metal oxidation inhibitor and metal oxide particles.

<18> A method for manufacturing a transfer film, the method comprising a step of forming a second transparent resin layer containing a polymerizable compound and a photopolymerization initiator on a temporary support; and a step of forming a first transparent resin layer on the second transparent resin layer, wherein the first transparent resin layer contains a metal oxidation inhibitor, and the first transparent resin layer has a refractive index of 1.60 or higher.

<19> A laminate comprising a base material; a transparent electrode pattern disposed on the base material; a first transparent resin layer disposed adjacently to the transparent electrode pattern; and a second transparent resin layer disposed on the first transparent resin layer, wherein the first transparent resin layer contains a metal oxidation inhibitor, and the first transparent resin layer has a refractive index of 1.60 or higher.

<20> A laminate comprising a base material; a transparent electrode pattern disposed on the base material; a first transparent resin layer disposed adjacently to the transparent electrode pattern; and a second transparent resin layer disposed on the first transparent resin layer, wherein the first transparent resin layer contains a metal oxidation inhibitor and metal oxide particles.

<21> The laminate according to <19> or <20>, wherein the base material is a transparent film substrate.

<22> The laminate according to <21>, wherein the transparent electrode pattern, the first transparent resin layer, and the second transparent resin layer are provided on both surfaces of the transparent film substrate.

<23> The laminate according to <21> or <22>, further comprising a transparent film having a refractive index of 1.60 to 1.78 and a film thickness of 55 to 110 nm between the transparent electrode pattern and the transparent film substrate.

<24> The laminate according to any one of <19> to <23>, further comprising a metal wiring section electrically connected to the transparent electrode pattern.

<25> The laminate according to <24>, wherein a metal oxidation inhibitor is provided on the metal wiring section in a region from which the first transparent resin layer and the second transparent resin layer have been removed.

<26> The laminate according to any one of <19> to <25>, wherein the first transparent resin layer and/or the second transparent resin layer are patterned.

<27> A method for manufacturing a laminate, the method comprising preparing the transfer film according to any one of <1> to <15>; laminating the first transparent resin layer of the transfer film on a transparent electrode pattern disposed on a base material, such that the first transparent resin layer is brought into contact with the transparent electrode pattern; and peeling the temporary support, in this order.

<28> The method for manufacturing a laminate according to <27>, wherein the base material is a transparent film substrate.

<29> The method for manufacturing a laminate according to <27> or <28>, further comprising a step of patterning the first transparent resin layer laminated on the transparent electrode pattern.

<30> A capacitive input device manufactured using the transfer film according to any one of <1> to <15>.

<31> A capacitive input device comprising the laminate according to any one of <19> to <26>.

<32> An image display device comprising the capacitive input device according to <30> or <31> as a constituent element.

According to the invention, a transfer film that is used for forming an insulating layer or a protective layer and has excellent pattern concealability and excellent protective properties in a region from which an insulating layer or a protective layer has been removed, a method for manufacturing a transfer film, a laminate, and a method for manufacturing a laminate can be provided. According to the invention, a capacitive input device manufactured using the transfer film, a capacitive input device including the laminate, and an image display device including such a capacitive input device as a constituent element can be provided.

DESCRIPTION OF THE PREFERRED EMBODIMENTS

Figure 1A:
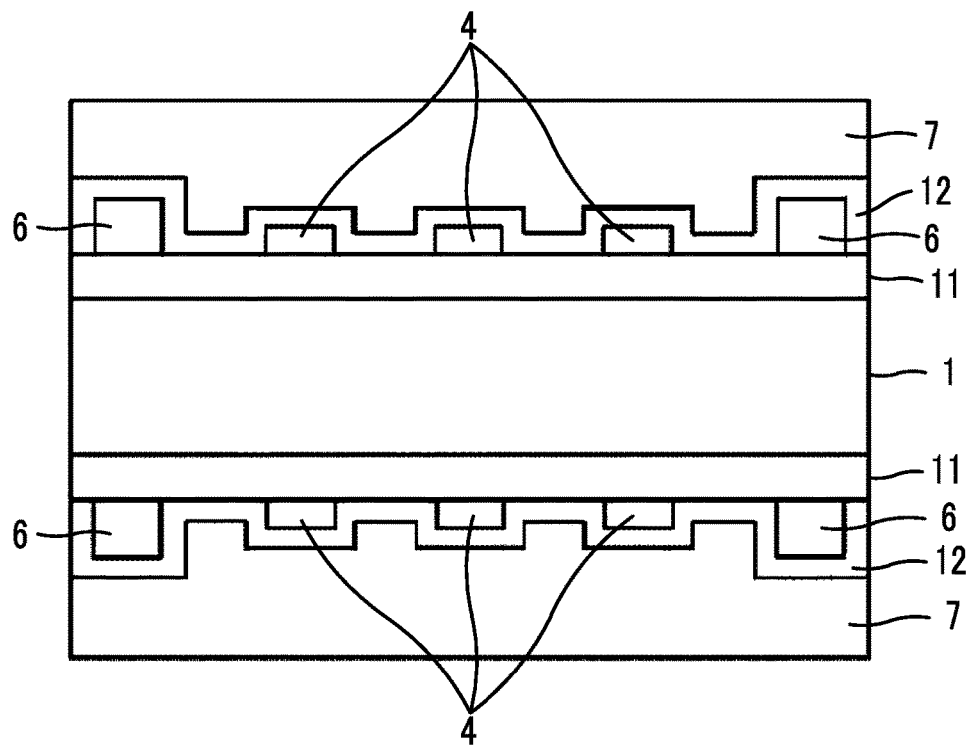
FIG. 1A is a schematic cross-sectional view illustrating an example of the configuration of the capacitive input device of the invention.

The subject matters of the invention will be described in detail below. Explanation of the configuration requirements described below is based on representative embodiments of the invention; however, the invention is not intended to be limited to those embodiments. The symbol "~" as used in the present specification is used to mean to include the numerical values described before and after the symbol as a lower limit and an upper limit, respectively. Also, an organic EL element refers to an organic electroluminescence element.

In regard to the description of a group (atomic group) according to the present specification, a description without the indication of being substituted or unsubstituted is meant to include a group that does not have a substituent as well as a group having a substituent. For example, the term "alkyl group" is to include an alkyl group having no substituent (unsubstituted alkyl group) as well as an alkyl group having a substituent (substituted alkyl group).

According to the present specification, the term "(meth) acrylate" represents acrylate and methacrylate; the term "(meth)acryl" represents acryl and methacryl; and the term "(meth)acryloyl" represents acryloyl and methacryloyl.

Furthermore, according to the invention, the units "% by mass" and "% by weight" have the same meaning, and the units "parts by mass" and "parts by weight" have the same meaning.

According to the invention, a combination of preferred embodiments is more preferred.

According to the invention, in regard to a polymer component, the molecular weight is a weight-average molecular weight that is measured by gel permeation chromatography (GPC) in a case in which tetrahydrofuran (THF) as a solvent, and calculated relative to polystyrene standards.

(Transfer Film)

A first embodiment of the transfer film of the invention has a temporary support; and a first transparent resin layer containing a metal oxidation inhibitor, in which the first transparent resin layer has a refractive index of 1.60 or higher. Hereinafter, unless particularly stated otherwise, the refractive index according to the invention is a value obtained at 25° C.

A second embodiment of the transfer film of the invention has a temporary support; and a first transparent resin layer, in which the first transparent resin layer contains a metal oxidation inhibitor and metal oxide particles.

The "transparent resin layer" according to the invention implies that in a case in which a laminate is formed by transferring a resin layer onto a base material having a transmittance of 90% or higher, the transmittance of this laminate is 80% or higher. Regarding the transmittance, an arithmetic mean value of values measured in a wavelength range of 400 to 750 nm at a pitch of 10 nm can be used.

<Methods for Measuring Refractive Index and Thickness of Transfer Film>

According to the invention, the refractive index of the first transparent resin layer, the thickness of the first transparent resin layer, and the refractive index of the second transparent resin layer that will be described below can be determined as follows, using a reflection spectroscopic thickness meter, FE-3000 (manufactured by Otsuka Electronics Co., Ltd.). The following measurement is carried out under the conditions of 25° C.

(1) A temporary support is prepared, and this is cut into a piece having a size of 10 cm in length×10 cm in width. A black polyethylene terephthalate (PET) material is contacted with one surface of the cut temporary support, with a transparent adhesive tape (OCA tape (Optically Clear Adhesive tape) 8171CL; manufactured by 3M Company) interposed therebetween, and thus a laminate (first laminate) is produced. The reflective spectrum (wavelength: 430 to 800 nm) of the first laminate is evaluated using a reflection spectroscopic thickness meter, FE-3000, and the refractive indices $n_0$ of the temporary support at various wavelengths are determined.

(2) A sample is prepared such that only a second transparent resin layer is formed on a temporary support, and this is cut into a piece having a size of 10 cm in length×10 cm in width. A laminate (second laminate) is produced in which a black PET material is contacted with the temporary support surface of the cut sample, with a transparent adhesive tape (OCA tape 8171CL; manufactured by 3M Company) interposed therebetween. The second laminate is subjected to a structural analysis using transmission electron microscopy (TEM). The thickness of the second transparent resin layer is measured at 10 sites, the average value is determined, and a first prospective value $T_2(I)$ of the average value of thicknesses of the second transparent resin layer is determined. The reflective spectrum (wavelength: 430 to 800 nm) of the second laminate is evaluated using a reflection spectroscopic thickness meter, FE-3000. The refractive indices $n_2$ of the second transparent resin layer at various wavelengths and a second prospective value $T_2(II)$ of the average value of thicknesses of the second transparent resin layer are determined. At this time, in order to take account of the reflection at the interface between the second transparent resin layer and the temporary support, the refractive index $n_2$ and the second prospective value $T_2(II)$ of the second laminate are determined from the reflective spectrum of the second laminate by fitting based on simulation calculation, while having the value of the refractive index $n_0$ determined in section (1), and the first prospective value $T_2(I)$ inserted into the calculation formula.

(3) A transfer film is prepared by forming a second transparent resin layer and a first transparent resin layer on a temporary support, and this is cut into a piece having a size of 10 cm in length×10 cm in width (in a case in which the transfer film has a protective film, the protective film is peeled off). A sample piece (third laminate) is produced in which a black PET material is contacted with the temporary support surface of the cut transfer film, with a transparent adhesive tape (OCA tape 8171CL; manufactured by 3M Company) interposed therebetween. The sample piece is subjected to a structural analysis using transmission electron microscopy (TEM). The thickness of the first transparent resin layer is measured at 10 sites, the average value is determined, and a prospective value $T_1(I)$ of the average value of thickness of the first transparent resin layer is determined. In regard to the sample piece, the reflective spectrum at 200 measurement points on a straight line in an arbitrary direction at an interval of 0.2 mm at a measurement spot: diameter ϕ 40 μm (that is, 4 cm in length) is evaluated using a reflection spectroscopic thickness meter, FE-3000. This is repeated in five rows at an interval of 1 cm in a direction orthogonal to the direction of the straight line described above, at 1,000 points in total. At this time, in order to take account of the reflection at the interface between the second transparent resin layer and the temporary support, and the interface between the second transparent resin layer and the first transparent resin layer, the refractive index $n_1$ of the first transparent resin layer, and the thicknesses of the second transparent resin layer and the first transparent resin layer at the 1,000 measurement points are determined from the reflective spectrum of the third laminate by fitting based on simulation calculation, while having the refractive index $n_0$ determined in section (1), the refractive index $n_2$ and the second prospective value $T_2(II)$ determined in section (2), and the first prospective value $T_2(I)$ inserted into the calculation formula. Furthermore, the average values, maximum values, minimum values, and standard deviations of the thicknesses of the second transparent resin layer and the first transparent resin layer are calculated, and $n_1$, $n_2$, $T_1$, $T_2$, $\sigma_1$, and $H_1$ are determined. $n_1$ represents the refractive index of the first transparent resin layer; $n_2$ represents the refractive index of the second transparent resin layer; $T_1$ represents the average thickness of the first transparent resin layer; $T_2$ represents the average thickness of the second transparent resin layer; $\sigma_1$ represents the standard deviation of thickness of the second transparent resin layer; and $H_1$ represents the difference between the maximum value and the minimum value of thickness of the first transparent resin layer.

In regard to the thickness of the second transparent resin layer and the thickness of the first transparent resin layer, the fitting accuracy of the simulation can be increased by inputting the prospective values obtained by performing a structural analysis by TEM, into the reflection spectroscopic thickness meter.

It is preferable that the transfer film of the invention further has a second transparent resin layer between the temporary support and the first transparent resin layer, and the second transparent resin layer has photosensitivity.

By adopting a configuration such as described above, a laminate having an effect of reducing visibility of the transparent electrode pattern can be formed. Without being bound by any theory, when the difference between the refractive indices of the transparent electrode pattern (preferably indium tin oxide (ITO)) and the first transparent resin layer, and the difference between the refractive indices of the first and second transparent resin layers are made smaller, light reflection is reduced, and the transparent electrode pattern becomes hard to see, and visibility can be ameliorated.

Furthermore, when the first transparent resin layer contains a metal oxidation inhibitor, on the occasion of laminating the first transparent resin layer on the base material, the metal wiring section that is in direct contact with the first transparent resin layer can be subjected to a surface treatment. Protective properties of the metal wiring section by the surface treatment is considered to be effective even after the first transparent resin layer (and second transparent resin layer) have been removed.

In the following description, a preferred embodiment of the transfer film of the invention will be explained. The transfer film of the invention is preferably used as an insulating layer or a protective layer, and it is more preferable that the transfer film is used as a transparent insulating layer or a transparent protective layer of a capacitive input device.

<Temporary Support>

The transfer film of the invention has a temporary support. A temporary support is a support that is peeled off after the first transparent resin layer and/or second transparent resin layer of the transfer film have been transferred.

Regarding the temporary support, a material which has flexibility and does not cause significant deformation, shrinkage or elongation under pressure, or under pressure and heating, can be used. Examples of such a support include a polyethylene terephthalate film, a cellulose triacetate film, a polystyrene film, and a polycarbonate film. Among these, a biaxially stretched polyethylene terephthalate film is particularly preferred.

The thickness of the temporary support is not particularly limited, and the thickness is generally in the range of 5 to 200 μm, and particularly preferably in the range of 10 to 150 μm from the viewpoints of easy handleability and general-purpose usability.

Furthermore, the temporary support may be transparent, and may contain a silicon dye, an alumina sol, a chromium salt, a zirconium salt, or the like.

The temporary support can be imparted with electrical conductivity by the method described in JP2005-221726A, or the like.

<First Transparent Resin Layer and Second Transparent Resin Layer>

The transfer film according to a first embodiment of the invention has a temporary support, and a first transparent resin layer containing a metal oxidation inhibitor, in which the first transparent resin layer has a refractive index of 1.60 or higher.

The transfer film according to a second embodiment of the invention has a temporary support and a first transparent resin layer, in which the first transparent resin layer contains a metal oxidation inhibitor and metal oxide particles.

It is preferable that the transfer film of the invention further has a second transparent resin layer between the temporary support and the first transparent resin layer, and the second transparent resin layer has photosensitivity.

The first transparent resin layer and the second transparent resin layer may be thermosetting, may be photocurable, or may be thermosetting and photocurable.

Above all, it is preferable that the first transparent resin layer and the second transparent resin layer are transparent resin layers having at least thermosetting properties, from the viewpoint that film reliability can be imparted to the transparent resin layers by thermally curing the resin layers after transfer. It is more preferable that the first and second transparent resin layers are transparent resin layers having thermosetting properties and are also transparent resin layers having photocuring properties, from the viewpoint that it is easy to form films by photocuring after transfer, and film reliability can be imparted to the resin layers by thermally curing the resin layers after film formation.

Among the embodiments described above, it is preferable that at least the second transparent resin layer is thermosetting and photocurable, and from the viewpoint of physical tolerance of the cured film after curing, it is more preferred that the first transparent resin layer and the second transparent resin layer are both thermosetting and photocurable.

The materials for the first transparent resin layer and the second transparent resin layer are not particularly limited, as long as the range of the refractive index of the first transparent resin layer such as described above is satisfied. The transfer film of the invention may be a negative type material, or may be a positive type material.

In a case in which the transfer film of the invention is a negative type material, it is preferable that the first transparent resin layer and the second transparent resin layer are respectively formed by applying a resin composition obtained by dissolving components such as a binder polymer, a polymerizable compound, and a polymerization initiator in a solvent.

Furthermore, it is preferable that between the first transparent resin layer and the second transparent resin layer, any one of them is a layer exhibiting water-solubility, and the other is a layer exhibiting water-insolubility, and it is more preferable that the first transparent resin layer is a layer exhibiting water-solubility, and the second transparent resin layer is a layer exhibiting water-insolubility.

According to the embodiment described above, after the second transparent resin layer is laminated on the temporary support, even if the first transparent resin layer is laminated without curing the second transparent resin layer, layer demarcation is achieved at a satisfactory level, and visibility of the transparent electrode pattern can be ameliorated by the mechanism described above. Furthermore, after refractive index regulating layers (that is, first and second transparent resin layers) are transferred from the transfer film onto the transparent electrode pattern, developing into a desired pattern can be achieved by photolithography. If layer demarcation between the first and second transparent resin layers is poorly achieved, the refractive index regulating effect obtainable by the mechanism described above is likely to become insufficient, and amelioration of the visibility of the transparent electrode pattern is likely to become insufficient.

A layer exhibiting water-solubility refers to a layer that completely dissolves and/or disperses, in a case in which the layer is immersed in water at 25° C., in an immersion time of 10 minutes/µm or less per unit film thickness.

Furthermore, a layer exhibiting water-insolubility refers to a layer that does not completely dissolve and/or disperse, in a case in which the layer is immersed in water at 25° C., in an immersion time of 10 minutes/µm or less per unit film thickness.

According to the invention, in a case in which the first and/or second transparent resin layer is curable, the measurement by means of immersion in water is carried out using the first and/or second transparent resin layer before being cured.

—Solvent—

For the resin compositions used for forming the first transparent resin layer and/or the second transparent resin layer (hereinafter, also referred to as "composition for forming a first transparent resin layer" and "composition for forming a second transparent resin layer", respectively), the following solvents can be used.

In a case in which the first transparent resin layer and/or the second transparent resin layer is a layer exhibiting water-insolubility, general organic solvents can be used for the composition for forming a first transparent resin layer and/or the composition for forming a second transparent resin layer, which are used for forming a layer exhibiting water-insolubility. Examples thereof include methyl ethyl ketone, propylene glycol monomethyl ether, propylene glycol monomethyl ether acetate, cyclohexanone, methyl isobutyl ketone, toluene, xylene, ethyl acetate, butyl acetate, ethyl lactate, methyl lactate, and caprolactam.

In a case in which the first transparent resin layer and/or the second transparent resin layer are layers exhibiting water-solubility, it is preferable to use water or a mixed solvent of water and a lower alcohol having 1 to 3 carbon atoms as a water-based solvent, for the composition for forming a first transparent resin layer and/or the composition for forming a second transparent resin layer, which are used for forming a layer exhibiting water-solubility. In regard to the transfer film of the invention, it is preferable that the layer exhibiting water-solubility is formed by applying water or a mixed solvent of water and a lower alcohol having 1 to 3 carbon atoms, and it is more preferable that the layer exhibiting water-solubility is formed by applying a coating liquid including water or a mixed solvent at a content ratio of water/alcohol having 1 to 3 carbon atoms as a mass ratio of 20/80 to 100/0. The content ratio of water/alcohol having 1 to 3 carbon atoms is particularly preferably in the range of 30/70 to 80/20 as a mass ratio, and most preferably 35/65 to 65/35.

The water-based solvent is preferably water, a mixed solvent of water and methanol, and a mixed solvent of water and ethanol, and from the viewpoints of drying and coatability, a mixed solvent of water and methanol is preferred.

Particularly, in a case in which the first transparent resin layer is water-soluble, and the second transparent resin layer is water-insoluble, in a case in which a mixed solvent of water and methanol is used for the composition for forming a first transparent resin layer, the mass ratio (ratio of percent (%) by mass) of water/methanol is preferably 20/80 to 100/0, more preferably in the range of 30/70 to 90/10, particularly preferably 35/65 to 65/35, and most preferably 38/62 to 60/40. If the content of methanol becomes larger than this content ratio of water/alcohol having 1 to 3 carbon atoms as a mass ratio in the range of 20/80, the second transparent resin layer dissolves or becomes cloudy, and it is not preferable.

By controlling the content ratio to the range described above, application and rapid drying can be realized without layer mixing with the second transparent resin layer. The components to be included in the various layers, in a case in which the transfer film of the invention is a negative type material, will be described in detail below.

[Materials for First Transparent Resin Layer and Second Transparent Resin Layer]

The first transparent resin layer contains a metal oxidation inhibitor.

Examples of the compounds that are incorporated into the first transparent resin layer and the second transparent resin layer include metal oxide particles, a binder polymer, a polymerizable compound, and a photopolymerization initiator.

The details of the various layers will be described later.

The first transparent resin layer is preferably a layer exhibiting water-solubility, and the second transparent resin layer is preferably a layer exhibiting water-insolubility.

—Metal Oxidation Inhibitor—

The first transparent resin layer used for the invention contains a metal oxidation inhibitor.

The second transparent resin layer used for the invention may contain a metal oxidation inhibitor.

The metal oxidation inhibitor used for the invention is preferably a compound having an aromatic ring containing a nitrogen atom as a ring member.

Furthermore, in regard to the metal oxidation inhibitor used for the invention, it is preferable that the aromatic ring containing a nitrogen atom is at least one ring selected from the group consisting of an imidazole ring, a triazole ring, a tetrazole ring, a thiadiazole ring, and fused rings of those rings and other aromatic rings. It is more preferable that the aromatic ring containing a nitrogen atom is an imdiazole ring, a triazole ring, a fused ring of an imidazole ring and another aromatic ring, or a fused ring of a triazole ring and another aromatic ring; and it is even more preferable that the aromatic ring containing a nitrogen atom is an imidazole ring or a fused ring of an imidazole ring and another aromatic ring.

The other aromatic ring may be a homocyclic ring or a heterocyclic ring; however, the other aromatic ring is preferably a homocyclic ring, more preferably a benzene ring or a naphthalene ring, and even more preferably a benzene ring.

Hereinafter, a compound having a benzimidazole structure will also be referred to as a benzimidazole compound, and a compound having a benzotriazole structure will also be referred to as a benzotriazole compound.

The metal oxidation inhibitor used for the invention is preferably a benzimidazole compound or a benzotriazole compound.

The benzimidazole compound is not particularly limited as long as it is a compound having a benzimidazole structure, and examples thereof include benzimidazole, 2-phenylbenzimidazole, 2-toluylbenzimidazole, 2-phenyl-5-chlorobenzimidazole, 2-methylbenzimidazole, 2-ethylbenzimidazole, 2-propylbenzimidazole, 2-(2'-ethylpropyl)benzimidazole, 2-(phenylmethyl)benzimidazole, 2-(diphenylmethyl)benzimidazole, 2-diphenylmethyl-5-methylbenzimidazole, 2-(naphthylmethyl)benzimidazole, 2-naphthylmethyl-5-chlorobenzimidazole, 2-thienylbenzimidazole, 2-mercaptobenzimidazole, 2-mercapto-5-methoxybenzimidazole, 2-mercapto-5-carboxybenzimidazole, 2-mercapto-5-methylbenzimidazole-, 2-hydroxybenzimidazole, 2-bromobenzimidazole, 2-mercapto-5-nitrobenzimidazole, and 2-mercapto-5-aminobenzimidazole.

The benzotriazole compound is not particularly limited as long as it is a compound having a benzotriazole structure, and it is preferable that the benzotriazole compound has a structure represented by the following formula (A), from the viewpoint of obtaining a superior corrosion preventing effect.

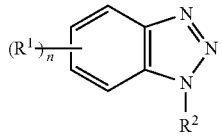

(A)

In formula (A), $R^1$ represents a substituent such as a hydrogen atom, an alkyl group having 1 to 6 carbon atoms, an alkoxy group having 1 to 6 carbon atoms, an aryl group having 6 to 14 carbon atoms, a group represented by formula (B), a mercapto group, or an alkoxycarbonyl group having 1 to 6 carbon atoms; n represents an integer from 0 to 4; in a case in which n is 2 or larger, n units of $R^1$ may be identical with or different from each other; and $R^2$ represents a substituent such as a hydrogen atom, an alkyl group having 1 to 12 carbon atoms, an alkoxy group having 1 to 12 carbon atoms, an aryl group having 6 to 14 carbon atoms, a group represented by formula (B), a mercapto group, or an alkoxycarbonyl group having 1 to 12 carbon atoms.

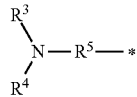

(B)

In formula (B), $R^3$ and $R^4$ each independently represent a hydrogen atom or an alkyl group having 1 to 10 carbon atoms; $R^5$ represents a single bond or an alkylene group having 1 to 6 carbon atoms; and the symbol * represents a site of bonding to another structure.

Preferred examples of the metal oxidation inhibitor include imidazole, benzimidazole, tetrazole, mercaptothiadiazole, benzotriazole, 1-[N,N-bis(2-ethylhexyl)aminomethyl]benzotriazole, 1-[N,N-bis(2-ethylhexyl)aminomethyl]methylbenzotriazole, 2,2-{[(methyl-1H-benzotriazol-1-yl)methyl]imino}bisethanol, and carboxybenzotriazole. More preferred examples include imidazole, benzimidazole, benzotriazole, 1-[N,N-bis(2-ethylhexyl)aminomethyl]benzotriazole, 1-[N,N-bis(2-ethylhexyl)aminomethyl]methylbenzotriazole, and carboxybenzotriazole; even more preferred examples include benzimidazole, benzotriazole, 1-[N,N-bis(2-ethylhexyl)aminomethyl]benzotriazole, 1-[N,N-bis(2-ethylhexyl)aminomethyl]methylbenzotriazole, and carboxybenzotriazole; and particularly preferred examples include benzimidazole and benzotriazole.

The content of the metal oxidation inhibitor is preferably 0.1% to 20% by mass, more preferably 0.5% to 10% by mass, and even more preferably 1% to 5% by mass, with respect to the total mass of the first transparent resin layer used for the invention.

—Metal Oxide Particles—

It is preferable that the first transparent resin layer contains metal oxide particles, for the purpose of regulating the refractive index or light-transmitting properties. The second transparent resin layer may contain metal oxide particles for the purpose of regulating the refractive index or light-transmitting properties. Since metal oxide particles are highly transparent and have light-transmitting properties, a first transparent resin layer having a high refractive index and excellent transparency can be obtained.

It is preferable that the metal oxide particles have a higher refractive index than the refractive index of the layer formed from a material excluding the metal oxide particles. Specifically, regarding the metal oxide particles used for the first transparent resin layer, particles having a refractive index for light having a wavelength of 400 to 750 nm of 1.70 or higher are more preferred, particles having a refractive index of 1.80 or higher are even more preferred, and particles having a refractive index of 1.90 or higher are particularly preferred. Furthermore, regarding the metal oxide particles used for the second transparent resin layer, particles having a refractive index for light having a wavelength of 400 to 750 nm of 1.50 or higher are more preferred, particles having a refractive index of 1.80 or higher are even more preferred, and particles having a refractive index of 1.90 or higher are particularly preferred.

Here, when it is said that the refractive index for light having a wavelength of 400 to 750 nm is 1.50 or higher, it is implied that the average refractive index for light having a wavelength in the above-mentioned range is 1.50 or higher, and it is not necessary that the refractive index for light having a wavelength in the above-mentioned range is 1.50 or higher. Furthermore, the average refractive index is a value obtained by dividing the sum total of measured values of refractive index for various light rays having wavelengths in the above-mentioned range, by the number of measurement points.

It should be noted that the metals for the metal oxide particles also include semi-metals such as B, Si, Ge, As, Sb and Te.

Regarding the metal oxide particles that are light-transmissible and have a high refractive index, oxide particles containing atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi and Te are preferred; titanium oxide particles, titanium composite oxide particles, zinc oxide particles, zirconium oxide particles, indium/tin oxide particles, and antimony/tin oxide particles are more preferred; titanium oxide particles, titanium composite oxide particles, and zirconium oxide particles are even more preferred; and titanium oxide particles, zirconium oxide particles, and tin oxide particles are particularly preferred. From the viewpoint that the particles are chemically and physically stable and that a fine particle dispersion liquid is readily available, zirconium oxide particles are most preferred. These metal oxide particles may also have the surface treated with an organic material, for the purpose of imparting dispersion stability to the particles.

From the viewpoint of transparency of the resin composition, the average primary particle size of the metal oxide particles is preferably 1 to 200 nm, and particularly preferably 3 to 80 nm. Here, the average primary particle size of particles refers to a value obtained by measuring the particle sizes of any 200 arbitrary particles by electron microscopy, and calculating the arithmetic mean value thereof. In a case in which the shape of the particles is not spherical, the maximum diameter among the external diameters of a particle is designated as the particle size.

Regarding the metal oxide particles, one kind of particles may be used alone, or two or more kinds of particles may be used in combination.

The content of the metal oxide particles in the composition for forming a first transparent resin layer that will be described below may be appropriately determined in consideration of the refractive index, light-transmitting properties and the like required from an optical member thus obtainable. However, it is preferable to adjust the content of the metal oxide particles to 5% to 80% by mass, and more preferably to 10% to 70% by mass, with respect to the total solid content of the composition.

In regard to the transfer film of the invention, it is preferable that the first transparent resin layer has at least one of $ZrO_2$ particles or $TiO_2$ particles, from the viewpoint of controlling the refractive index to the above-described range of refractive index of the first transparent resin layer, and it is more preferable that the first transparent resin layer has $ZrO_2$ particles.

—Binder Polymer—

It is preferable that the first transparent resin layer and the second transparent resin layer contain a binder polymer. The binder polymer is not particularly limited as long as there is no effect contradictory to the purport of the invention, and can be appropriately selected from among known binder polymers. An alkali-soluble resin is preferred, and regarding the alkali-soluble resin described above, the polymers described in paragraph 0025 of JP2011-95716A and paragraphs 0033 to 0052 of JP2010-237589A can be used. Among them, an acrylic polymer having an acidic group is preferred.

Also, in a case in which the first transparent resin layer and/or the second transparent resin layer exhibits water-solubility, a polymer having solubility in the water-based solvent described above is used as the binder polymer.

The polymer having solubility in a water-based solvent is not particularly limited as long as there is no effect contradictory to the purport of the invention, and can be appropriately selected from among known polymers. For example, the aforementioned acrylic polymer having an acid group; the polyvinyl ether/maleic acid anhydride polymer described in JP1971-2121A (JP-S46-2121A) and JP1981-40824B (JP-S56-40824B); water-soluble salts of carboxyalkyl celluloses, water-soluble cellulose ethers, water-soluble salts of carboxyalkyl starches; polyvinyl alcohol derivatives such as polyvinyl alcohol, water-soluble polyvinyl butyral, and water-soluble polyvinyl acetal; polyvinylpyrrolidone, various polyacrylamides, various water-soluble polyamides, water-soluble salts of polyacrylic acid, gelatin, an ethylene oxide polymer, water-soluble salts of a family of various starches and analogues thereof, a styrene/maleic acid copolymer, and a maleate resin.

The binder polymer can be incorporated into the composition for forming a first transparent resin layer and/or the composition for forming a second transparent resin layer that will be described below, in the form of a polymer solution having the polymer dissolved in a solvent. The solvent is not particularly limited, and a solvent that is usually used for dissolving a polymer is used. Examples thereof include 1-methoxy-2-propyl acetate, 1-methoxy-2-propanol, and methyl ethyl ketone.

The polymer having solubility in a water-based solvent is preferably an acrylic polymer having an acidic group, or a polyvinyl alcohol derivative, and specifically, the polymer having solubility in a water-based solvent is particularly preferably an acrylic polymer having an acidic group, polyvinyl butyral, polyvinyl acetal, fully saponified polyvinyl alcohol, or a polyvinyl alcohol obtained by partially saponifying polyvinyl acetate.

—Polymerizable Compound—

It is preferable that the first transparent resin layer and the second transparent resin layer each contain a polymerizable compound.

The polymerizable compound is preferably a radical polymerizable compound.

Examples of the polymerizable compound used for the first transparent resin layer and the second transparent resin layer include monofunctional acrylates or monofunctional methacrylates, such as polyethylene glycol mono(meth)acrylate, polypropylene glycol mono(meth)acrylate, and phenoxyethyl (meth)acrylate;

polyethylene glycol di(meth)acrylate, polypropylene glycol di(meth)acrylate, trimethylolethane triacrylate, trimethylolpropane triacrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyoxyethyl) isocyanurate, tri(acryloyloxyethyl) cyanurate, and glycerin tri(meth)acrylate; and polyfunctional acrylates or polyfunctional methacrylates, such as products obtained by adding ethylene oxide or propylene oxide to polyfunctional alcohols such as trimethylolpropane and glycerin, and then (meth)acrylating the adducts.

Further examples include the urethane acrylates described in JP1973-41708B (JP-S48-41708B), JP1975-6034B (JP-S50-6034B), and JP1976-37193A (JP-S51-37193A); the polyester acrylates described in JP1973-64183A (JP-S48-64183A), JP1974-43191B (JP-S49-43191B), and JP1977-30490B (JP-S52-30490B); and polyfunctional acrylates or methacrylates, such as epoxy acrylates which are reaction products between epoxy resins and (meth)acrylic acid. Furthermore, acrylamide monomers represented by the following formula (1) can also be suitably used. Among the polymerizable compounds described above, polyfunctional acrylates, urethane acrylates, and acrylamide monomers are preferred.

Formula (1)

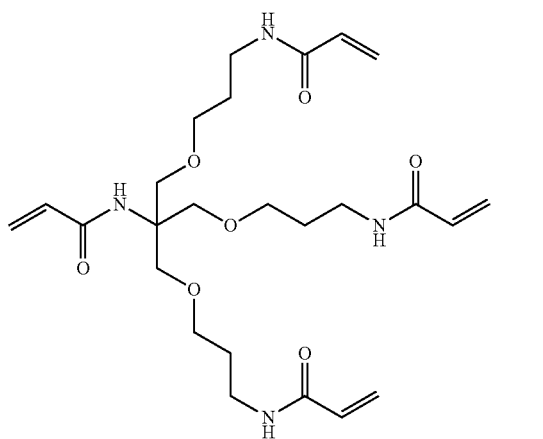

Regarding the polymerizable compound used in a case in which the first transparent resin layer and/or the second transparent resin layer is a layer exhibiting water-solubility, examples also include a monomer having a hydroxyl group, and a monomer having ethylene oxide or polypropylene oxide and a phosphoric acid in the molecule, in addition to the polymerizable compounds described above.

—Polymerization Initiator—

It is preferable that the first transparent resin layer and the second transparent resin layer each contain a polymerization initiator.

The polymerization initiator used for the first transparent resin layer and the second transparent resin layer is preferably a photopolymerization initiator, and a photoradical polymerization initiator is preferred.

In a case in which the first transparent resin layer and/or the second transparent resin layer is a water-soluble layer, it is preferable to use a photopolymerization initiator having solubility in a water-based solvent, and preferred examples include IRGACURE 2959 (manufactured by BASF SE) and a polymerization initiator represented by the following formula (2).

Formula (2)

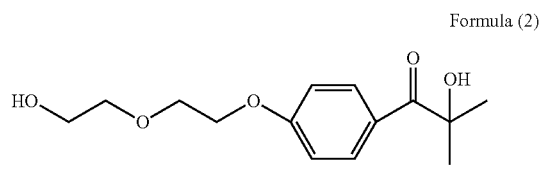 [SMILES: CC(C)(O)C(=O)c1ccc(OCCOCCO)cc1]

On the other hand, regarding the photopolymerization initiator or polymerization initiator used for the layer exhibiting water-insolubility, the photopolymerization initiators described in paragraphs 0031 to 0042 of JP2011-95716A can be used. Examples that can be preferably used include 1,2-octanedione, 1-[4-(phenylthio)-,2-(O-benzoyloxime)] (trade name: IRGACURE OXE-01, manufactured by BASF SE), as well as ethanone, 1-[9-ethyl-6-(2-methylbenzoyl)-9H-carbazol-3-yl]-,1-(O-acetyloxime) (trade name: IRGA-CURE OXE-02, manufactured by BASF SE), 2-(dimethylamino)-2-[(4-methylphenyl)methyl]-1-[4-(4-morpholinyl) phenyl]-1-butanone (trade name: IRGACURE 379EG, manufactured by BASF SE), 2-methyl-1-(4-methylthiophenyl)-2-morpholinopropan-1-one (trade name: IRGACURE 907, manufactured by BASF SE), 2-hydroxy-1-{4-[4-(2-hydroxy-2-methylpropionyl)benzyl]phenyl}-2-methylpropan-1-one (trade name: IRGACURE 127, manufactured by BASF SE), 2-benzyl-2-dimethylamino-1-(4-morpholinophenyl)-butanone-1 (trade name: IRGACURE 369, manufactured by BASF SE), 2-hydroxy-2-methyl-1-phenylpropan-1-one (trade name: IRGACURE 1173, manufactured by BASF SE), 1-hydroxycyclohexyl phenyl ketone (trade name: IRGACURE 184, manufactured by BASF SE), 2,2-dimethoxy-1,2-diphenylethan-1-one (trade name: IRGACURE 651, manufactured by BASF SE), and an oxime ester-based photopolymerization initiator (trade name: LUNAR 6, manufactured by DKSH Japan K.K.).

—Polymer Latex—

Furthermore, in a case in which the composition for forming a first transparent resin layer and/or the composition for forming a second transparent resin layer contains a water-based solvent, the first transparent resin layer and the second transparent resin layer may include polymer particles derived from a polymer latex. Here, the polymer latex as used herein is a product in which fine particles of a water-insoluble polymer are dispersed in water. In regard to the polymer latex, details are described in, for example, Muroi Soichi, "Kobunshi Latekkusu no Kagaku (Chemistry of Polymer Latexes) (published by Kobunshi Kankokai (1973))".

Regarding the polymer particles that can be used, polymer particles formed from acrylic, vinyl acetate-based, rubber-based (for example, styrene-butadiene-based and chloroprene-based), olefin-based, polyester-based, polyurethane-based, and polystyrene-based polymers, and copolymers of these polymers, are preferred. It is preferable to strengthen the mutual bonding force between the polymer chains that constitute the polymer particles. Regarding the means for strengthening the mutual bonding force between polymer chains, a method of utilizing an interaction based on hydrogen bonding, and a method of producing covalent bonds may be used. Regarding the means for imparting hydrogen bonding force, it is preferable to introduce a monomer having a polar group into a polymer chain by performing copolymerization or graft polymerization. Examples of the polar group include a carboxyl group (contained in acrylic acid, methacrylic acid, itaconic acid, fumaric acid, maleic acid, crotonic acid, partially esterified maleic acid, and the like), primary, secondary and tertiary amino groups, an ammonium salt group, and a sulfonic acid group (styrene-sulfonic acid group). A carboxyl group and a sulfonic acid group are particularly preferred. A preferred range for the copolymerization ratio of such a monomer having a polar group is 5% to 35% by mass, more preferably 5% to 20% by mass, and even more preferably in the range of 15% to 20% by mass, with respect to 100% by mass of the polymer. On the other hand, regarding the means for producing covalent bonds, a method of reacting a hydroxyl group, a carboxyl group, a primary amino group, a secondary amino group, an acetoacetyl group, a sulfonic acid group or the like, with an epoxy compound, a blocked isocyanate, an isocyanate, a vinylsulfone compound, an aldehyde compound, a methylol compound, a carboxylic acid anhydride or the like, may be used.

Among the polymers obtained by utilizing these reactions, a polyurethane derivative obtainable by a reaction between a polyol and a polyisocyanate compound is preferred, and it is more preferable to use a polyvalent amine as a chain extending agent in combination with the polymer. It is particularly preferable to introduce the polar groups described above into the polymer chain to obtain an ionomer type polymer.

The weight-average molecular weight of the polymer is preferably 10,000 or more, and more preferably 20,000 to 100,000. As a polymer suitable for the invention, an ethylene ionomer which is a copolymer between ethylene and methacrylic acid, and a polyurethane ionomer may be mentioned.

The polymer latex that can be used for the invention may be a product obtainable by emulsion polymerization, or may be a product obtainable by emulsification. The methods for producing these polymer latexes are described in, for example, "Emarujon•Ratekkusu Handobukku (Handbook of Emulsions and Latexes)" (edited by Editorial Committee for Handbook of Emulsions and Latexes, published by Taiseisha, Ltd. (1975)). Examples of the polymer latex that can be used for the invention include an aqueous dispersion of a polyethylene ionomer (trade name: CHEMIPEARL S120, manufactured by Mitsui Chemicals, Inc., solid content 27%), (trade name; CHEMIPEARL S100, manufactured by Mitsui Chemicals, Inc., solid content 27%), (trade name: CHEMIPEARL S111, manufactured by Mitsui Chemicals, Inc., solid content 27%), (trade name: CHEMIPEARL S200, manufactured by Mitsui Chemicals, Inc., solid content 27%), (trade name: CHEMIPEARL S300, manufactured by Mitsui Chemicals, Inc., solid content 35%), (trade name: CHEMIPEARL S650, manufactured by Mitsui Chemicals, Inc., solid content 27%), or (trade name: CHEMIPEARL S75N, manufactured by Mitsui Chemicals, Inc., solid content 24%); an aqueous dispersion of a polyether-based polyurethane (trade name: HYDRAN WLS-201, manufactured by DIC Corporation, solid content 35%, Tg −50° C.), (trade name: HYDRAN WLS-202, manufactured by DIC Corporation, solid content 35%, Tg −50° C.), (trade name: WLS-221, manufactured by DIC Corporation, solid content 35%, Tg −30° C.), (trade name: HYDRAN WLS-210, manufactured by DIC Corporation, solid content 35%, Tg −15° C.), (trade name: HYDRAN WLS-213, manufactured by DIC Corporation, solid content 35%, Tg −15° C.), (trade name: HYDRAN WLI-602, manufactured by DIC Corporation, solid content 39.5%, Tg −50° C.), or (trade name: HYDRAN WLI-611, manufactured by DIC Corporation, solid content 39.5%, Tg −15° C.); and products obtained by subjecting an acrylic acid alkyl copolymer ammonium (trade name: JURYMER AT-210, manufactured by Nihon Junyaku Co., Ltd.), an acrylic acid alkyl copolymer ammonium (trade name: JURYMER ET-410, manufactured by Nihon Junyaku Co., Ltd.), an acrylic acid alkyl copolymer ammonium (trade name: JURYMER AT-510, manufactured by Nihon Junyaku Co., Ltd.), and polyacrylic acid (trade name: JURYMER AC-10L, manufactured by Nihon Junyaku Co., Ltd.), to neutralization with ammonia and emulsification.

—Other Additives—

In the first transparent resin layer or the second transparent resin layer, additives may also be used. Examples of the additives described above include the surfactants described in paragraph 0017 of JP4502784B and paragraphs 0060 to 0071 of JP2009-237362A; the thermal polymerization inhibitors described in paragraph 0018 of JP4502784B; and the other additives described in paragraphs 0058 to 0071 of JP2000-310706A.

Thus, the case in which the transfer film of the invention is a negative type material has been mainly explained; however, the transfer film of the invention may also be a positive type material. In a case in which the transfer film of the invention is a positive type material, for example, the materials described in JP2005-221726A and the like are used for the first and/or second transparent resin layer; however, the materials are not limited to these.

[First Transparent Resin Layer]

The first transparent resin layer according to the first embodiment of the transfer film of the invention has a refractive index of 1.60 or higher, preferably 1.62 or higher, and more preferably 1.65 or higher.

Furthermore, the upper limit of the refractive index is not particularly limited; however, the upper limit is preferably 1.85 or lower, and more preferably 1.74 or lower.

The first transparent resin layer according to the second embodiment of the transfer film of the invention preferably has a refractive index of 1.60 or higher, more preferably 1.62 or higher, and even more preferably 1.65 or higher.

Furthermore, the upper limit of the refractive index is not particularly limited; however, it is preferable that the upper limit is lower than the refractive index of the metal oxide particles used. Also, specifically, the upper limit is preferably 1.85 or lower, and more preferably 1.74 or lower.

The first transparent resin layer according to the invention may be thermosetting, may be photocurable, or may be thermosetting and photocurable.

From the viewpoint of the physical tolerance of the cured film after curing, it is preferable that the first transparent resin layer is photocurable and/or thermosetting.

Above all, it is preferable that the first transparent resin layer described above and the second transparent resin layer that will be described below are at least transparent resin layers having thermosetting properties, from the viewpoint that film reliability can be imparted to the transparent resin layers by thermally curing the resin layers after transfer. It is more preferable that the first transparent resin layer and the second transparent resin layer are thermal transparent resin layers and photo-transparent resin layers, from the viewpoint that it is easy to form films by photocuring after transfer, and film reliability can be imparted to the resin layers by thermally curing the resin layers after film-forming. It is preferable that the transparent resin layers have photocuring properties and/or thermosetting properties.

The first transparent resin layer according to the first embodiment of the transfer film of the invention includes the metal oxidation inhibitor described above, and from the viewpoint of controlling the refractive index of the first transparent resin layer to the above-described range, it is preferable that the first transparent resin layer further includes the metal oxide particles described above. Furthermore, it is more preferable that the first transparent resin layer further includes the metal oxide particles, the binder polymer, the polymerizable compound, and the polymerization initiator as described above, and the resin layer may further include the resin derived from a polymer latex, and those other additives described above.

The first transparent resin layer according to the second embodiment of the transfer film of the invention includes the metal oxidation inhibitor and the metal oxide particles. It is more preferable that the first transparent resin layer further includes the binder polymer, the polymerizable compound, and the polymerization initiator, and the first transparent resin layer may further include the resin derived from a polymer latex, and those other additives.

From the viewpoint that it is preferable that the first transparent resin layer used for the invention has photocuring properties and/or thermosetting properties, it is preferable for the first transparent resin layer includes a polymerizable compound and a polymerization initiator.

The first transparent resin layer may include the metal oxide particles at any arbitrary proportion depending on the kind of the polymer or polymerizable compound used; however, it is preferable that the metal oxide particles are included in the first transparent resin layer at a proportion of 40% to 95% by mass, more preferably 50% to 90% by mass, and particularly preferably 55% to 85% by mass, with respect to the total mass of the first transparent resin layer.

Furthermore, in a case in which the metal oxide particles are zirconium oxide particles, it is preferable that the metal oxide particles are included at a proportion of 40% to 90% by mass, more preferably 50% to 88% by mass, and particularly preferably 60% to 85% by mass, with respect to the total mass of the first transparent resin layer. In a case in which the metal oxide particles are titanium oxide particles, it is preferable that the metal oxide particles are included at a proportion of 20% t 80% by mass, more preferably 30% to 75% by mass, and particularly preferably 40% to 70% by mass, with respect to the total mass of the first transparent resin layer.

It is preferable that the first transparent resin layers according to the first embodiment and the second embodiment of the transfer film of the invention are formed using a composition for forming a first transparent resin layer.

The composition for forming a first transparent resin layer includes a metal oxidation inhibitor, and may also include the solvent, the metal oxide particles, the binder polymer, the polymerizable compound, the polymerization initiator, the polymer latex, and the other additives as described above, as necessary.

It is preferable that the first transparent resin layer used for the invention is disposed at the outermost layer, except for the protective film that will be described below, on the transfer film of the invention from the viewpoint of protective properties of the metal wiring section.

That is, in a case in which the transfer film of the invention is used, an embodiment in which the first transparent resin layer is directly contacted with the metal wiring section of the transfer destination, is preferred. The protective film that will be described below may be disposed as an outer layer relative to the first transparent resin layer; however, in this case, the protective film is removed before transfer.

The film thickness of the first transparent resin layer used for the transfer film of the invention is preferably 500 nm or less, and more preferably 110 nm or less. Furthermore, the film thickness of the first transparent resin layer is preferably 55 nm or more, more preferably 60 nm or more, and even more preferably 70 nm or more.

[Second Transparent Resin Layer]

It is preferable that the refractive index of the second transparent resin layer used for the transfer film of the invention is smaller than the refractive index of the first transparent resin layer. Furthermore, the refractive index of the second transparent resin layer is preferably less than 1.60, more preferably 1.48 to 1.55, even more preferably 1.50 to 1.53, particularly preferably 1.50 to 1.52, and most preferably 1.51 to 1.52.

It is preferable that the second transparent resin layer according to the invention has photosensitivity. The term "photosensitivity" means a property in which the solubility in a developer changes as a result of irradiation with light.

When the second transparent resin layer is photosensitive, the transfer film of the invention can be used as a positive type material or a negative type material.

From the viewpoint that the transfer film of the invention is preferably a negative type material, it is preferable that the second transparent resin layer is a photocurable layer.

When the second transparent resin layer has photosensitivity, the first transparent resin layer may not have photosensitivity; however, it is preferable that the second transparent resin layer and the first transparent resin layer both have photosensitivity, and it is particularly preferable that the second transparent resin layer and the first transparent resin layer both have photocuring properties.

Furthermore, from the viewpoint of physical tolerance of the cured film after being cured, it is preferable that the second transparent resin layer according to the invention has photocuring properties and thermosetting properties.

It is also preferable that the second transparent resin layer is an alkali-developable layer. An alkali-developable layer means a layer which exhibits solubility and/or swellability when brought into contact with an aqueous alkali solution.

It is preferable that the second transparent resin layer according to the invention contains the polymerizable compound and the photopolymerization initiator described above. When the second transparent resin layer of the invention contains a polymerizable compound and a photopolymerization initiator, the second transparent resin layer becomes a layer having photocuring properties.

It is more preferable that the second transparent resin layer further include the binder polymer described above, and may also further include the metal oxidation inhibitor, the metal oxide particles, the resin derived from a polymer latex, and the other additives as described above.

Regarding the material of the second transparent resin layer, any of the binder polymers or polymerizable compounds described above can be used without any particular limitations; however, from the viewpoint of being used as a transparent protective film of a capacitive input device, it is preferable that the second transparent resin layer has high surface hardness and high heat resistance. Among the binder polymers and polymerizable compounds described above, a known photosensitive siloxane resin material, a known acrylic resin material and the like are preferably used.

From the viewpoint that the second transparent resin layer is preferably alkali-developable, it is preferable that the transfer film of the invention contains an alkali-soluble resin as the binder polymer.

In the second transparent resin layer, it is preferable that the photopolymerization initiator is included at a proportion of 1% by mass or more, more preferably at a proportion of 2% by mass or more, and particularly preferably at a proportion of 3% by mass or more, with respect to the solid content of the second transparent resin layer.

The second transparent resin layer may or may not contain metal oxide particles. In order to control the refractive index of the second transparent resin layer to the range mentioned above, the second transparent resin layer may include metal oxide particles at any arbitrary proportion, depending on the kind of the polymer or polymerizable compound to be used therein. In the second transparent resin layer, it is preferable that the metal oxide particles are included at a proportion of 0% to 35% by mass, and more preferably at a proportion of 0% to 10% by mass, with respect to the solid content of the second transparent resin layer, and it is particularly preferable that the metal oxide particles are not included.

It is preferable that the second transparent resin layer for the transfer film of the invention is formed using a composition for forming a second transparent resin layer.

It is preferable that the composition for forming a second transparent resin layer includes the polymerizable compound and the polymerization initiator, and may also include the solvent, the metal oxidation inhibitor, the metal oxide particles, the binder polymer, the polymer latex, and the other additives as described above, as necessary.

The film thickness of the second transparent resin layer included in the transfer film used for the invention is preferably 1 μm or more, more preferably 1 to 20 μm, even more preferably 1 to 10 μm, particularly preferably 2 to 9 μm, and most preferably 3 to 8 μm.

When the film thickness of the second transparent resin layer is in the range described above, in a case in which a protective layer is produced using the transfer film of the invention, a protective layer having excellent protectiveness is obtained, which is preferable.

[Viscosity of Transparent Resin Layer]

It is preferable that the viscosity of the first transparent resin layer and the second transparent resin layer measured at 100° C. is in the range of 2,000 to 50,000 Pa·sec.

Here, the viscosity can be measured as follows. Sample processing is carried out by peeling the first transparent resin layer and the second transparent resin layer from the temporary support, once melting the samples at 85° C. on a heating stage, and then cooling the samples to room temperature. Viscosity can be measured under the following conditions using a melt viscosity analyzer (apparatus name: DHR-2, manufactured by TA Instruments Japan, Inc.). Measurement conditions: temperature: 40° C. to 140° C., rate of temperature increase: 5° C./min, frequency: 1 Hz, strain: 0.5%.

<Protective Film>

It is preferable that the transfer film of the invention has a protective film adjacently on the first transparent resin layer.

In the transfer film, as the protective film adjacent to the first transparent protective layer is peeled off and then transfer is performed, an embodiment in which the base material of the transfer destination and the first transparent protective layer become adjacent at the time of transfer, is obtained.

The protective films described in paragraphs 0083 to 0087 and 0093 of JP2006-259138A can be used as appropriate.

The protective film can be formed by pressure-bonding a sheet formed from the material described above, onto a film on which the first transparent resin layer and the like have been formed.

Regarding the pressure-bonding method, any known method can be used without any particular limitations.

<Other Layers>

The transfer film of the invention may also have other layers according to the purpose. Examples of the other layers include a hard coat layer that is provided between the second transparent resin layer and the temporary support in order to impart physical durability to the surface of the second transparent resin layer after transfer; and a release layer that is provided between the temporary support and the second transparent resin layer in order to facilitate peeling of the temporary support at the time of transfer. As described above, since it is preferable that the first transparent resin layer (excluding the protective film) is disposed as the outermost layer of the transfer film, in a case in which other layers exist, the other layers are preferably disposed on the temporary support side rather than the first transparent resin layer side.

Figure 12:
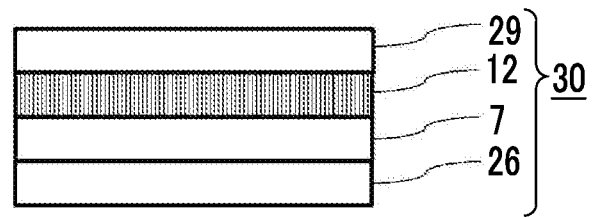
FIG. 12 is a schematic cross-sectional view illustrating an example of the configuration of the transfer film of the invention.

FIG. 12 illustrates an example of a preferred configuration of the transfer film of the invention. FIG. 12 is a schematic diagram of a transfer film 30 according to an embodiment of the invention, in which a temporary support 26, a second transparent resin layer 7, a first transparent resin layer 12, and a protective release layer (protective film) 29 are laminated adjacently to each other in this layer configuration.

(Method for Manufacturing Transfer Film)

The transfer film of the invention can be produced according to the method for producing a photosensitive transfer material described in paragraphs 0094 to 0098 of JP2006-259138A. Above all, it is preferable that the transfer film of the invention is manufactured according to the following method for manufacturing a transfer film of the invention.

A first embodiment of the method for manufacturing a transfer film of the invention comprises a step of forming a second transparent resin layer on a temporary support; and a step of forming a first transparent resin layer on the second transparent resin layer, in which the first transparent resin layer contains a metal oxidation inhibitor, and the refractive index of the first transparent resin layer is 1.60 or higher.

A second embodiment of the method for manufacturing a transfer film of the invention comprises a step of forming a second transparent resin layer on a temporary support; and a step of forming a first transparent resin layer on the second transparent resin layer, in which the first transparent resin layer contains a metal oxidation inhibitor and metal oxide particles.

A third embodiment of the method for manufacturing a transfer film of the invention comprises a step of forming a second transparent resin layer containing a polymerizable compound and a photopolymerization initiator on a temporary support; and a step of forming a first transparent resin layer on the second transparent resin layer, in which the first transparent resin layer contains a metal oxidation inhibitor, and the refractive index of the first transparent resin layer is 1.60 or higher.

Preferred embodiments of the temporary support, the second transparent resin layer and the first transparent resin layer in connection with the method for manufacturing a transfer film of the invention are similar to the preferred embodiments of these in connection with the transfer film of the invention as described above.

<Step of Forming Second Transparent Resin Layer>

First to third embodiments of the method for manufacturing a transfer film of the invention include a step of forming a second transparent resin layer according to the respective embodiments on a temporary support.

Regarding the method of forming a second transparent resin layer, it is preferable that the second transparent resin layer is formed by applying the composition for forming a second transparent resin layer described above, on a temporary support.

Regarding the method of applying the resin composition, any known method can be used without any particular limitations; however, for example, a method of forming a resin layer by applying a resin composition using a coating machine such as a spinner, a whirler, a roll coater, a curtain coater, a knife coater, a wire bar coater or an extruder, and drying the resin composition, may be preferably used.

<Step of Forming First Transparent Resin Layer on Second Transparent Resin Layer>

The method for manufacturing a transfer film of the invention includes a step of forming a first transparent resin layer on the second transparent resin layer.

Regarding the method of forming the first transparent resin layer, it is preferable to form the resin layer by applying a composition for forming a first transparent resin layer described above, on the second transparent resin layer.

Regarding the method for applying the composition for forming a first transparent resin layer, any known method can be used without any particular limitations, and for example, a method of forming a resin layer by applying a resin composition using a coating machine such as a spinner, a whirler, a roll coater, a curtain coater, a knife coater, a wire bar coater or an extruder, and drying the resin composition, may be preferably used.

In regard to the method for manufacturing a transfer film of the invention, it is preferable that any one composition between the composition for forming a first transparent resin layer and the composition for forming a second transparent resin layer, which are used for forming the first transparent resin layer and the second transparent resin layer, has a total content of water and an alcohol having 1 to 3 carbon atoms of 70% by mass or more of the amount of the coating solvent, while the other composition has a total content of water and an alcohol having 1 to 3 carbon atoms of 20% by mass or less of the amount of the coating solvent. It is more preferable that the total content of water and an alcohol having 1 to 3 carbon atoms in the amount of the coating solvent of the composition for forming a first transparent resin layer is 70% by mass or more, and the total content of water and an alcohol having 1 to 3 carbon atoms in the amount of the coating solvent of the composition for forming a second transparent resin layer is 20% by mass or less.

By adopting such a configuration, after the second transparent resin layer is laminated, even if the first transparent resin layer is laminated thereon without curing the second transparent resin layer, layer demarcation is achieved at a satisfactory level, the refractive indices of the two layers are maintained, and visibility of the transparent electrode pattern may be ameliorated (making it not easily visually recognized) as intended. In this case, since the transfer film is produced while the first and second transparent resin layers are in an uncured state, it is possible to produce a desired pattern by photolithography after the first and second transparent resin layers are transferred onto the transparent electrode pattern.

In contrast, in a case in which such a configuration as described above is not adopted, and the first transparent resin layer is laminated on the second transparent resin layer, the two layers are easily mixed, and it is difficult to maintain intended refractive indices. Therefore, it is difficult to obtain an effect of ameliorating the visibility of the transparent electrode pattern. In this case, in a case in which the second transparent resin layer has been cured before the first transparent resin layer is laminated, layer demarcation of the two layers is easily achieved; however, since a transfer film produced in this manner has the second transparent resin layer already cured, patterning by photolithography cannot be carried out.

(Laminate)

A first embodiment of the laminate of the invention comprises a base material; a transparent electrode pattern disposed on the base material; a first transparent resin layer disposed adjacently to the transparent electrode pattern; and a second transparent resin layer disposed on the first transparent resin layer, in which the first transparent resin layer contains a metal oxidation inhibitor, and the refractive index of the first transparent resin layer is 1.60 or higher.

A second embodiment of the laminate of the invention comprises a base material; a transparent electrode pattern disposed on the base material; a first transparent resin layer disposed adjacently to the transparent electrode pattern; and a second transparent resin layer disposed on the first transparent resin layer, in which the first transparent resin layer contains a metal oxidation inhibitor and metal oxide particles.

According to the embodiments described above, visibility of the transparent electrode pattern can be reduced.

Preferred embodiments of the second transparent resin layer and the first transparent resin layer for the laminate of the invention are similar to the preferred embodiments of these for the transfer film of the invention described above.

Furthermore, the laminate of the invention is preferably a transparent laminate. A transparent laminate refers to a laminate in which at least a portion is transparent, and it is preferable that a partial region including the transparent electrode pattern that will be described later is transparent. When it is said that the laminate is transparent, it means that the laminate has a transmittance of 80% or higher. Regarding the transmittance, an arithmetic mean value of the values measured in a wavelength range of 400 to 750 nm at a pitch of 10 nm can be used.

The first transparent resin layer according to the first embodiment of the laminate of the invention has a refractive index of 1.60 or higher, preferably 1.62 or higher, and more preferably 1.65 or higher.

The upper limit of the refractive index is not particularly limited; however, the upper limit is preferably 1.85 or lower, and more preferably 1.74 or lower.

The first transparent resin layer according to the second embodiment of the laminate of the invention has a refractive index of preferably 1.60 or higher, more preferably 1.62 or higher, and even more preferably 1.65 or higher.

Furthermore, the upper limit of the refractive index is not particularly limited; however, it is preferable that the refractive index is smaller than the refractive index of the metal oxide particles used therein. Specifically, the refractive index of the first transparent resin layer is preferably 1.85 or lower, and more preferably 1.74 or lower.

It is preferable that the refractive indices of the second transparent resin layers used for the first embodiment and the second embodiment of the laminate of the invention are smaller than the refractive indices of the first transparent resin layers. Furthermore, it is preferable that the refractive index of the second transparent resin layer is lower than 1.60, more preferably 1.48 to 1.55, even more preferably 1.50 to 1.53, particularly preferably 1.50 to 1.52, and most preferably 1.51 to 1.52.

<Refractive Index for Laminate, and Method for Measuring Thickness>

$n_1$, $n_2$, $T_2$, $\sigma_1$ and $H_1$ for the transparent laminate thus obtained can be determined using a reflection spectroscopic thickness meter, FE-3000 (manufactured by Otsuka Electronics Co., Ltd.), by repeating, for each layer, a method similar to the calculation of $n_1$, $n_2$, $T_2$, $\sigma_1$ and $H_1$ for the transfer film. An outline thereof will be described below. The following measurement is performed under the conditions of 25° C.

In a case in which a transparent base material (hereinafter, also referred to as "transparent substrate") is used as the base material, the refractive index can be measured as follows. A transparent base material means a base material in which the transmittance of the base material is 80% or higher. Regarding the transmittance, an arithmetic mean value of the values measured in a wavelength range of 400 to 750 nm at a pitch of 10 nm can be used. Also, a base material having a transmittance of less than 80% is referred to as a base material that is not transparent.

(1) In regard to a transparent laminate, for a sample obtained by laminating a transparent substrate, a transparent film and a transparent electrode pattern in this order, or a sample obtained by laminating a transparent substrate, a transparent film, a transparent electrode pattern and a first transparent resin layer in this order, the refractive indices of the various layers and the prospective values of thickness of the various layers are measured in advance.

(2) In the transparent laminate, a portion having a five-layer configuration of transparent substrate/transparent film/transparent electrode pattern/first transparent resin layer/second transparent resin layer is cut into a piece having a size of 10 cm in length×10 cm in width. On the cut transparent laminate, a black PET material is contacted, with a transparent adhesive tape (OCA tape 8171CL; manufactured by 3M Company) interposed therebetween, and thus a sample piece is produced. The sample piece is subjected to a structural analysis using transmission electron microscopy (TEM), and the prospective values of thickness of the various layers are determined. In regard to the sample piece, the reflective spectrum at 100 measurement points on a straight line in an arbitrary direction at an interval of 0.2 mm at a measurement spot: diameter $\phi$ 40 μm is evaluated using FE-3000 (manufactured by Otsuka Electronics Co., Ltd.). At this time, in order to take account of the interface between the first transparent resin layer and the transparent electrode pattern, and the interface between the second transparent resin layer and the first transparent resin layer, while having the refractive indices of the first transparent resin layer, the transparent substrate, the transparent film and the transparent electrode pattern, the prospective value of the average value of thickness of the second transparent resin layer, and the prospective value of the average value of thickness of the first transparent resin layer, inserted into the calculation formula, the refractive index $n_2$ of the second transparent resin layer, the refractive index $n_1$ of the first transparent resin layer, and the thicknesses of the second transparent resin layer and the first transparent resin layer at 100 measurement points are determined by fitting based on simulation calculation from the reflective spectrum of the portion of the five-layer configuration of transparent substrate/transparent film/transparent electrode pattern/first transparent resin layer/second transparent resin layer. Furthermore, the average values, maximum values, minimum values and standard deviations of thickness of the second transparent resin layer and the first transparent resin layer are calculated, and $n_1$, $n_2$, $T_1$, $T_2$, $\sigma_1$ and $H_1$ are calculated. In the present specification, an arbitrary direction is arranged as a direction parallel to one side of the sample piece, and 100 measurement points (that is, 2 cm in length) are arranged evenly at an interval of 1 cm from the center of one side of the sample piece.

In the case of using a base material that is not transparent, a sample piece having a black PET material attached on the back surface of the base material is produced in advance, with a transparent adhesive tape interposed there between. The reflective spectrum (wavelength: 430 to 800 nm) of the laminate of the base material and the black PET material is evaluated using a reflection spectroscopic thickness meter, FE-3000, and thus the refractive indices n, thicknesses T, and the extinction coefficients k at various wavelengths are determined. At the time of simulation calculation for the five-layer configuration sample, the refractive index n, thickness T, and extinction coefficient k are inserted into the calculation as the characteristics of the base material, and thereby the refractive indices and thicknesses of the second transparent resin layer and the first transparent resin layer can be determined by fitting.

<Transparent Film>

The laminate of the invention may further have a transparent film having a refractive index of 1.60 to 1.78 and a film thickness of 55 to 110 nm (hereinafter, simply referred to as "transparent film") or a known hard coat layer, on the transparent electrode pattern on the side opposite to the side where the second transparent resin layer. It is preferable that the laminate further has a transparent film having a refractive index of 1.60 to 1.78 and a film thickness of 55 to 110 nm, from the viewpoint of further ameliorating visibility of the transparent electrode pattern. According to the present specification, unless particularly stated otherwise, in a case in which the term "transparent film" is described, it refers to "a transparent film having a refractive index of 1.60 to 1.78 and a film thickness of 55 to 110 nm".

It is preferable that the laminate of the invention further has the transparent substrate that will be described below, on the transparent film having a refractive index of 1.60 to 1.78 and a film thickness of 55 to 110 nm on the side opposite to the side where the transparent electrode pattern is formed. The transparent substrate is preferably a transparent film substrate. In this case, it is preferable that the transparent film is disposed between the transparent electrode pattern and the transparent film substrate.

Furthermore, in regard to the laminate of the invention, it is preferable that the transparent electrode pattern is a transparent electrode pattern formed on a transparent film substrate.

Figure 9:
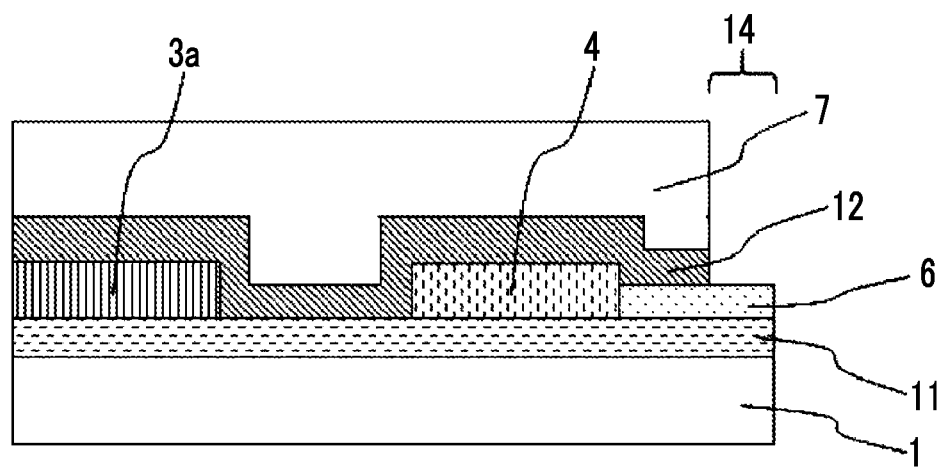
FIG. 9 is a schematic cross-sectional view illustrating another example of the laminate of the invention.

FIG. 9 illustrates an example of embodiment of the laminate of the invention.

The laminate shown in FIG. 9 is a transparent laminate.

In FIG. 9, the laminate comprises a transparent substrate 1 and a transparent film 11 having a refractive index of 1.60 to 1.78 and a film thickness of 55 to 110 nm, and a transparent electrode pattern 4, a pad part 3a that will be described below, a metal wiring section 6, a first transparent resin layer 12 and a second transparent resin layer 7 are laminated in this layer configuration.

Furthermore, in a partial region 14 on the metal wiring section 6, the first transparent resin layer 12 and the second transparent resin layer 7 have been removed by patterning.

Figure 11:
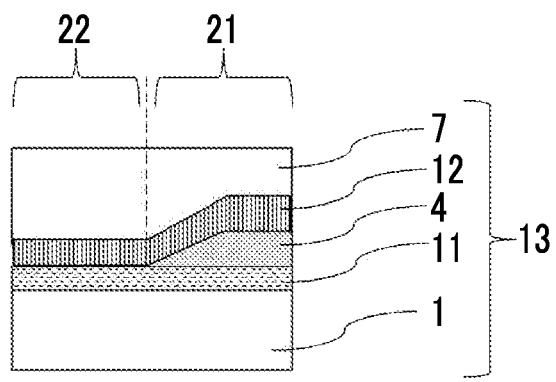
FIG. 11 is a schematic cross-sectional view illustrating an example of the configuration of the laminate of the invention.

FIG. 11 illustrates an example of configuration of the laminate of the invention.

The laminate in FIG. 11 is a transparent laminate 13.

In FIG. 11, the laminate has a transparent substrate 1, a transparent film 11 having a refractive index of 1.60 to 1.78 and a film thickness of 55 to 110 nm, a transparent electrode pattern 4, a first transparent resin layer 12 and a second transparent resin layer 7. The laminate in FIG. 11 has a region 21 in plane, in which the first transparent resin layer 12 and the transparent electrode pattern 4 are laminated to be in contact.

The term "in plane" means a direction that is approximately parallel to the plane that is parallel to the transparent substrate 1 of the laminate. When it is said that a region in which a transparent electrode pattern 4, a first transparent resin layer 12 and a second transparent resin layer 7 are laminated in this layer configuration is included in plane, it is implied that orthographic projection for a region in which the transparent electrode pattern 4, the first transparent resin layer 12 and the second transparent resin layer 7 are laminated in this layer configuration, onto a plane that is parallel to the transparent substrate of the laminate, exists in the plane that is parallel to the transparent substrate of the laminate.

Here, in a case in which the laminate of the invention is used for a capacitive input device that will be described below, the transparent electrode pattern may be provided as a first transparent electrode pattern and a second transparent electrode pattern respectively in two directions that are approximately orthogonal, namely, a transverse direction and a longitudinal direction (see, for example, FIG. 3). For example, in the configuration of FIG. 3, the transparent electrode pattern of the laminate of the invention may be a second transparent electrode pattern 4, or may be a pad part 3a of the first transparent electrode pattern 3. In other words, in the following explanation for the laminate of the invention, the reference numeral for the transparent electrode pattern may be representatively indicated by "4"; however, the transparent electrode pattern of the laminate of the invention is not intended to be limited to the use in the second transparent electrode pattern 4 in the capacitive input device of the invention, and may also be used as, for example, a pad part 3a of the first transparent electrode pattern 3.

It is preferable that the laminate of the invention includes a non-patterned region in which the transparent electrode pattern is not formed. In the present specification, a non-patterned region means a region in which a transparent electrode pattern is not formed.

FIG. 11 illustrates an embodiment in which the laminate of the invention includes the non-patterned region 22.

In regard to the laminate of the invention, it is preferable that a region in which the transparent substrate, the transparent film, and the first transparent resin layer are laminated in this layer configuration, is included in plane in at least a portion of the non-patterned region 22 in which the transparent electrode pattern 4 is not formed.

In regard to the laminate of the invention, it is preferable that in the region in which the transparent substrate, the transparent film, and the first transparent resin layer are laminated in this layer configuration, the transparent film and the first curable transparent resin layer are adjacent to each other.

However, in regions other than the non-patterned region 22, as long as there is no effect contradictory to the purport of the invention, other members may be disposed at arbitrary positions, and for example, in a case in which the laminate of the invention is used in the capacitive input device that will be described below, a mask layer 2, an insulating layer 5, a metal wiring section 6 and the like can be laminated thereon.

In regard to the laminate of the invention, it is preferable that the base material and the transparent film are adjacent to each other.

FIG. 11 illustrates an embodiment in which the transparent film 11 is laminated on the transparent substrate 1 adjacently thereto.

However, as long as there is no effect contradictory to the purport of the invention, a third transparent film may be laminated between the base material and the transparent film. For example, it is preferable that a third transparent film having a refractive index of 1.5 to 1.52 (not shown in FIG. 11) is included between the base material and the transparent film.

In regard to the laminate of the invention, it is preferable that the transparent film and the transparent electrode pattern are adjacent to each other.

FIG. 11 illustrates an embodiment in which the transparent electrode pattern 4 is laminated on a partial region of the transparent film 11.

As illustrated in FIG. 11, the shape of the edge of the transparent electrode pattern 4 is not particularly limited; however, the edge may have a tapered shape, and for example, the edge may have a tapered shape in which the plane on the transparent substrate side is larger than the plane on the side opposite to the transparent substrate.

Here, when the edge of the transparent electrode pattern has a tapered shape, the angle of the edge of the transparent electrode pattern (hereinafter, also referred to as taper angle) is preferably 30° or less, more preferably 0.1° to 15°, and particularly preferably 0.5° to 5°.

In regard to the method for measuring the taper angle according to the present specification, the taper angle can be determined by taking a microscopic photograph of an edge of the transparent electrode pattern, approximating the taper part in the microscopic photograph to a triangle, and directly measuring the taper angle.

Figure 10:
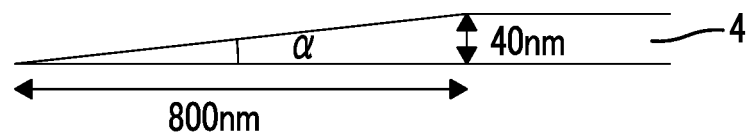
FIG. 10 is an explanatory diagram illustrating an example of a tapered shape of an edge of a transparent electrode pattern.

FIG. 10 illustrates an example of the case in which an edge of the transparent electrode pattern has a tapered shape. The triangle approximating the taper part in FIG. 10 has an underside of 800 nm and a height (film thickness at the upper base part that is approximately parallel to the underside) of 40 nm, and the taper angle α at this time is about 3°. The underside of the triangle approximating the taper part is preferably 10 to 3,000 nm, more preferably 100 to 1,500 nm, and particularly preferably 300 to 1,000 nm. A preferred range of the height of the triangle approximating the taper part is similar to the preferred range of the film thickness of the transparent electrode pattern.

It is preferable that the laminate of the invention includes a region in plane, in which the transparent electrode pattern and the first transparent resin layer are adjacent to each other.

FIG. 11 illustrates an embodiment in which in the region 21 in which the transparent electrode pattern, the first transparent resin layer and the second transparent resin layer are laminated such that the first transparent resin layer and the transparent electrode pattern are contacted, the transparent electrode pattern, the first transparent resin layer, and the second transparent resin layer are adjacent to each other.

Furthermore, in regard to the laminate of the invention, it is preferable that, in the region where the transparent electrode pattern is to be formed, both the transparent electrode pattern and the non-patterned region 22 are continuously covered, directly or with another layer interposed therebetween, by the transparent film and the first transparent resin layer.

Here, the term "continuously" means that the transparent film and the first transparent resin layer are not patterned films but are continuous films. That is, it is preferable that the transparent film and the first transparent resin layer do not have openings on the region where the transparent electrode pattern is formed, from the viewpoint of making the transparent electrode pattern not easily visually recognized.

Furthermore, it is preferable that the transparent electrode pattern and the non-patterned region 22 are directly covered by the transparent film and the first transparent resin layer, rather than being covered with another layer interposed therebetween. The "other layer" in the case in which the transparent electrode pattern and the non-patterned region are covered with another layer interposed therebetween, may be an insulating layer 5 that is included in the capacitive input device of the invention that will be described below, and in a case in which two or more layers of transparent electrode patterns are included as in the case of the capacitive input device of the invention that will be described below, the "other layer" may be the second layer transparent electrode pattern.

FIG. 11 illustrates an embodiment in which the first transparent resin layer 12 is laminated over the region in which the transparent electrode pattern 4 is not laminated on the transparent film 11 and over the transparent electrode pattern 4, the two being adjacent to each other.

Furthermore, in a case in which the edge of the transparent electrode pattern 4 has a tapered shape, it is preferable that the first transparent resin layer 12 is laminated along the tapered shape (at the same gradient as the taper angle).

FIG. 11 illustrates an embodiment in which the second transparent resin layer 7 is laminated on the surface on the side opposite to the surface on which the transparent electrode pattern of the first transparent resin layer 12 is formed.

<Transparent Electrode Pattern>

The laminate of the invention includes a transparent electrode pattern.

It is preferable that the transparent electrode pattern is a transparent electrode pattern that is disposed on a base material and is formed on the transparent substrate that will be described below, and it is more preferable that the transparent electrode pattern is a transparent electrode pattern formed on a transparent film substrate.

The refractive index of the transparent electrode pattern is preferably 1.75 to 2.1.

The material for the transparent electrode pattern is not particularly limited, and any known material can be used. For example, the transparent electrode pattern can be produced from a light-transmissive conductive metal oxide film such as indium tin oxide (ITO) or indium zinc oxide (IZO). A transparent conductive film containing oxide of Zn (IZO) or these as a main component is attracting more attention depending on the applications, since the transparent conductive film has a higher etching rate than an ITO film does. Examples of such a conductive film include an ITO film; metal films of Al, Zn, Cu, Fe, Ni, Cr, and Mo; and metal oxide films of $SiO_2$.

The film thickness of the transparent electrode pattern is preferably 10 to 200 nm. Furthermore, as a result of converting an amorphous ITO film into a polycrystalline ITO film through calcination, the electrical resistance may be reduced.

In addition to that, in a case in which a first conductive pattern or the like is formed using ITO or the like, reference may be made to paragraphs 0014 to 0016 of JP4506785B and the like. Above all, the transparent electrode pattern is preferably an ITO film or an IZO film, and particularly preferably an ITO film.

It is preferable that the transparent electrode pattern for the laminate of the invention is an ITO film having a refractive index of 1.75 to 2.1.

<Metal Wiring Section Electrically Connected to Transparent Electrode Pattern>

It is preferable that the laminate of the invention includes a metal wiring section that is electrically connected to the transparent electrode pattern.

Regarding the metal wiring section, for example, copper, gold, silver, aluminum, or alloys containing the aforementioned metals are used. In consideration of the balance between electrical conductivity and cost, a wiring using copper or an alloy containing copper is preferred.

The method for forming conduction between the metal wiring section and the transparent electrode pattern is not particularly limited, and the two may be electrically connected.

It is preferable that the first transparent resin layer and/or the second transparent resin layer are patterned, and it is more preferable that the first transparent resin layer and the second transparent resin layer are both patterned. It is even more preferable that the first transparent resin layer and the second transparent resin layer in the above-described region on the metal wiring section are both patterned.

When it is said that a layer is patterned, it means that a portion of the layer is intentionally removed, and thereby, a region in which the layer exists in the in-plane direction and a region in which the layer does not exist are formed. Regarding the patterning method, a method based on exposure and developing in the patterning step that will be described below may be preferably used.

According to the embodiment described above, connection between the metal wiring section and another flexible wiring is facilitated. An example of the transparent laminate of the embodiment is the embodiment illustrated in FIG. 9.

It is preferable that the laminate of the invention has a metal oxidation inhibitor on the metal wiring section in a region from which the first transparent resin layer and the second transparent resin layer have been removed.

The region from which the first transparent resin layer and the second transparent resin layer have been removed, means a region formed by patterning, in which there is no layer existing in the in-plane direction.

In FIG. 9, a partial region 14 from which the first transparent resin layer 12 and the second transparent resin layer 7 have been removed by patterning, the partial region being on the metal wiring section 6, is described.

Figure 13:
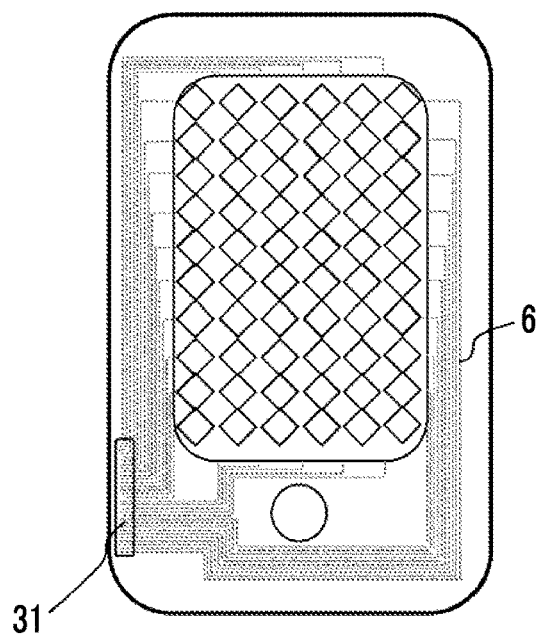
FIG. 13 is a top view illustrating another example of the configuration of the capacitive input device of the invention, and a schematic view illustrating an embodiment including a terminal (end portion) of a lead wiring that is not covered by a first transparent resin layer after patterning.

FIG. 13 describes a terminal 31 of a lead wiring as a region from which the first transparent resin layer (and the second transparent resin layer) has been removed by patterning, as a terminal for a lead wiring. Detailed description on FIG. 13 will be given later.

Having a metal oxidation inhibitor on the metal wiring section can be checked by the following method. From a mass spectrum obtained by irradiating a sample with Au+ ions as primary ions using TRIFT II manufactured by Ulvac-Phi, Inc. and using a neutralizing gun in combination, it is confirmed that complex ions of Cu and benzotriazole have been produced. Detailed measurement conditions may be appropriately set; however, for example, measurement can be conducted at a primary ion accelerating voltage of 22 kV, a measurement area of 80×80 μm, and a measurement time of 3 minutes.

Substrate <Base Material>

It is preferable that the laminate of the invention includes a base material.

The base material is preferably a transparent substrate.

The transparent substrate may be a transparent glass substrate, or may be a transparent film substrate; however, the transparent substrate is preferably a transparent film substrate having a refractive index of 1.50 to 1.55. Furthermore, the refractive index of the transparent substrate is preferably 1.5 to 1.52, and a transparent film substrate having a refractive index of 1.50 to 1.52 is preferred.

In a case in which the transparent substrate is a transparent glass substrate (also referred to as light-transmissive substrate of glass), toughened glass represented by GORILLA GLASS of Corning, Inc. or the like can be used. Regarding the transparent substrate, the materials used in JP2010-86684A, JP2010-152809A and JP2010-257492A can be preferably used, the disclosures of which are incorporated herein.

In a case in which the transparent substrate is a transparent film substrate, the transparent film substrate is preferably a transparent resin film. Examples of the resin material that forms the transparent resin film include a poly(meth)acrylic resin, a cellulose triacetate (TAC)-based resin, a polyethylene terephthalate (PET)-based resin, a polycarbonate-based resin, and a cycloolefin-based resin. Among these, from the viewpoint of general-purpose usability, a cellulose triacetate (TAC)-based resin, a polyethylene terephthalate (PET)-based resin, and a cycloolefin-based resin are preferred. The thickness of the transparent resin film is preferably in the range of 2 to 200 µm, and more preferably in the range of 2 to 100 µm. When the thickness is 2 µm or more, sufficient mechanical strength of the film substrate is obtained, and handling operation of the roll is made easy. On the other hand, when the thickness is 200 µm or less, bending characteristics are enhanced, and handling operation of the roll is made easy.

<Transparent Film>

It is preferable that the laminate of the invention further has a transparent film for reducing interfacial reflection between the transparent electrode pattern and the transparent film substrate. The refractive index of the transparent film is preferably 1.60 to 1.78, and more preferably 1.65 to 1.74. Furthermore, the film thickness of the transparent film is preferably 55 to 110 nm, more preferably 60 to 110 nm, and even more preferably 70 to 110 nm.

Here, the transparent film may have a single-layer structure, or may have a laminated structure of two or more layers. In a case in which the transparent film has a laminated structure of two or more layers, the refractive index of the transparent film means the refractive index of the layers as a whole, and the film thickness of the transparent film means the total film thickness of the layers as a whole. As long as such a range of refractive index is satisfied, the material for the transparent film is not particularly limited.

A preferred range of the material for the transparent film and preferred ranges of the physical properties such as refractive index are similar to the preferred ranges of the material and the properties of the first transparent resin layer.

The laminate of the invention is preferably such that the transparent film is a transparent resin film. There are no particular limitations on the metal oxide particles, binder polymer, and other additives that are used for the transparent resin film as long as there is no effect contradictory to the purport of the invention, and the resins or other additives that are used for the first transparent resin for the transfer film of the invention can be preferably used.

Regarding the laminate of the invention, the transparent film may be an inorganic film.

Regarding the inorganic film, the inorganic films used in JP2010-86684A, JP2010-152809A, JP2010-257492A and the like can be used, and it is preferable to use an inorganic film having a laminated structure of a low refractive index material and a high refractive index material as described in these patent literatures, or an inorganic film of a mixed film of a low refractive index material and a high refractive index material, from the viewpoint of controlling the refractive index. Regarding the low refractive index material and the high refractive index material, the materials used in JP2010-86684A, JP2010-152809A and JP2010-257492A can be preferably used, the disclosures of which are incorporated herein.

The inorganic film may be a mixed film of $SiO_2$ and $Nb_2O_5$, and in that case, it is more preferable that the inorganic film is a mixed film of $SiO_2$ and $Nb_2O_5$ formed by sputtering.

<Additional Transparent Film>

The laminate of the invention may further include an additional transparent film.

It is preferable that the additional transparent film is included between a base material and a transparent film, and it is more preferable that the additional transparent film is included between a transparent substrate and a transparent film.

The refractive index of the additional transparent film is preferably 1.50 to 1.55, and more preferably 1.50 to 1.52, from the viewpoint of ameliorating visibility of the transparent electrode pattern by bringing the refractive index of the additional transparent film close to the refractive index of the base material.

<Hard Coat Layer>

Between the base material and the transparent electrode pattern, a hard coat layer may be introduced instead of the above-mentioned transparent film having a refractive index of 1.60 to 1.78 and a film thickness of 55 to 110 nm. The hard coat layer may be formed by a dry process such as a vacuum vapor deposition method, a sputtering method or an ion plating method; or by a wet method (coating method). Regarding the wet method (coating method), a coating method using a roll coater, a reverse roll coater, a gravure coater, a microgravure coater, a knife coater, a bar coater, a wire bar coater, a die coater, or a dip coater can be used.

The hard coat layer is introduced from the viewpoint of easy sliding properties or from the viewpoint of enhancing hardness, and is formed by, for example, a cured product obtained by curing a reactive silicon compound such as tetraethoxysilane, or a curable composition having a polyfunctional (meth)acrylate or the like by means of heat, ultraviolet radiation (UV) or ionizing radiation. Inorganic fine particles such as colloidal silica may also be added thereto, and the refractive index of the hard coat layer is adjusted to be about 1.45 to 1.55.

<Formation of Transparent Electrode Pattern on Both Surfaces of Base Material>

The transparent electrode pattern may be formed only on one surface of the base material, or may be formed on both surfaces. The base material is preferably a transparent substrate, and more preferably a transparent film substrate. In a case in which the electrode pattern is formed on both surfaces of the base material, the hard coat layer and the transparent film formed between the base material and the transparent electrode pattern may be formed symmetrically on both surfaces, or may be formed asymmetrically, in terms of thickness or layer configuration. In a case in which the transparent electrode pattern is formed on both surfaces of the base material, it is preferable that the first transparent resin layer and the second transparent resin layer included in the transfer film of the invention are transferred to the both surfaces.

That is, it is preferable that the laminate of the invention has the transparent electrode pattern, the first transparent resin layer and the second transparent resin layer on each of the two surfaces of a transparent film substrate. An example of the configuration of the laminate in this case is the embodiment illustrated in FIG. 1A that will be described below.

(Method for Manufacturing Laminate)

The method for manufacturing a laminate of the invention includes a step of preparing the transfer film of the invention; a step of laminating the first transparent resin layer of the transfer film on a transparent electrode pattern disposed on a base material such that the first transparent resin layer is contacted with the transparent electrode pattern; and a step of peeling the temporary support, in this order.

According to the embodiment described above, the first transparent resin layer of the laminate, and the second transparent resin layer that is included in the transfer film as necessary, can be transferred at the same time. Thus, a laminate that is free from the problem of the transparent electrode pattern being visually recognized, can be manufactured easily with high productivity.

The base material is preferably a transparent substrate, and more preferably a transparent film substrate.

The first transparent resin layer according to the method for manufacturing a laminate of the invention is directly formed on the transparent electrode pattern, and in the non-patterned region, directly on the transparent film or the metal wiring section.

According to the method for manufacturing a laminate of the invention, it is preferable that the transparent electrode pattern is a transparent electrode pattern formed on the transparent film substrate.

<Step of Laminating First Transparent Resin Layer to be Contacted with Transparent Electrode Pattern>

The method for manufacturing a laminate of the invention includes a step of laminating the first transparent resin layer on a transparent resin pattern such that the first transparent resin layer is contacted with the transparent electrode pattern.

The step of laminating the first transparent resin layer of the transfer film so as to be contacted with the transparent electrode pattern is a step of laminating (bonding) the first transparent resin layer of the transfer film of the invention, or in a case in which the transfer film has a second transparent resin layer, laminating the first transparent resin layer and the second transparent resin layer on the transparent electrode pattern. At this time, in a case in which the transfer film has the protective film described above, the protective film is removed before lamination.

The lamination of the first transparent resin layer and the second transparent resin layer on the transparent electrode pattern surface is carried out by superposing the first transparent resin layer and the second transparent resin layer on the transparent electrode pattern surface, and pressing and heating the assembly. For the bonding process, a known laminator such as a laminator, a vacuum laminator, or an autocut laminator, which can further increase productivity, can be used.

<Step of Peeling Temporary Support>

The method for manufacturing a laminate of the invention includes a step of peeling the temporary support, after the step of laminating the first transparent resin layer so as to be contacted with a transparent electrode pattern. The method for peeling the temporary support is not particularly limited, and a known method can be used. In a case in which the method for manufacturing a laminate of the invention includes the step of patterning that will be described below, the step of peeling the temporary support may be carried out before the patterning step, or may be carried out in the middle of the patterning step (between a step of performing exposure and a step of performing developing).

<Step of Surface-Treating Base Material>

Furthermore, the method for manufacturing a laminate of the invention may include a "step of surface-treating the base material" of subjecting the non-contact surface of the base material (transparent film substrate or front face plate) to a surface treatment, before the step of laminating the first transparent resin layer so as to be contacted with the transparent electrode pattern, in order to increase the adhesiveness of the various layer by lamination during the step of laminating the first transparent resin layer so as to be contacted with the transparent electrode pattern. Regarding the surface treatment, it is preferable to perform a surface treatment using a silane compound (silane coupling treatment). It is preferable that the silane coupling agent has a functional group capable of interacting with a photosensitive resin. For example, a silane coupling liquid (0.3 mass % aqueous solution of N-β(aminoethyl)-γ-aminopropyltrimethoxysilane, trade name: KBM603, manufactured by Shin-Etsu Chemical Co., Ltd.) is sprayed by showering for 20 seconds, and the surface is washed by showering pure water. Subsequently, the laminate is allowed to react by heating. A heating chamber may be used, and the reaction can also be accelerated by preliminary heating of the substrate of the laminator.

A preferred embodiment of the base material is the same as the preferred embodiment of the base material for the laminate of the invention.

<Step of Forming Transparent Electrode Pattern>

The method for manufacturing a laminate of the invention may also include a step of forming a transparent electrode pattern.

The transparent electrode pattern can be formed on a base material or the transparent film having a refractive index of 1.60 to 1.78 and a film thickness of 55 to 110 nm, using the method for forming a first transparent electrode pattern 3, a second transparent electrode pattern 4 and a metal wiring section 6 described in the explanation for the capacitive input device of the invention given below. A method of using a photosensitive film is preferred. It is preferable that the step of forming a transparent electrode pattern is carried out before the step of laminating the first transparent resin layer so as to be contacted with the transparent electrode pattern.

<Step of Patterning Transparent Resin Layer>

It is preferable that the method for manufacturing a laminate of the invention further includes a step of patterning the first transparent resin layer.

The step of patterning is preferably a step of patterning the second transparent resin layer and the first transparent resin layer.

The patterning process includes a step of performing exposure and a step of performing developing.

Regarding the examples of the step of performing exposure, the step of performing developing, and other processes, the method described in paragraphs 0035 to 0051 of JP2006-23696A can be suitably used.

If necessary, layers other than the second and first transparent resin layer may also be subjected to a patterning process.

In the following explanation, the case of patterning the second transparent resin layer and/or the first transparent resin layer will be described as an example.

[Step of Performing Exposure]

The step of performing exposure is, for example, a step of exposing the first transparent resin layer and/or the second transparent resin layer that have been transferred onto the transparent electrode pattern.

Specifically, a method of disposing a predetermined mask above the first transparent resin layer and/or the second transparent resin layer that have been formed on the transparent electrode pattern, and subsequently exposing the first transparent resin layer and/or the second transparent resin layer from above the mask through the mask; or a method of exposing the entire surface of the first transparent resin layer and/or the second transparent resin layer without using a mask, may be used.

Here, regarding the light source for exposure, any light source that can emit light having a wavelength range capable of curing the first transparent resin layer and/or the second transparent resin layer (for example, 365 nm or 405 nm) can be appropriately selected and used. Specific examples include an ultrahigh pressure mercury lamp, a high pressure mercury lamp, and a metal halide lamp. The amount of exposure is usually about 5 to 200 mJ/cm$^2$, and preferably about 10 to 100 mJ/cm$^2$.

[Step of Performing Developing]

The step of performing developing is, for example, a step of developing the first transparent resin layer and/or the second transparent resin layer that have been exposed.

The developing can be carried out using a developer. The developer is not particularly limited, and any known developer, such as the developers described in JP1993-72724A (JP-H05-72724A), can be used. The developer is preferably a developer which exhibits a developing behavior of a type in which the first transparent resin layer and the second transparent resin layer are dissolved, and for example, a developer including a compound having a pKa of 7 to 13 at a concentration of 0.05 to 5 mol/L is preferred. On the other hand, the developer used in a case in which the first transparent resin layer and the second transparent resin layer themselves do not form patterns (a case in which etching is used or the like), is preferably a developer which exhibits developing behavior of a type in which the first transparent resin layer and the second transparent resin layer are not dissolved, and for example, a developer including a compound having a pKa of 7 to 13 at a concentration of 0.05 to 5 mol/L is preferred. The developer may also include a small amount of an organic solvent that is miscible with water. Examples of the organic solvent that is miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethyl phosphoramide, ethyl lactate, methyl lactate, ε-caprolactam, and N-methylpyrrolidone. The concentration of the organic solvent is preferably 0.1% by mass to 30% by mass. Also, known surfactants can be further added to the developer. The concentration of the surfactants is preferably 0.01% by mass to 10% by mass.

Regarding the method for developing, any of puddle development, shower development, shower and spinning development, dip development, and the like may be used. Here, to explain the shower development, an uncured part can be removed by spraying a developer by showering to the first transparent resin layer and the second transparent resin layer after exposure. Furthermore, in a case in which a thermoplastic resin layer or an interlayer is provided on a photosensitive film having a photocurable resin layer that is used for etching of the transparent electrode pattern, it is preferable to have the thermoplastic resin layer, the interlayer and the like removed in advance before developing, by spraying an alkaline liquid having low dissolubility for the photocurable resin layer, by showering or the like. Furthermore, it is preferable to remove a developing residue after developing, by spraying a detergent or the like by showering and scrubbing with a brush or the like. The liquid temperature of the developer is preferably 20° C. to 40° C., and the pH of the developer is preferably 8 to 13.

Furthermore, the step of performing exposing may be carried out after peeling the temporary support, or exposure may be performed before the temporary support is peeled off, and then the temporary support may be peeled off. The exposure may be exposure through a mask, or may be digital exposure using a laser or the like.

<Other Steps>

The method for manufacturing a laminate described above may also include other steps such as a post-exposure step and a post-bake step. In a case in which the first transparent resin layer and the second transparent resin layer are thermal transparent resin layers, it is preferable to carry out a post-bake step after the step of performing developing.

<Step of Forming Transparent Film>

It is preferable that the method for manufacturing a laminate of the invention includes a step of forming a transparent film.

In regard to the step of forming a transparent film, in a case in which the laminate has a transparent film having a refractive index of 1.60 to 1.78 and a film thickness of 55 to 110 nm on the transparent electrode pattern on the side opposite to the side where the second transparent resin layer is formed, the transparent film is formed directly on the transparent electrode pattern, or with another layer such as the additional transparent film interposed between the transparent film and the transparent electrode pattern.

The method for forming the transparent film is not particularly limited; however, it is preferable to form the transparent film by transfer or sputtering.

Above all, the step of forming the transparent film is preferably a step of forming a transparent film by transferring a transparent curable resin film formed on a temporary support onto the base material and forming a film; and more preferably a step of forming a transparent film by curing the transparent curable resin film after transfer, and forming a film. Regarding the method for transfer and curing, there may be mentioned a method of performing transfer, exposure, developing and other processes similarly to the method of transferring the first transparent resin layer and the second transparent resin layer in connection to the method for manufacturing a laminate of the invention using a photosensitive film, in the explanation for the capacitive input device of the invention that will be described below. In that case, it is preferable to adjust the refractive index of the transparent film to the range described above, by dispersing the metal oxide fine particles in the photocurable resin layer in the photosensitive film.

On the other hand, in a case in which the transparent film is an inorganic film, it is preferable that the transparent film is formed by sputtering. That is, in regard to the laminate of the invention, it is also preferable that the transparent film is formed by sputtering.

Regarding the sputtering method, the methods used in JP2010-86684A, JP2010-152809A, and JP2010-257492A can be preferably used, the disclosures of which are incorporated herein.

<Step of Forming Additional Transparent Film>

It is preferable that the method for manufacturing a laminate of the invention includes a step of forming an additional transparent film.

The step of forming an additional transparent film is a step similar to the step of forming a transparent film.

(Capacitive Input Device)

The capacitive input device of the invention is produced using the transfer film of the invention, or includes the laminate of the invention.

It is preferable that the capacitive input device of the invention has a first transparent resin layer and a second transparent resin layer that have been patterned after being transferred from the transfer film of the invention. It is preferable that the protective film is peeled off from the transfer film of the invention before the first transparent resin layer and/or the second transparent resin layer is transferred from the transfer film of the invention. Since the capacitive input device of the invention needs to be connected to another wiring member (flexible print substrate or the like) at a terminal of a lead wiring, it is preferable that the terminal of a lead wiring is not covered by the first transparent resin layer (and the second transparent resin layer).

The above-described embodiment is illustrated in FIG. 13. FIG. 13 illustrates a capacitive input device having the following configuration, which includes a lead wiring (metal wiring section 6) of the transparent electrode pattern and a terminal 31 of the lead wiring.

The first transparent resin layer (and the second transparent resin layer) on the terminal 31 of the lead wiring has been removed during the patterning step (step of performing exposure and step of performing developing), and the terminal 31 of the lead wiring is exposed.

Figure 14:
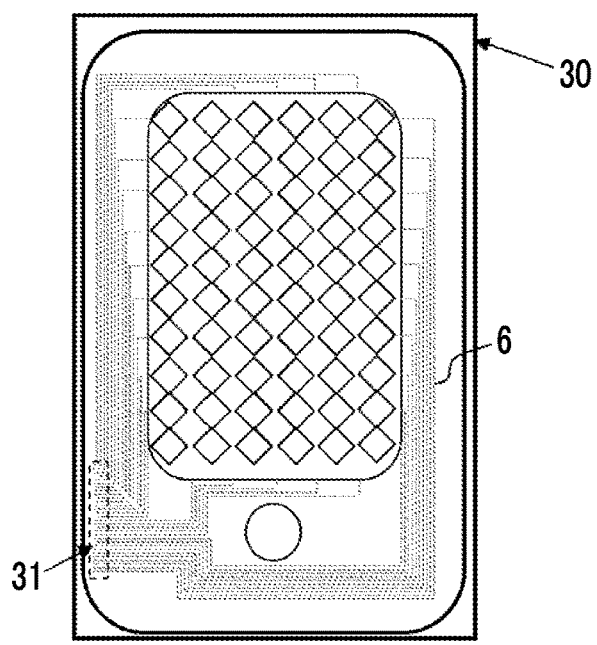
FIG. 14 is a schematic view illustrating an example of the transfer film of the invention having first and second transparent resin layers, in a state of having been laminated on a transparent electrode pattern of a capacitive input device by a lamination process but before being patterned.
Figure 15:
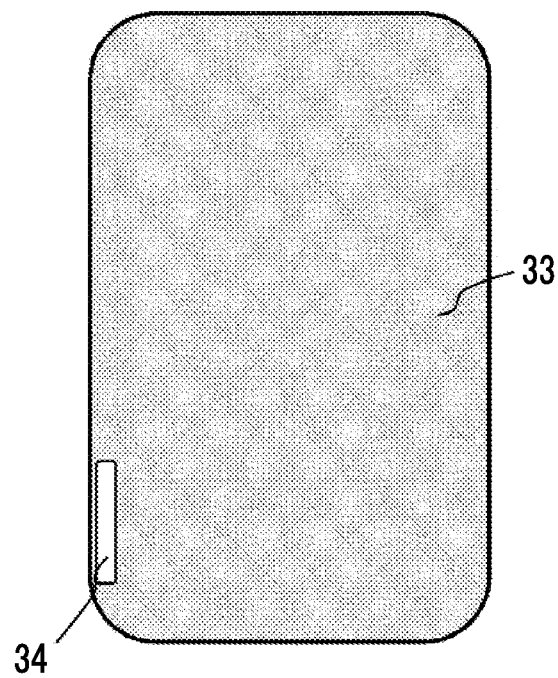
FIG. 15 is a schematic view illustrating an example of a desired pattern formed by a first transparent resin layer and a second transparent resin layer that have been cured.

Specific embodiments of exposure and developing are illustrated in FIG. 14 and FIG. 15. FIG. 14 illustrates a state in which a transfer film 30 having first and second transparent resin layers has been laminated on a transparent electrode pattern of a capacitive input device by lamination, and a state before the laminated material is cured by exposure to light or the like. In the case of utilizing photolithography, that is, in the case of performing curing by exposure to light, the cured portion (exposed portion) 33 of the first transparent resin layer and the second transparent resin layer having the shape illustrated in FIG. 15 can be obtained by performing patternwise exposure using a mask and developing of unexposed portions. Specifically, FIG. 15 shows an opening 34 that is an uncured portion of the first transparent resin layer and the second transparent resin layer and corresponds to the terminal of the lead wiring; and a cured portion (desired pattern) of the first and second transparent resin layers that is intended not to cover the terminal (wiring lead-out portion) of the lead wiring, from which edges of the transfer film of the invention having the first and second transparent resin layers protruded outward from the contour of the frame part of the capacitive input device, have been eliminated.

As a result, another wiring member can be directly connected to the terminal 31 of the lead wiring, and thereby, signals of a sensor can be transmitted to an electrical circuit.

In the following description, the details of a preferred embodiment of the capacitive input device of the invention will be explained.

It is preferable that the capacitive input device of the invention has a base material (corresponding to the base material of the laminate of the invention), and at least the following elements of (3) and (6) to (8) on one side or on both sides of the base material, and also has the laminate of the invention.

(3) multiple first transparent electrode patterns formed by multiple pad parts extending in a first direction through connection parts;

(6) a metal wiring section electrically connected to the first transparent electrode patterns;

(7) a first transparent resin layer formed so as to cover the entirety or a portion of the elements (3) and (6); and (8) a second transparent resin layer formed so as to cover the element (7).

Here, the (7) first transparent resin layer corresponds to the first transparent resin layer of the laminate of the invention. It is preferable that the (7) first transparent resin layer is formed adjacently to the (6) metal wiring section, and it is preferable that a portion or the entirety of the first transparent resin layer in a region on the metal wiring section has been removed by patterning.

Furthermore, the (8) second transparent resin layer corresponds to the second transparent resin layer of the laminate of the invention. Meanwhile, it is preferable that the first transparent resin layer functions as a transparent protective layer in the capacitive input device.

The capacitive input device of the invention may have the following elements (4) and (5) between the (3) first transparent electrode patterns and/or the (6) metal wiring section and the (7) first transparent resin layer. Particularly, in a case in which the elements of (3) and (6) to (8) exist only one side of the base material, it is preferable that the capacitive input device has the following elements (4) and (5).

(4) multiple second electrode patterns that are electrically insulated from the first transparent electrode patterns, and consist of multiple pad parts formed by extending in a direction perpendicularly intersecting the first direction; and (5) an insulating layer that electrically insulates the first transparent electrode patterns and the second electrode patterns.

The capacitive input device of the invention is preferably such that the (4) second electrode patterns are transparent electrode patterns.

Between the (3) first transparent electrode patterns and the (4) second transparent electrode patterns, transparent ones correspond to the transparent electrode pattern of the laminate of the invention. In a case in which both of them are transparent, both of them correspond to the transparent electrode pattern of the laminate of the invention.

It is preferable that the capacitive input device of the invention further has the (2) transparent film disposed between the (3) first transparent electrode patterns and the base material; between the (4) second transparent electrode patterns and the base material; or between the (6) metal wiring section and the base material. Here, it is preferable that the (2) transparent film corresponds to the transparent film having a refractive index of 1.60 to 1.78 and a film thickness of 55 to 110 nm of the laminate of the invention, from the viewpoint of further ameliorating visibility of the transparent electrode patterns.

The capacitive input device of the invention may further have (1) a mask layer and/or a decorative layer, if necessary. The mask layer is provided as a black frame around the region that is touched by a finger, a touch pen or the like, in order to make the lead wiring of the transparent electrode pattern invisible from the contact side, or to provide decoration. The decorative layer is provided for the purpose of decoration, and for example, a white decorative layer is provided.

In a case in which the (1) mask layer and/or decorative layer exists, it is preferable that the capacitive input device has the (1) mask layer and/or decorative layer disposed between the (2) transparent film and the base material, between the (3) first transparent electrode patterns and the base material; between the (4) second transparent electrode patterns and the base material; or between the (6) metal wiring section and the base material. It is more preferable that the (1) mask layer and/or decorative layer is provided adjacently to the base material.

In a case in which the base material is a transparent film substrate, it is preferable that the (1) mask layer and/or decorative layer is integrated with a cover glass that is further disposed on the visible side of the base material. In the case of such an embodiment, it is preferable that the laminate of the invention does not have the (1) mask layer and/or decorative layer, from the viewpoint that in a case in which the second transparent resin layer and the first transparent resin layer are transferred from the transfer film of the invention, a level difference that may cause incorporation of air bubbles can be reduced.

In regard to the capacitive input device of the invention, even in a case in which the capacitive input device includes such various members, the transparent electrode pattern can be made invisible by including the second transparent resin layer that is disposed adjacently to the transparent electrode pattern, and the first transparent resin layer that is disposed adjacently to the second transparent resin layer. Thus, the problem of visibility of the transparent electrode pattern can be ameliorated. Furthermore, as described above, by adopting a configuration in which the transparent film having a refractive index of 1.60 to 1.78 and a film thickness of 55 to 110 nm and the second transparent resin layer described above are used, and a transparent electrode pattern is interposed therebetween, the problem of visibility of the transparent electrode pattern can be further ameliorated.

<Configuration of Capacitive Input Device>

First, a preferred configuration of the capacitive input device of the invention will be explained together with the method for producing the various members that constitute the device. FIG. 1A is a cross-sectional view illustrating an exemplary preferred configuration of the laminate or capacitive input device of the invention, and the configuration of the capacitive input device having a transparent electrode pattern provided as a single layer on both sides of the base material. In FIG. 1A, the capacitive input device 10 is configured to include a transparent substrate (transparent film substrate) 1; and a transparent film 11 having a refractive index of 1.60 to 1.78 and a film thickness of 55 to 110 nm, a transparent electrode pattern 4, a metal wiring section 6, a second transparent resin layer 12, and a first transparent resin layer 7, each being symmetrically provided on both surfaces of the transparent substrate 1. The laminate or capacitive input device of the invention is not intended to be limited to the configuration of FIG. 1A, and an embodiment in which the transparent film 11; the transparent electrode pattern 4; the metal wiring section 6; the second transparent resin layer 12; and the first transparent resin layer 7 are provided only one surface of the transparent substrate 1 is also preferable.

Figure 1B:
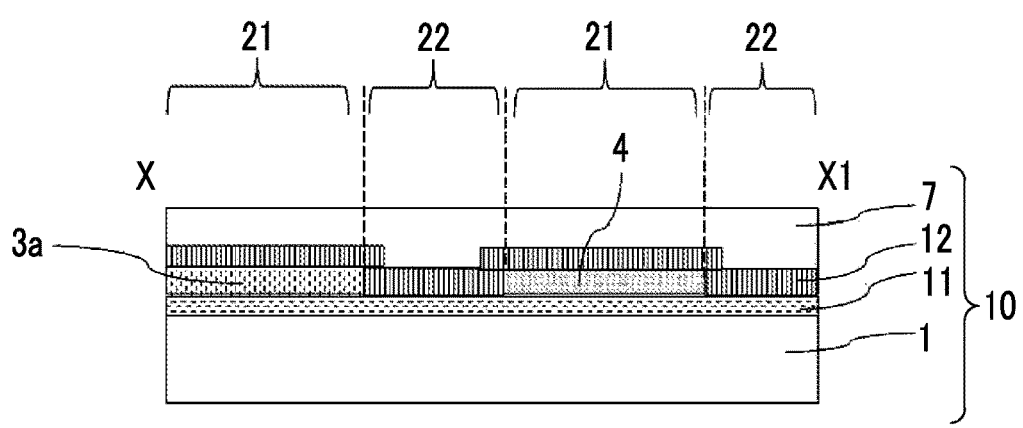
FIG. 1B is a schematic cross-sectional view illustrating another example of the configuration of the capacitive input device of the invention.

Furthermore, FIG. 1B, which illustrates a X-X1 cross-section shown in FIG. 3 that will be described below, illustrates an example of a capacitive input device in which a first transparent electrode pattern and a second transparent electrode pattern are provided in two directions that are approximately orthogonal to each other, namely, a transverse direction and a longitudinal direction, as a transparent electrode pattern on one side of a transparent substrate, and is also a cross-sectional view illustrating an exemplary preferred configuration of the capacitive input device of the invention. FIG. 1B shows an embodiment in which the capacitive input device 10 is configured to include a transparent substrate 1; a transparent film 11 having a refractive index of 1.60 to 1.78 and a film thickness of 55 to 110 nm; a first transparent electrode pattern 3; a second transparent electrode pattern 4; a second transparent resin layer 12; and a first transparent resin layer 7.

Regarding the transparent substrate (transparent film substrate or front face plate) 1, the materials mentioned as the material for the transparent electrode pattern of the laminate of the invention can be used.

Figure 2:
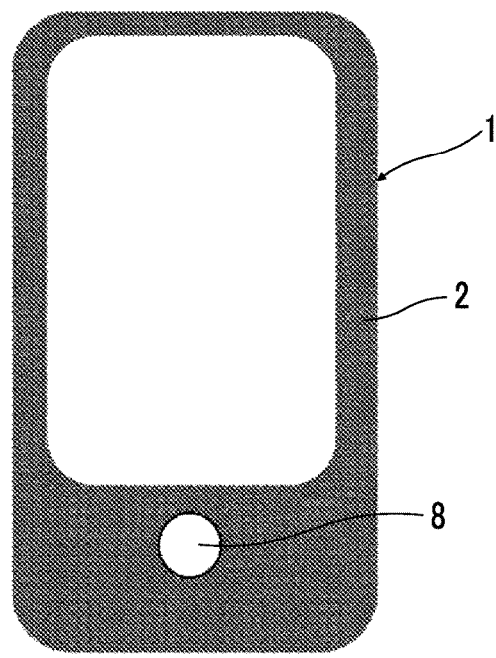
FIG. 2 is an explanatory diagram illustrating an example of the laminate according to the invention.

An example of the capacitive input device of the invention having a mask layer is illustrated in FIG. 2. The mask layer 2 is a frame-shaped pattern provided around the display region of the touch panel transparent substrate, and this is formed in order to make the lead wiring or the like invisible.

The capacitive input device 10 may be provided with, as illustrated in FIG. 2, a mask layer 2 so as to cover a partial region of the transparent substrate 1 (in FIG. 2, the region other than the input surface). Furthermore, the transparent substrate 1 may be provided with an opening 8 in a part, as illustrated in FIG. 2. A pressing-induced mechanical switch can be provided at the opening 8.

Figure 3:
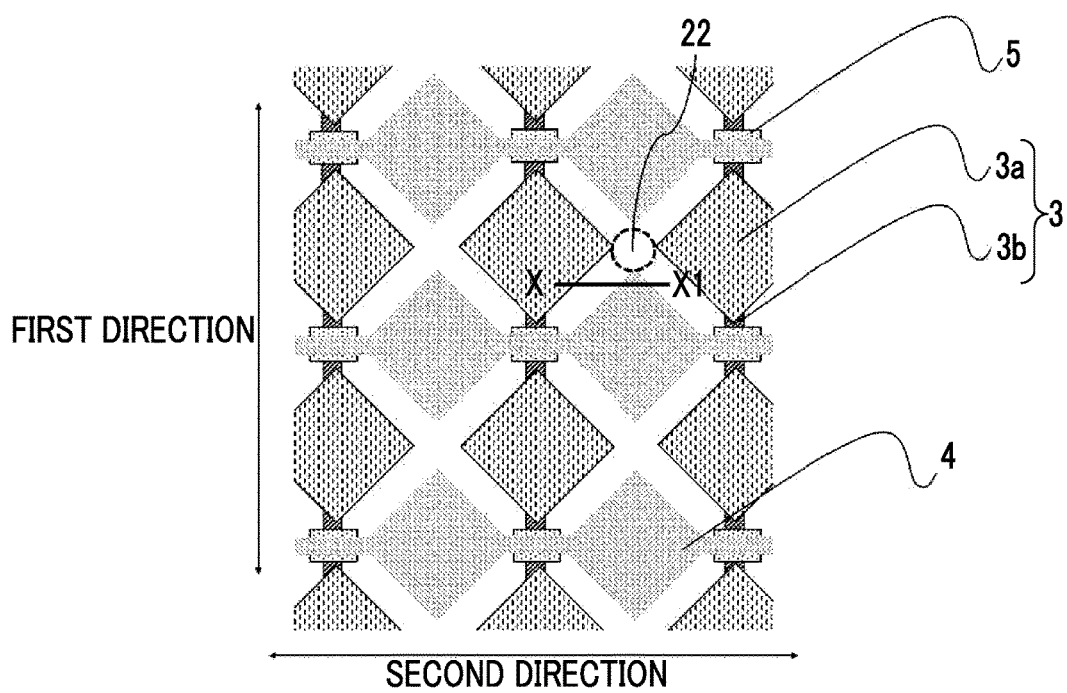
FIG. 3 is an explanatory diagram illustrating an example of the relationship between a transparent electrode pattern and a non-patterned region according to the invention.

An example of a capacitive input device having two layers of transparent electrode patterns on one side of a transparent substrate is illustrated in FIG. 3. Formed on the surface of the transparent substrate 1 are: multiple first transparent electrode patterns 3 formed by multiple pad parts extending in a first direction through connection parts; multiple second transparent electrode patterns 4, electrically insulated from the first transparent electrode patterns 3 and formed by multiple pad parts extending in a second direction that perpendicularly intersects the first direction; and an insulating layer 5 electrically insulating the first transparent electrode patterns 3 and the second transparent electrode pattern 4. Regarding the first transparent electrode patterns 3, the second transparent electrode patterns 4, and the metal wiring section 6 that will be described below, materials mentioned as the material for the transparent electrode pattern of the laminate of the invention can be used, and an ITO film is preferred.

The first transparent electrode patterns 3 and the second transparent electrode patterns 4 will be explained using FIG. 3. FIG. 3 is an explanatory diagram illustrating an example of the first transparent electrode pattern and the second transparent electrode pattern according to the invention. As illustrated in FIG. 3, the first transparent electrode patterns 3 are formed by pad parts 3a extending in a first direction through connection parts 3b. Furthermore, the second transparent electrode patterns 4 are electrically insulated from the first transparent electrode pattern 3 by means of the insulating layer 5, and are formed by multiple pad parts extending in a direction that perpendicularly intersects the first direction (second direction in FIG. 3). Here, in the case of forming the first transparent electrode patterns 3, the pad parts 3a and the connection parts 3b may be produced as integrated bodies, or only the connection parts 3b may be produced, while the pad parts 3a and the second transparent electrode patterns 4 may be produced (patterned) as integrated bodies. In a case in which the pad parts 3a and the second transparent electrode patterns 4 are produced (patterned) as integrated bodies, as illustrated in FIG. 3, various layers are formed such that portions of the connection parts 3b and portions of the pad parts 3a are connected, while the first transparent electrode patterns 3 and the second transparent electrode patterns 4 are electrically insulated by the insulating layer 5.

Furthermore, the region in FIG. 3 in which the first transparent electrode patterns 3, the second transparent electrode patterns 4, or the metal wiring section 6 that will be described below are not formed, corresponds to the non-patterned region 22 in the laminate of the invention.

It is preferable that the metal wiring section 6 is provided on the surface of the mask layer 2. The metal wiring section 6 is electrically connected to at least one of the first transparent electrode patterns 3 or the second transparent electrode patterns 4, and is an element different from the first transparent electrode pattern 3 and the second transparent electrode patterns 4.

Furthermore, it is preferable that the first transparent resin layer 7 is provided so as to cover all of the various constituent elements. The first transparent resin layer 7 may be configured so as to cover only a portion of the various constituent elements. The insulating layer 5 and the first transparent resin layer 7 may be formed from the same material, or may be formed from different materials. Regarding the material that constitute the insulating layer 5, the materials mentioned as the material for the first or second transparent resin layer of the laminate of the invention can be preferably used.

(Method for Manufacturing Capacitive Input Device)

Figure 4:
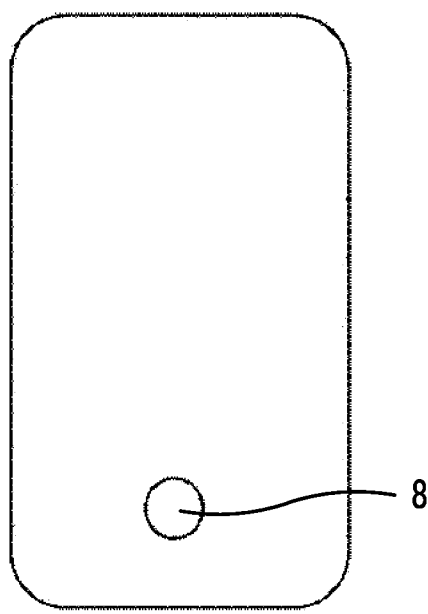
FIG. 4 is a top view illustrating an example of toughened glass having an opening formed therein.
Figure 5:
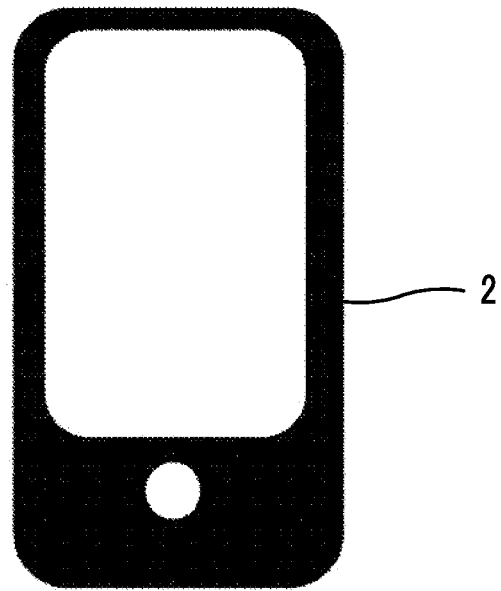
FIG. 5 is a top view illustrating an example of the laminate having a mask layer formed thereon.
Figure 6:
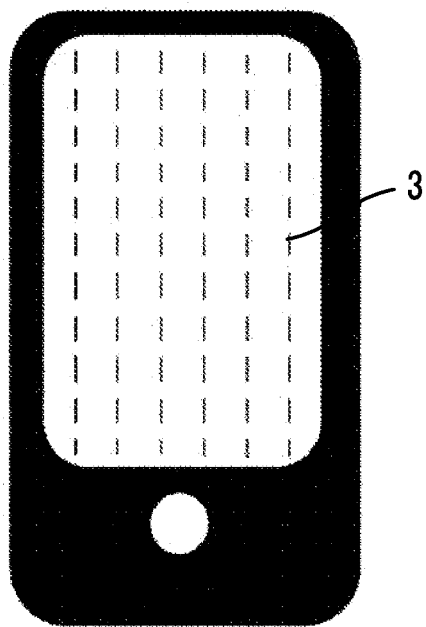
FIG. 6 is a top view illustrating an example of a laminate having a first transparent electrode pattern formed thereon.
Figure 7:
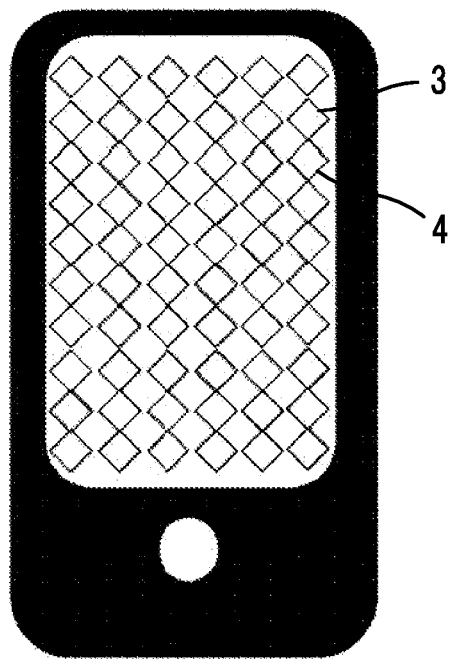
FIG. 7 is a top view illustrating an example of a laminate having first and second transparent electrode patterns formed thereon.
Figure 8:
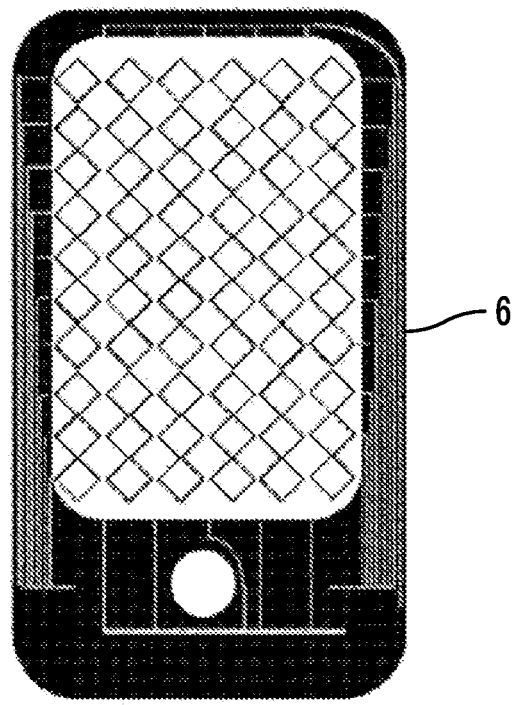
FIG. 8 is a top view illustrating an example of a laminate in which a conductive element other than first and second transparent electrode patterns is formed.

As exemplary embodiments that are formed during the process for manufacturing the capacitive input device of the invention, the embodiments illustrated in FIG. 4 to FIG. 8 may be mentioned. FIG. 4 is a top view illustrating an example of a tempered glass plate having an opening 8 formed thereon. FIG. 5 is a top view illustrating an example of a base material having a mask layer 2 formed thereon. FIG. 6 is a top view illustrating an example of a base material having a first transparent electrode pattern 3 formed thereon. FIG. 7 is a top view illustrating an example of a base material having a first transparent electrode pattern 3 and a second transparent electrode pattern 4 formed thereon. FIG. 8 is a top view illustrating an example of a base material having first and second transparent electrode patterns and a metal wiring section 6 formed thereon. These illustrate examples that specifically embody the following description, and the scope of the invention is not intended to be limitedly interpreted due to these drawings.

In regard to the method for manufacturing a capacitive input device, in a case in which the first transparent resin layer 12 and the second transparent resin layer 7 are formed, the first transparent resin layer 12 and the second transparent resin layer 7 can be formed by transferring the first transparent resin layer 12 and the second transparent resin layer 7 onto the surface of the transparent substrate 1 on which various elements have been arbitrarily formed, using the transfer film of the invention.

In regard to the method for manufacturing a capacitive input device, the mask layer 2, the first transparent electrode pattern 3, the second transparent electrode pattern 4, the insulating layer 5, and metal wiring section 6 can also be formed using a photosensitive film having a temporary support and a photocurable resin layer.

On the occasion of using the mask layer, insulating layer and photocurable resin layer described above, in a case in which permanent materials such as the first transparent electrode pattern, the second transparent electrode pattern and the metal wiring section are formed using the above-mentioned photosensitive film, the photosensitive film is laminated on an optional transfer-receiving member, and then is exposed to light patternwise as necessary. Then, a pattern can be obtained by eliminating the unexposed parts in the case of a negative type material, and by eliminating the exposed parts in the case of a positive type material, through a developing treatment. Regarding the developing, thermoplastic resin layers and photocurable resin layers may be developed and removed using different liquids, or may be removed using the same liquid. If necessary, a known developing facility such as a brush or a high-pressure jet may be used in combination. After the developing, if necessary, post-exposure and post-bake treatments may be implemented.

<Photosensitive Film>

The photosensitive film other than the transfer film of the invention, which is preferably used in the case of manufacturing the capacitive input device of the invention, will be explained. The photosensitive film has a temporary support and a photocurable resin layer, and it is preferable that the photosensitive film has a thermoplastic resin layer between the temporary support and the photocurable resin layer. When a mask layer and the like are formed using the aforementioned photosensitive film having a thermoplastic resin layer, air bubbles are not easily generated in the element formed by transferring the photocurable resin layer, image unevenness or the like does not easily occur in the image display device, and excellent display characteristics can be obtained.

The photosensitive film may be formed from a negative type material, or may be formed from a positive type material.

—Method for Producing Layers Other than Photocurable Resin Layer—

Regarding the temporary support for the photosensitive film, a temporary support similar to that used for the transfer film of the invention can be used. Regarding the thermoplastic resin layer used for the photosensitive film, the thermoplastic resin layer described in paragraph 0056 to 0060 of JP2014-10814A can be used. It is also acceptable to use a known interlayer or oxygen barrier layer together with the thermoplastic resin layer. Also, regarding the method for producing the photosensitive film, a method similar to the method for manufacturing a transfer film of the invention can be used.

—Photocurable Resin Layer—

In the photosensitive film, additives are added to the photocurable resin layer according to the use applications. That is, in the case of using the photosensitive film for forming a mask layer, a colorant is incorporated into the photocurable resin layer.

In a case in which the photosensitive film is formed from a negative type material, it is preferable that the photocurable resin layer includes an alkali-soluble resin, a polymerizable compound, and a polymerization initiator or a polymerization initiator system. Furthermore, a colorant, other additives, and the like are used; however, the invention is not intended to be limited to these.

—Alkali-Soluble Resin, Polymerizable Compound, and Polymerization Initiator—

Regarding the alkali-soluble resin, the polymerizable compound, and the polymerization initiator or polymerization initiator system to be included in the photosensitive film, an alkali-soluble resin, a polymerizable compound, a polymerization initiator or a polymerization initiator system that are similar to those used for the transfer film of the invention can be used.

—Colorant (in Case of being Used as Mask Layer)—

Furthermore, in a case in which the photosensitive film is used as a mask layer, a colorant can be used for the photocurable resin layer. Regarding the colorant that is used for the invention, known colorants (organic pigments, inorganic pigments, dyes, and the like) can be suitably used. According to the invention, in addition to a black colorant, a mixture of pigments of red, blue and green colors and the like can be used.

In a case in which the photocurable resin layer is used as a black mask layer, from the viewpoint of the optical density, it is preferable that the photocurable resin layer includes a black colorant. Examples of the black colorant include carbon black, titanium carbon, iron oxide, titanium oxide, and graphite, and among them, carbon black is preferred.

In a case in which the photocurable resin layer is used as a white mask layer, the white pigments described in paragraph 0015 or 0114 of JP2005-7765A can be used. In order to use the photocurable resin layer as a mask layer having another color, mixtures of the pigments described in paragraphs 0183 to 0185 of JP4546276B, or mixtures of dyes may be used. Specifically, the pigments and dyes described in paragraphs 0038 to 0054 of JP2005-17716A; the pigments described in paragraphs 0068 to 0072 of JP2004-361447A; the colorants described in paragraphs 0080 to 0088 of JP2005-17521A; and the like can be suitably used.

It is desirable that the colorant (preferably a pigment, and more preferably carbon black) is used in the form of a dispersion liquid. This dispersion liquid can be prepared by adding a composition that is obtainable by mixing in advance a colorant and a pigment dispersant, to the organic solvent (or vehicle) that will be described below, and dispersing the composition therein. The term vehicle means the portion of a medium in which a pigment is dispersed, when a paint is in a liquid state. The vehicle includes a component (binder) that is liquid and binds with the pigment to form a coating film, and a component (organic solvent) that dissolves and dilutes the aforementioned component.

The dispersing machine that is used at the time of dispersing the pigment is not particularly limited, and examples thereof include known dispersing machines such as a kneader, a roll mill, an attritor, a SUPERMILL, a DISSOLVER, a HOMOMIXER, and a SANDMILL, as described in Asakura, Kunizo, "Ganryo no Men (Dictionary of Pigments)", 1$^{st}$ Edition, Asakura Publishing Co., Ltd., 2000, p. 438. Furthermore, the pigment may also be finely pulverized by utilizing frictional force, by means of the mechanical attrition described in page 310 of this document.

Regarding the colorant, from the viewpoint of dispersion stability, a colorant having a number average particle size of 0.001 µm to 0.1 µm is preferred, and a colorant having a number average particle size of 0.01 µm to 0.08 µm is more preferred. The "particle size" as used herein refers to the diameter obtainable when an electron micrograph image of a particle is considered as a circle having the same area. Regarding the "number average particle size", the particle sizes of a large number of particles are determined, and the average value of any 100 particle sizes selected from among these is designated as the number average particle size.

The layer thickness of the photocurable resin layer including a colorant is preferably 0.5 to 10 µm, more preferably 0.8 to 5 µm, and particularly preferably 1 to 3 µm, from the viewpoint of the thickness difference between the resin layer and other layers. The percentage content of the colorant in the solid content of the colored photosensitive resin composition is not particularly limited; however, from the viewpoint of sufficiently shortening the developing time, the percentage content is preferably 15% to 70% by mass, more preferably 20% to 60% by mass, and even more preferably 25% to 50% by mass.

The total solid content as used in the present specification means the total mass of nonvolatile components excluding solvents and the like from the colored photosensitive resin composition.

Furthermore, in a case in which an insulating layer is formed using the photosensitive film, the layer thickness of the photocurable resin layer is preferably 0.1 to 5 µm, more preferably 0.3 to 3 µm, and particularly preferably 0.5 to 2 µm, form the viewpoint of maintaining insulating properties.

—Other Additives—

The photocurable resin layer may also use other additives. Regarding the additives, additives similar to those used for the transfer film of the invention can be used. Regarding the solvent used for producing the photosensitive film by application, a solvent similar to that used for the transfer film of the invention can be used.

Thus, a case in which the photosensitive film is formed from a negative type material has been mainly described; however, the photosensitive film may also be formed from a positive type material. In a case in which the photosensitive film is a positive type material, for example, the materials described in JP2005-221726A and the like are used for the photocurable resin layer; however, the invention is not intended to be limited thereto.

—Viscosity of Thermoplastic Resin Layer and Photocurable Resin Layer—

It is preferable that the viscosity of the thermoplastic resin layer measured at 100° C. is in the range of 1,000 to 10,000 Pa·sec, the viscosity of the photocurable resin layer measured at 100° C. is in the range of 2,000 to 50,000 Pa·sec, and the viscosities satisfy the following expression (A):

Viscosity of thermoplastic resin layer<viscosity of photocurable resin layer  Expression (A):

Here, the viscosity of each layer can be measured as follows. A measurement sample is produced by removing the solvent from a coating liquid for a thermoplastic resin layer or a coating liquid for a photocurable resin layer by drying under atmospheric pressure or reduced pressure. The viscosity is measured using, for example, a VIBRON (Model DD-III; manufactured by Toyo Baldwin Co., Ltd.) as an analyzer, under the conditions of a measurement initiation temperature of 50° C., a measurement finishing temperature of 150° C., a rate of temperature increase of 5° C./min, and a frequency of vibration of 1 Hz/deg. The measurement value obtained at 100° C. can be used.

(Formation of Mask Layer and Insulating Layer Using Photosensitive Film)

The mask layer 2 and the insulating layer 5 can be formed by transferring the photocurable resin layer onto the transparent substrate 1 or the like using the photosensitive film. For example, in the case of a black mask layer 2, the mask layer can be formed by using a photosensitive film such as described above, which has a black photocurable resin layer as the photocurable resin layer, and transferring the black photocurable resin layer onto the surface of the transparent substrate 1. In the case of the insulating layer 5, the insulating layer can be formed by using a photosensitive film such as described above, which has an insulating photocurable resin layer as the photocurable resin layer, and transferring the photocurable resin layer onto the surface of the transparent substrate 1 having a first transparent electrode pattern formed thereon.

Furthermore, when a photosensitive film such as described above, which has a particular layer configuration including a thermoplastic resin layer between a photocurable resin layer and a temporary support, is used for the formation of a mask layer 2 that needs light shielding properties, air bubble generation at the time of photosensitive film lamination is prevented, and thus a high-quality mask layer 2 free from light leakage can be formed.

<Formation of First and Second Transparent Electrode Patterns and Metal Wiring Section Using Photosensitive Film>

The first transparent electrode pattern 3, the second transparent electrode pattern 4, and the metal wiring section 6 can be formed using an etching treatment, or a photosensitive film such as described above, which has a conductive photocurable resin layer, or by using the photosensitive film as a lift-off material.

—Etching Treatment—

In a case in which the first transparent electrode pattern 3, the second transparent electrode pattern 4, and the metal wiring section 6 are formed by an etching treatment, first, a transparent electrode layer such as an ITO layer is formed by sputtering on the non-contact surface of a transparent substrate 1 having a mask layer 2 and the like formed thereon. Subsequently, an etching pattern is formed by exposure and developing, using a photosensitive film such as described above, which has a photocurable resin layer for etching as the photocurable resin layer on the transparent electrode layer. Thereafter, the transparent electrode layer is etched, thus the transparent electrode is patterned, and by eliminating the etching pattern, a first transparent electrode pattern 3 or the like can be formed.

Even in a case in which the photosensitive film is used as an etching resist (etching pattern), a resist pattern can be obtained in the same manner as the above-described method. Regarding the etching, etching and resist peeling can be applied by the known method described in paragraphs 0048 to 0054 of JP2010-152155A.

For example, regarding the method for etching, a wet etching method of immersing in an etching solution, which is generally practiced, may be used. Regarding the etching solution used for wet etching, an etching solution of an acidic type or an alkaline type may be selected as appropriate in accordance with the object of etching. Examples of the acidic type etching solution include an aqueous solution of an acidic component alone, such as hydrochloric acid, sulfuric acid, hydrofluoric acid, or phosphoric acid; and a mixed aqueous solution of an acidic component and a salt such as ferric chloride, ammonium fluoride, or potassium permanganate. Regarding the acidic component, a combination of multiple acidic components may also be used. Furthermore, examples of the alkaline type etching solution include an aqueous solution of an alkali component alone, such as sodium hydroxide, potassium hydroxide, ammonia, an organic amine, or a salt of an organic amine, such as tetramethylammonium hydroxide; and a mixed aqueous solution of an alkali component and a salt such as potassium permanganate. Regarding the alkali component, a combination of multiple alkali components may also be used.

The temperature of the etching solution is not particularly limited; however, the temperature is preferably 45° C. or lower. The resin pattern used as the etching mask (etching pattern) in the invention is a resin pattern formed using the photocurable resin layer described above, and exhibits especially excellent resistance to acidic and alkaline etching solutions in such a temperature range. Therefore, the resin pattern is prevented from being peeled off during the etching step, and the parts where the resin pattern does not exist are selectively etched.

After the etching, in order to prevent line contamination, a washing step and a drying step may be carried out as necessary. The washing step may be carried out by, for example, washing a base material on which various layers have been formed, using pure water at normal temperature for 10 to 300 seconds. The drying step may be carried out using air blowing, and by adjusting the air blow pressure (about 0.1 to 5 kg/cm$^2$) as appropriate.

Next, the method for peeling the resin pattern is not particularly limited; however, for example, a method of immersing a base material on which various layers have been formed, for 5 to 30 minutes in a peeling solution that is being stirred at 30° C. to 80° C. and preferably at 50° C. to 80° C., may be used. The resin pattern used as an etching mask in the invention exhibits excellent chemical resistance at 45° C. or lower as explained above. However, when the chemical agent temperature rises to 50° C. or higher, the resin pattern exhibits a property of being swollen by an alkaline peeling solution. Due to such a property, when a peeling process is carried out using a peeling solution at 50° C. to 80° C., there is obtained an advantage that the duration of the process is shortened, and the amount of peeling residue of the resin pattern is reduced. That is, by providing a difference in the chemical agent temperature between the etching process and the peeling process, the resin pattern used as the etching mask in the invention exhibits satisfactory chemical resistance during the etching process, and exhibits satisfactory peeling properties during the peeling process. Thus, contrasting characteristics such as chemical resistance and peeling properties can be both satisfied.

Examples of the peeling solution include peeling solutions obtained by dissolving an inorganic alkali component such as sodium hydroxide or potassium hydroxide, or an organic alkali component such as a tertiary amine or a quaternary ammonium salt, in water, dimethyl sulfoxide, N-methylpyrrolidone, or a mixed solution thereof. Peeling may be carried out using the peeling solution, by means of spraying, showering, paddling or the like.

—Photosensitive Film Having Conductive Photocurable Resin Layer—

In a case in which the first transparent electrode pattern 3, the second transparent electrode pattern 4, and the metal wiring section 6 are formed using a photosensitive film such as described above, which has a conductive photocurable resin layer, these elements can be formed by transferring the conductive photocurable resin layer onto the surface of the transparent substrate 1.

When the first transparent electrode pattern 3 or the like is formed using the photosensitive film having a conductive photocurable resin layer, even on a base material having an opening, leakage of resist components through the opening portion does not occur, and a touch panel having advantages of being a thin layer and being lightweight can be produced by a simple process, without contaminating the backside of the substrate.

Furthermore, when a photosensitive film such as described above, which has a particular layer configuration having a thermoplastic resin layer between a conductive photocurable resin layer and a temporary support, is used for forming the first transparent electrode pattern 3, the second transparent electrode pattern 4 and the metal wiring section 6, air bubble generation at the time of photosensitive film lamination is prevented, and a first transparent electrode pattern 3, a second transparent electrode pattern 4, and a metal wiring section 6, all of which have excellent electrical conductivity and low resistance, can be formed.

—Use of Photosensitive Film as Lift-Off Material—

A first transparent electrode layer, a second transparent electrode layer, and other conductive members can also be formed using the photosensitive film as a lift-off material. In this case, patterning is performed using the photosensitive film, subsequently a transparent conductive layer is formed over the entire surface of a base material on which various layers have been formed, and then dissolution and removal of the photocurable resin layer together with the deposited transparent conductive layer is carried out. Thus, a desired transparent conductive layer pattern can be obtained (lift-off method).

(Image Display Device)

The image display device of the invention comprises the capacitive input device of the invention as a constituent element.

In regard to the capacitive input device of the invention and an image display device comprising this capacitive input device as a constituent element, the configurations disclosed in "Saishin Tatchipaneru Gijutsu (Latest Touch Panel Technologies)" (published by Techno Times Co., Ltd., on Jul. 6, 2009); Mitani, Yuji, reviewed, "Tatchipaneru no Gijutsui to Kaihatsu (Technology and Development of Touch Panels)", published by CMC Publishing Co., Ltd. (December, 2004); FPD International 2009 Forum T-11, Lecture textbook; and Cypress Semiconductor Corporation Application Note AN2292; and the like can be applied.

Examples

Hereinafter, the invention will be more specifically described by way of Examples. The materials, the use amounts, proportions, details of treatments, treatment procedures, and the like described in the following Examples can be appropriately modified, as long as the gist of the invention is maintained. Therefore, the scope of the invention is not intended to be limited to the specific examples described below. Meanwhile, unless particularly stated otherwise, the units "parts" and "%" are on a mass basis.

(1. Production of Transfer Films of Various Examples and Comparative Examples)

<Formation of Second Transparent Resin Layer>

Material-A1, Material-A2, and Material-A3 for a second transparent resin layer were produced such that the compositions described in the following Table 1 would be obtained. Any one of the Material-A1 to Material-A3 was applied on a temporary support, which was a polyethylene terephthalate film having a thickness of 25 µm, using a slit-like nozzle such that the film thickness after drying would be 8 µm. Subsequently, this was dried, and thus a second transparent resin layer was formed on the temporary support.

In Table 1, the symbol "%" described in the column for material represents the percentage content (mass %) of the compound included in the material, and the numerical values described in the columns for Material-A1 to Material-A3 represent the contents (parts by mass) of the various materials. The description of "-" implies that the relevant component is not included.

TABLE 1

| | Material | | |
|---|---|---|---|
| | Material-A1 | Material-A2 | Material-A3 |
| DPHA liquid (dipentaerythritol hexaacrylate: 38%, dipentaerythritol pentaacrylate: 38%, 1-methoxy-2-propyl acetate: 24%) | — | 0.76 | — |
| Acrylic monomer: NK ESTER A-DCP, manufactured by Shin-Nakamura Chemical Co., Ltd. | 3.14 | — | 3.86 |
| Acrylic monomer: NK ESTER A-TMPT, manufactured by Shin-Nakamura Chemical Co., Ltd. | — | — | 2.57 |
| Urethane-based monomer: UK OLIGO UA-32P manufactured by Shin-Nakamura Chemical Co., Ltd.; non-volatile fraction 75%, 1-methoxy-2-propyl acetate: 25% | 6.28 | 0.36 | — |
| Monomer mixture (polymerizable compound (b2-1) described in paragraph [0111] of JP2012-78528A, n = 1: tripentaerythritol octaacrylate percentage content 85%, sum of n = 2 and n = 3 as impurities is 15%) | — | 0.96 | — |
| Polymer solution 1 (structural formula P-25 described in paragraph [0058] of JP2008-146018A: weight-average molecular weight = 35,000, acid value 56 mg KOH/g, solid content 45%, 1-methoxy-2-propyl acetate 15%, 1-methoxy-2-propanol 40%) | 26.17 | 6.69 | 28.57 |
| Photoradical polymerization initiator: 2-benzyl-2-dimethylamino-1-(4-morpholinophenyl)-butanone (IRGACURE 379, manufactured by BASF SE) | 0.29 | 0.18 | — |
| Photopolymerization initiator: KAYACURE-DETX-S (alkylthioxanthone manufactured by Nippon Kayaku Co., Ltd.) | — | 0.18 | — |
| Photoradical polymerization initiator: IRGACURE 907, manufactured by BASF SE | — | — | 0.71 |
| Polymerization inhibitor: Phenothiazine, manufactured by Wako Pure Chemical Industries, Ltd. | 0.08 | — | — |
| Polymer solution 2 (compound represented by the following structural formula (3): weight-average molecular weight 15,000, non-volatile fraction 30%, methyl ethyl ketone 70%) | 0.01 | 0.03 | 0.01 |
| 1-Methoxy-2-propyl acetate | 26.57 | 52.81 | 27.79 |
| Methyl ethyl ketone | 37.46 | 38.04 | 36.53 |
| Total (parts by mass) | 100 | 100 | 100 |

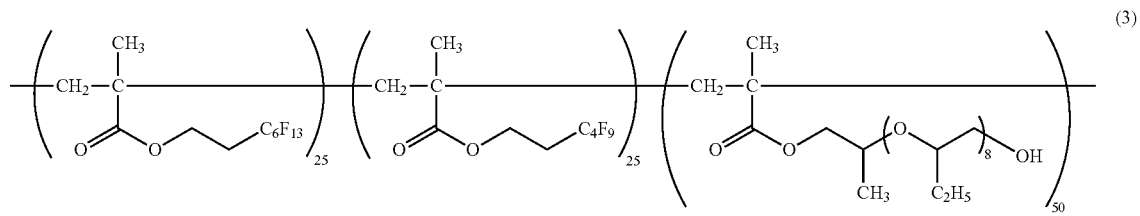

(3)

The numerical value shown at the lower right corner of the parentheses representing each constitutional unit in the compound represented by structural formula (3) represents the proportion by mass, and the numerical value shown at the lower right corner of the parentheses for the butylene oxide group represents the number of repetitions.

<Formation of First Transparent Resin Layer>

Material-B1 to Material-B16 for a first transparent resin layer were produced such that the compositions described in the following Table 2 to Table 4 would be obtained. Any one of Material-B1 to Material-B16 was applied on the second transparent resin layer by the combination described in the following Table 5, such that the film thickness after drying would be 0.1 μm. Subsequently, this was dried, and thus a first transparent resin layer was formed on the second transparent resin layer. In Comparative Example 2, application of the material for the first transparent resin layer was not performed, and the first transparent resin layer was not formed.

In Table 2 to Table 4, the symbol "%" described in the column for material represents the percentage content (mass %) of the compound included in the material in a case in which it is not described as mol %, and the numerical values described in the columns for Material-B1 to Material-B16 represent the contents (parts by mass) of the various materials. The description of "-" implies that the relevant component is not included.

In Table 5, an example described as "None" in the column for the metal oxide particles and the metal oxidation inhibitor represents that the respective compound is not included, and the symbol "%" described in the column for the metal oxidation inhibitor represents mass %.

<Pressure Bonding of Protective Film>

In a laminate provided with a second transparent resin layer and a first transparent resin layer on a temporary support, a protective film (polypropylene film having a thickness of 12 μm) was pressure-bonded on the first transparent resin layer.

In this manner, a transfer film in which a temporary support, a second transparent resin layer, a first transparent resin layer and a protective film were integrated was produced. The transfer film thus obtained was used as the transfer film for various Examples and Comparative Examples.

<Refractive Index, and Thickness Characteristics of First Transparent Resin Layer>

$n_1$, $n_2$, $T_2$, $\sigma_1$ and $H_1$ were determined as follows, using a reflection spectroscopic thickness meter, FE-3000 (manufactured by Otsuka Electronics Co., Ltd.). The following measurement was carried out under the conditions of 25° C.

(1) A temporary support to be used for each of various Examples and Comparative Examples was cut into a piece having a size of 10 cm in length×10 cm in width. A black polyethylene terephthalate (PET) material was contacted with one surface of the cut temporary support, with a transparent adhesive tape (OCA tape 8171CL; manufactured by 3M Company) interposed therebetween, and thus a laminate (first laminate) was produced. The reflective spectrum (wavelength: 430 to 800 nm) of the first laminate was evaluated using a reflection spectroscopic thickness meter, FE-3000, and the refractive indices $n_0$ of the temporary support at various wavelengths were determined.

(2) Similarly to the various Examples and Comparative Examples, a sample having only a second transparent resin layer formed on a temporary support was prepared, and this was cut into a piece having a size of 10 cm in length×10 cm in width. A laminate (second laminate) was produced, in which a black PET material was contacted with the temporary support surface of the cut sample, with a transparent adhesive tape (OCA tape 8171CL; manufactured by 3M Company) interposed therebetween. The second laminate was subjected to a structural analysis using transmission electron microscopy (TEM). The thickness of the second transparent resin layer was measured at 10 sites, the average value was determined, and a first prospective value $T_2(I)$ of the average value of thicknesses of the second transparent resin layer was determined. The reflective spectrum (wavelength: 430 to 800 nm) of the second laminate was evaluated using a reflection spectroscopic thickness meter, FE-3000. The refractive indices $n_2$ of the second transparent resin layer at various wavelengths and a second prospective value $T_2(II)$ of the average value of thicknesses of the second transparent resin layer were determined. The refractive index $n_2$ of the second transparent resin layer at a wavelength of 550 nm is described in the following table. At this time, in order to take account of the reflection at the interface between the second transparent resin layer and the temporary support, the refractive index $n_2$ and the second prospective value $T_2(II)$ of the second laminate were determined from the reflective spectrum of the second laminate by fitting based on simulation calculation, while having the value of the refractive index $n_0$ determined in section (1), and the first prospective value $T_2(I)$ inserted into the calculation formula.

(3) The protective film was peeled off from the transfer film of each of the Examples and Comparative Examples, and this was cut into a piece having a size of 10 cm in length×10 cm in width. A sample piece (third laminate) was produced in which a black PET material was contacted with the temporary support surface of the cut transfer film, with a transparent adhesive tape (OCA tape 8171CL; manufactured by 3M Company) interposed therebetween. The sample piece was subjected to a structural analysis using transmission electron microscopy (TEM). The thickness of the first transparent resin layer was measured at 10 sites, the average value was determined, and a prospective value $T_1(I)$ of the average value of thickness of the first transparent resin layer was determined. In regard to the sample piece, the reflective spectrum at 200 measurement points on a straight line in an arbitrary direction at an interval of 0.2 mm at a measurement spot: diameter φ 40 μm (that is, 4 cm in length) was evaluated using a reflection spectroscopic thickness meter, FE-3000. This was repeated in five rows at an interval of 1 cm in a direction orthogonal to the direction of the straight line described above, at 1,000 points in total. At this time, in order to take account of the reflection at the interface between the second transparent resin layer and the temporary support, and the interface between the second transparent resin layer and the first transparent resin layer, the refractive index $n_1$ of the first transparent resin layer, and the thicknesses of the second transparent resin layer and the first transparent resin layer at the 1,000 measurement points were determined from the reflective spectrum of the third laminate by fitting based on simulation calculation, while having the refractive index $n_0$ determined in section (1), the refractive index $n_2$ and the second prospective value $T_2(II)$ determined in section (2), and the first prospective value $T_2(I)$ inserted into the calculation formula. Furthermore, the average values, maximum values, minimum values and standard deviations of the thicknesses of the second transparent resin layer and the first transparent resin layer were calculated, and $n_1$, $n_2$, $T_1$, $T_2$, $\sigma_1$ and $H_1$ were determined.

In regard to the thickness of the second transparent resin layer and the thickness of the first transparent resin layer, the accuracy of fitting of the simulation can be increased by inputting the prospective values obtained by performing the structural analysis by TEM, into the reflection spectroscopic thickness meter.

TABLE 2

| | Material | | | | | | |
|---|---|---|---|---|---|---|---|
| | Material-B1 | Material-B2 | Material-B3 | Material-B4 | Material-B5 | Material-B6 | Material-B7 |
| Methanol | 333 | 333 | 333 | 333 | 333 | 333 | 333 |
| NANOUSE OZ-S30M: $ZrO_2$ particles, methanol dispersion liquid (non-volatile fraction 30.5%) manufactured by Nissan Chemical Industries, Ltd. | 48.3 | 48.3 | 48.3 | 48.3 | 48.3 | 48.3 | 48.3 |
| CERAMASE S-8: $SnO_2$ particles, aqueous dispersion liquid (non-volatile fraction 8%) manufactured by Taki Chemical Co., Ltd. | — | — | — | — | — | — | — |
| TTO-W-5: rutile type $TiO_2$ particles, aqueous dispersion liquid (non-volatile fraction 30%) manufactured by Ishihara Sangyo Kaisha, Ltd. | — | — | — | — | — | — | — |
| Monomer represented by formula 1 | 3.1 | 3.1 | — | 3.1 | 3.1 | 3.1 | 3.1 |
| Ion exchange water | 596 | 578 | 611 | 596 | 596 | 596 | 596 |
| 20% Aqueous solution of polyvinyl acetal resin (trade name: S-LEC KW-1, degree of acetalization 9 mol %, hydroxyl group content 90 mol %) manufactured by Sekisui Chemical Co., Ltd. | 18.7 | — | — | 18.7 | 18.7 | 18.7 | 18.7 |
| 10% Aqueous solution of polyvinyl alcohol resin (product obtained by dissolving PVA205C, degree of saponification 88 mol %, hydroxyl group content 88 mol %, degree of polymerization 550, manufactured by Kuraray Co., Ltd., in 10% aqueous solution) | — | 37.3 | — | — | — | — | — |
| Alkali-soluble acrylic resin (trade name: DIANAL BR-605, manufactured by Mitsubishi Chemical Corporation) | — | — | 7.14 | — | — | — | — |
| Imidazole | — | — | — | 0.41 | — | — | — |
| Benzimidazole | 0.41 | 0.41 | 0.41 | — | — | — | — |
| Benzotriazole | — | — | — | — | 0.41 | — | — |
| Tetrazole | — | — | — | — | — | 0.41 | — |
| Mercaptothiadiazole | — | — | — | — | — | — | 0.41 |
| Water-soluble photopolymerization initiator IRGACURE 2959, manufactured by BASF SE | 0.305 | 0.305 | — | 0.305 | 0.305 | 0.305 | 0.305 |
| Total (parts by mass) | 1000 | 1000 | 1000 | 1000 | 1000 | 1000 | 1000 |

TABLE 3

| | Material | | | | |
|---|---|---|---|---|---|
| | Material-B8 | Material-B9 | Material-B10 | Material-B11 | Material-B12 |
| Methanol | 333 | 333 | 333 | 333 | 333 |
| NANOUSE OZ-S30M: $ZrO_2$ particles, methanol dispersion liquid (non-volatile fraction 30.5%) manufactured by Nissan Chemical Industries, Ltd. | — | — | 48.3 | 48.3 | 48.3 |
| CERAMASE S-8: $SnO_2$ particles, aqueous dispersion liquid (non-volatile fraction 8%) manufactured by Taki Chemical Co., Ltd. | 184.1 | — | — | — | — |
| TTO-W-5: rutile type $TiO_2$ particles, aqueous dispersion liquid (non-volatile fraction 30%) manufactured by Ishiham Sangyo Kaisha, Ltd. | — | 28.3 | — | — | — |
| Monomer represented by formula 1 | 3.1 | 6.0 | 3.1 | 3.1 | 3.1 |
| Ion exchange water | 460 | 460 | 595 | 595 | 595 |
| 20% Aqueous solution of polyvinyl acetal resin (trade name: S-LEC KW-1, degree of acetalization 9 mol %, hydroxyl group content 90 mol %) manufactured by Sekisui Chemical Co., Ltd. | 18.7 | 35.3 | 20.6 | 20.7 | 20.7 |
| 10% Aqueous solution of polyvinyl alcohol resin (product obtained by dissolving PVA205C, degree of saponification 88 mol %, hydroxyl group content 88 mol %, degree of polymerization 550, manufactured by Kuraray Co., Ltd., in 10% aqueous solution) | — | — | — | — | — |
| Alkali-soluble acrylic resin (trade name: DIANAL BR-605, manufactured by Mitsubishi Chemical Corporation) | — | — | — | — | — |
| Imidazole | — | — | — | — | — |
| Benzimidazole | 0.41 | 0.41 | 0.03 | 0.015 | — |
| Benzotriazole | — | — | — | — | — |
| Tetrazole | — | — | — | — | — |
| Mercaptothiadiazole | — | — | — | — | — |
| Water-soluble photopolymerization initiator IRGACURE 2959, manufactured by BASF SE | 0.305 | 0.305 | 0.305 | 0.305 | 0.305 |
| Total (parts by mass) | 1000 | 863 | 1000 | 1000 | 1000 |

TABLE 4

| | Material | | | |
|---|---|---|---|---|
| | Material-B13 | Material-B14 | Material-B15 | Material-B16 |
| Methanol | 333 | 333 | 333 | 333 |
| NANOUSE OZ-S30M: $ZrO_2$ particles, methanol dispersion liquid (non-volatile fraction 30.5%) manufactured by Nissan Chemical Industries, Ltd. | 48.3 | 48.3 | 48.3 | 48.3 |
| CERAMASE S-8: $SnO_2$ particles, aqueous dispersion liquid (non-volatile fraction 8%) manufactured by Taki Chemical Co., Ltd. | — | — | — | — |
| TTO-W-5: ruffle type $TiO_2$ particles, aqueous dispersion liquid (non-volatile fraction 30%) manufactured by Ishihara Sangyo Kaisha, Ltd. | — | — | — | — |
| Monomer represented by formula 1 | 3.1 | 3.1 | 3.1 | 3.1 |
| Ion exchange water | 596 | 596 | 596 | 596 |
| 20% Aqueous solution of polyvinyl acetal resin (trade name: S-LEC KW-1, degree of acetalization 9 mol %, hydroxyl group content 90 mol %) manufactured by Sekisui Chemical Co., Ltd. | 18.7 | 18.7 | 18.7 | 18.7 |
| 10% Aqueous solution of polyvinyl alcohol resin (product obtained by dissolving PVA205C, degree of saponification 88 mol %, hydroxyl group content 88 mol %, degree of polymerization 550, manufactured by Kuraray Co., Ltd., in 10% aqueous solution) | — | — | — | — |
| Alkali-soluble acrylic resin (trade name: DIANAL BR-605, manufactured by Mitsubishi Chemical Corporation) | — | — | — | — |
| 1-[N,N-bis(2-ethylhexyl)aminomethyl]benzotriazole | 0.41 | — | — | — |
| 1-[N,N-bis(2-ethylhexyl)aminomethyl]methylbenzotriazole | — | 0.41 | — | — |
| 2,2'-{[(Methyl-1H-benzotriazol-1-yl)methyl]imino}bisethanol | — | — | 0.41 | — |
| Carboxybenzotriazole | — | — | — | 0.41 |
| Water-soluble photopolymerization initiator IRGACURE 2959, manufactured by BASF SE | 0.305 | 0.305 | 0.305 | 0.305 |
| Total (parts by mass) | 1000 | 1000 | 1000 | 1000 |

TABLE 5

| | Material | | | | | Second transparent resin layer | |
|---|---|---|---|---|---|---|---|
| | First transparent resin layer | | | | | | |
| | Type | Metal oxide particles | Refractive index | Metal oxidation inhibitor | Amount of metal oxidation inhibitor | Type | Refractive index |
| Example 1 | Material-B1 | $ZrO_2$ (refractive index 2.2) | 1.65 | Benzimidazole | 1.84% | Material-A1 | 1.51 |
| Example 2 | Material-B1 | $ZrO_2$ (refractive index 2.2) | 1.65 | Benzimidazole | 1.84% | Material-A2 | 1.52 |
| Example 3 | Material-B1 | $ZrO_2$ (refractive index 2.2) | 1.65 | Benzimidazole | 1.84% | Material-A3 | 1.51 |
| Example 4 | Material-B2 | $ZrO_2$ (refractive index 2.2) | 1.65 | Benzimidazole | 1.84% | Material-A1 | 1.51 |
| Example 5 | Material-B3 | $ZrO_2$ (refractive index 2.2) | 1.65 | Benzimidazole | 1.84% | Material-A1 | 1.51 |
| Example 6 | Material-B4 | $ZrO_2$ (refractive index 2.2) | 1.65 | Imidazole | 1.84% | Material-A1 | 1.51 |
| Example 7 | Material-B5 | $ZrO_2$ (refractive index 2.2) | 1.65 | Benzotriazole | 1.84% | Material-A1 | 1.51 |
| Example 8 | Material-B6 | $ZrO_2$ (refractive index 2.2) | 1.65 | Tetrazole | 1.84% | Material-A1 | 1.51 |
| Example 9 | Material-B7 | $ZrO_2$ (refractive index 2.2) | 1.65 | Mercaptothiadiazole | 1.84% | Material-A1 | 1.51 |
| Example 10 | Material-B8 | $SnO_2$ (refractive index 2.0) | 1.60 | Benzimidazole | 1.84% | Material-A1 | 1.51 |
| Example 11 | Material-B9 | $TiO_2$ (refractive index 2.7) | 1.62 | Benzimidazole | 1.84% | Material-A1 | 1.51 |
| Example 12 | Material-B10 | $ZrO_2$ (refractive index 2.2) | 1.65 | Benzimidazole | 0.13% | Material-A1 | 1.51 |
| Example 13 | Material-B11 | $ZrO_2$ (refractive index 2.2) | 1.65 | Benzimidazole | 0.07% | Material-A1 | 1.51 |
| Example 14 | Material-B13 | $ZrO_2$ (refractive index 2.2) | 1.65 | 1-[N,N-bis(2-ethylhexyl)aminomethyl]benzotriazole | 1.84% | Material-A1 | 1.51 |
| Example 15 | Material-B14 | $ZrO_2$ (refractive index 2.2) | 1.65 | 1-[N,N-bis(2-ethylhexyl)aminomethyl]methylbenzotriazole | 1.84% | Material-A1 | 1.51 |
| Example 16 | Material-B15 | $ZrO_2$ (refractive index 2.2) | 1.65 | 2,2'-{[(Methyl-1H-benzotriazol-1-yl)methyl]imino}bisethanol | 1.84% | Material-A1 | 1.51 |
| Example 17 | Material-B16 | $ZrO_2$ (refractive index 2.2) | 1.65 | Carboxybenzotriazole | 1.84% | Material-A1 | 1.51 |
| Comparative Example 1 | Material-B12 | $ZrO_2$ (refractive index 2.2) | 1.65 | None | — | Material-A1 | 1.51 |
| Comparative Example 2 | None | None | — | None | — | Material-A1 | 1.51 |

(2. Evaluation of Developing Performance on Copper Foil-Laminated Polyimide Film and Evaluation of Protective Performance of Various Examples and Comparative Examples)

A model experiment for evaluating the developability on a metal wiring section and protective properties for the metal wiring section of the transfer films of Examples and Comparative Examples was performed. As the model for the metal wiring section, a copper foil-laminated polyimide film having a copper foil laminated thereon (manufactured by Toray Co., Ltd.) was used.

The transfer film of each of the Examples and Comparative Examples, from which the protective film had been peeled off, was used to transfer a first transparent resin layer, a second transparent resin layer and a temporary support onto a copper foil-laminated polyimide film such that the first transparent resin layer would be contacted with the copper foil-laminated polyimide film (temperature of copper foil-laminated polyimide film: 40° C., rubber roller temperature: 110° C., linear pressure: 3 N/cm, conveyance speed: 2 m/min).

Subsequently, the laminate was patternwise exposed at an amount of exposure of 100 mJ/cm$^2$ (i-line) through the temporary support, using a proximity type exposure machine (manufactured by Hitachi High-Tech Electronics Engineering Co., Ltd.) having an ultrahigh pressure mercury lamp, by setting the distance between the exposure mask (quartz exposure mask having a pattern for forming an overcoat) and the temporary support to 125 μm. After the temporary support was peeled off, the laminate was subjected to a washing treatment for 60 seconds using a 2% aqueous solution of sodium carbonate at 32° C. and was developed. Ultrapure water was sprayed onto the copper foil-laminated polyimide film after the washing treatment, through an ultrahigh pressure washing nozzle, and thus residue was removed. Subsequently, air was blown to remove water on the base material, and the laminate was subjected to a post-bake treatment for 30 minutes at 145° C. In this manner, a laminate in which a first transparent resin layer was formed on the copper foil-laminated polyimide film, and a second transparent resin layer was formed on the first transparent resin layer on the side opposite to the copper foil-laminated polyimide film side, was formed.

In regard to the transfer film of Comparative Example 2, a second transparent resin layer and a temporary support were transferred onto a copper foil-laminated polyimide film such that the second transparent resin layer would be contacted with the copper foil-laminated polyimide film. In Comparative Example 2, a laminate in which the second transparent resin layer was formed on the copper foil-laminated polyimide film, and a temporary support was formed on the second transparent resin layer on the side opposite to the copper foil-laminated polyimide film, was formed. In the following explanation on the transfer films of various Examples and Comparative Examples, the description on the first transparent resin layer is omitted in Comparative Example 2.

<Evaluation of Developability>

A laminate obtained by laminating a first transparent resin layer and a second transparent resin layer on a copper foil-laminated polyimide film by the method described above, such that the first transparent resin layer would be contacted with the copper foil-laminated polyimide film, and exposing and developing the resultant, was observed visually and using an optical microscope, and thereby developability was evaluated. Grade A is a level that is practically usable. The evaluation results are described in Table 7.

[Evaluation Criteria]

A: Residue cannot be confirmed in the unexposed areas by visual inspection.

B: Residue can be confirmed in the unexposed areas by visual inspection.

C: Undeveloped parts exist in the unexposed areas, and a large amount of residue can be confirmed by visual inspection.

D: The temporary support could not be peeled off from the substrate, and developability could not be evaluated.

<Evaluation of Protective Properties>

A first transparent resin layer and a second transparent resin layer were laminated on a copper foil-laminated polyimide film by the method described above such that the first transparent resin layer would be contacted with the copper foil-laminated polyimide film, and the laminate was exposed, developed and then post-baked. The tint of the copper foil-laminated polyimide film was observed by visual inspection, and thereby protective properties were evaluated. The copper foil-laminated polyimide film had light beige color before post-bake; however, when the copper foil-laminated polyimide film is affected by post-bake and produce a film of copper oxide, copper sulfide or the like on the surface, the external appearance changes from light beige to orange color, from orange color to reddish purple, from reddish purple to purple tinged with green, from purple tinged with green to light blue, as a result of the interference effect of the film. Samples were evaluated as follows according to the extent of the change in appearance. Grades A to C are levels that are practically usable, and grade A or B is preferred, while grade A is more preferred. The evaluation results are presented in Table 7. The "exposed area" is an area where the first transparent resin layer and the second transparent resin layer are laminated on the copper foil-laminated polyimide film, and the "unexposed area" is an area where the copper foil-laminated polyimide film is exposed.

[Evaluation Criteria]

A: Tint hardly changes in both the exposed area and the unexposed area (light beige).

B: There is no change in the tint in the exposed area, and the tint slightly changes in some part or the entirety of the unexposed area (beige or reddish purple).

C: There is no change in the tint in the exposed area, and the tint significantly changes in some part of the unexposed area (purple tinged with green, or light blue).

D: There is no change in the tint in the exposed area, and the tint significantly changes in the entire unexposed area (purple tinged with green, or light blue).

E: Tint changes significantly in both the exposed area and the unexposed area (purple tinged with green, or light blue).

(3. Production of Transparent Electrode Pattern Film to be Used for Laminate Production)

<Formation of Transparent Film>

A cycloolefin resin film having a film thickness of 38 μm and a refractive index of 1.53 was subjected to a corona discharge treatment for 3 seconds using a high-frequency oscillator under the conditions of an output voltage of 100%, an output power of 250 W, a wire electrode having a diameter of 1.2 mm, an electrode length of 240 mm, and a work electrode interval of 1.5 mm, and thus surface modification was carried out. The film thus obtained was used as a transparent film substrate.

Next, the material of Material-C indicated in the following Table 6 was applied on the transparent film substrate using a slit-like nozzle, and then the material was irradiated with ultraviolet radiation (cumulative amount of light 300 mJ/cm$^2$) and dried at about 110° C. In this manner, a transparent film having a refractive index of 1.60 and a film thickness of 80 nm was formed on the transparent film substrate.

In Table 6, the symbol "%" described in the column for material represents the percentage content (mass %) of the compound included in the material, and the numerical value described in the column for Material-C represents the content (parts by mass) of each material.

TABLE 6

| Material | Material-C |
|---|---|
| $ZrO_2$: ZR-010 manufactured by Solar Co., Ltd. | 2.08 |
| DPHA liquid (dipentaerythritol hexaacrylate: 38%, dipentaerythritol pentaacrylate: 38%, 1-methoxy-2-propyl acetate: 24%) | 0.29 |
| Urethane-based monomer: UK OLIGO UA-32P manufactured by Shin-Nakamura Chemical Co., Ltd.; non-volatile fraction 75%, 1-methoxy-2-propyl acetate: 25% | 0.14 |
| Monomer mixture (polymerizable compound (b2-1) described in paragraph [01111] of JP2012-78528A, n = 1: tripentaerythritol octaacrylate percentage content 85%, sum of n = 2 and n = 3 as impurities is 15%) | 0.36 |
| Polymer solution 1 (structural formula P-25 described in paragraph [0058] of JP2008-146018A: weight-average molecular weight = 35,000, solid content 45%, 1-methoxy-2-propyl acetate 15%, 1-methoxy-2-propanol 40%) | 1.89 |
| Photoradical polymerization initiator: 2-benzyl-2-dimethylamino-1-(4-morpholinophenyl)-butanone (Irgacure 379, manufactured by BASF SE) | 0.03 |
| Photopolymerization initiator: KAYACURE-DETX-S (alkylthioxanthone manufactured by Nippon Kayaku Co., Ltd.) | 0.03 |
| Polymer solution 2 (compound represented by structural formula (3): weight-average molecular weight 15,000, non-volatile fraction 30%, methyl ethyl ketone 70%) | 0.01 |
| 1-Methoxy-2-propyl acetate | 38.73 |
| Methyl ethyl ketone | 56.8 |
| Total (parts by mass) | 100 |

<Formation of Transparent Electrode Layer>

The film having a transparent film laminated on a transparent film substrate, which was obtained as described above, was introduced into a vacuum chamber, and an ITO thin film having a thickness of 40 nm and a refractive index of 1.82 was formed thereon by DC (direct current) Magnetron sputtering (conditions: temperature of transparent film substrate 150° C., argon pressure 0.13 Pa, oxygen pressure 0.01 Pa) using an ITO target (indium:tin=95:5 (molar ratio)) having a $SnO_2$ percentage content of 10% by mass. In this manner, a film having a transparent film and a transparent electrode layer formed on a transparent film substrate was obtained. The surface resistance of the ITO thin film was 80 Ω/.

<Production of Photosensitive Film for Etching E1>

On a temporary support, which was a polyethylene terephthalate film having a thickness of 75 μm, a coating liquid for a thermoplastic resin layer formed from the following formulation H1 was applied using a slit-like nozzle and was dried. Next, a coating liquid for an interlayer formed from the following formulation P1 was applied thereon and dried. Furthermore, a coating liquid for a photocurable resin layer for etching formed from the following formulation E1 was applied thereon and dried. Thus, a laminate comprising a thermoplastic resin layer having a dried film thickness of 15.1 μm, an interlayer having a dried film thickness of 1.6 μm, and a photocurable resin layer for etching having a film thickness of 2.0 μm on a temporary support was formed, and lastly, a protective film (polypropylene film having a thickness of 12 μm) was pressure-bonded on this laminate. In this manner, a photosensitive film for etching E1 as a transfer material in which a temporary support, a thermoplastic resin layer, an interlayer (oxygen barrier film) and a transparent curable resin layer were integrated was produced.

<Coating Liquid for Photocurable Resin Layer for Etching: Formulation E1>

Methyl methacrylate/styrene/methacrylic acid copolymer (copolymer composition (mass %): 31/40/29, weight-average molecular weight 60,000, acid value 163 mg KOH/g): 16 parts by mass Monomer 1 (trade name: BPE-500, manufactured by Shin-Nakamura Chemical Co., Ltd.): 5.6 parts by mass Tetraethylene oxide monomethacrylate 0.5 mol-adduct of hexamethylene diisocyanate: 7 parts by mass Cyclohexanedimethanol monoacrylate as compound having one polymerizable group in molecule: 2.8 parts by mass 2-Chloro-N-butylacridone: 0.42 parts by mass 2,2-Bis(o-chlorophenyl)-4,4',5,5'-tetraphenylbiimidazole: 2.17 parts by mass Malachite Green oxalate: 0.02 parts by mass Leuco Crystal Violet: 0.26 parts by mass Phenothiazine: 0.013 parts by mass Surfactant (trade name: MEGAFAC F-780F, manufactured by DIC Corporation): 0.03 parts by mass Methyl ethyl ketone: 40 parts by mass 1-Methoxy-2-propanol: 20 parts by mass The viscosity at 100° C. after solvent removal of the coating liquid for a photocurable resin layer for etching E1 was 2,500 Pa·sec.

<Coating Liquid for Thermoplastic Resin Layer: Formulation H1>

Methanol: 11.1 parts by mass

Propylene glycol monomethyl ether acetate: 6.36 parts by mass

Methyl ethyl ketone: 52.4 parts by mass

Methyl methacrylate/2-ethylhexyl acrylate/benzyl methacrylate/methacrylic acid copolymer (copolymerization compositional ratio (molar ratio)=55/11.7/4.5/28.8, weight-average molecular weight=100,000, Tg 70° C.): 5.83 parts by mass Styrene/acrylic acid copolymer (copolymerization compositional ratio (molar ratio)=63/37, weight-average molecular weight=10,000, Tg 100° C.): 13.6 parts by mass Monomer-1 (trade name: BPE-500, manufactured by Shin-Nakamura Chemical Co., Ltd.): 9.1 parts by mass Fluorine-based polymer: 0.54 parts by mass The fluorine-based polymer was a copolymer of 40 parts of $C_6F_{13}CH_2CH_2OCOCH=CH_2$, 55 parts of $H(OCH(CH_3)CH_2)_7OOOCH=CH_2$, and 5 parts of $H(OCHCH_2)_7OOOCH=CH_2$, having a weight-average molecular weight of 30,000, in the form of a 30 mass % solution in methyl ethyl ketone (trade name: MEGAFAC F780F, manufactured by DIC Corporation).

<Coating Liquid for Interlayer: Formulation P1>
Polyvinyl alcohol: 32.2 parts by mass
(trade name: PVA205, manufactured by Kuraray Co., Ltd., degree of saponification=88%, degree of polymerization 550)
Polyvinylpyrrolidone: 14.9 parts by mass
(trade name: K-30, manufactured by ISP Japan, Ltd.)
Distilled water: 524 parts by mass
Methanol: 429 parts by mass
<Formation of Transparent Electrode Pattern>

A film having a transparent film and a transparent electrode layer formed on a transparent film substrate was washed, and the photosensitive film for etching E1, from which the protective film had been removed, was laminated on the washed film (temperature of transparent film substrate: 130° C., rubber roller temperature: 120° C., linear pressure: 100 N/cm, conveyance speed: 2.2 m/min). The temporary support was peeled off, and then the photosensitive film was patternwise exposed at an amount of exposure of 50 mJ/cm$^2$ (i-line) by setting the distance between an exposure mask (quartz exposure mask having a transparent electrode pattern) surface and the photocurable resin layer for etching to 200 μm. Next, the resultant was treated for 100 seconds at 25° C. using a triethanolamine-based developer (containing 30% by mass of triethanolamine, liquid obtained by diluting trade name: T-PD2 (manufactured by Fujifilm Corporation) 10 times with pure water), and for 20 seconds at 33° C. using a surfactant-containing washing liquid (liquid obtained by diluting trade name: T-SD3 (manufactured by Fujifilm Corporation) 10 times with pure water), and residue removal was carried out using a rotating brush and an ultrahigh pressure washing liquid. The resultant was further subjected to a post-bake treatment for 30 minutes at 130° C. Thus, a film having a transparent film, a transparent electrode layer and a photocurable resin layer pattern for etching formed on a transparent film substrate was obtained.

The film having a transparent film, a transparent electrode layer and a photocurable resin layer pattern for etching formed on a transparent film substrate was immersed in an etching tank containing an ITO etchant (hydrochloric acid, aqueous solution of potassium chloride, liquid temperature: 30° C.) and treated for 100 seconds. Thus, the transparent electrode layer in an exposed region that was not covered by the photocurable resin layer for etching was dissolved and removed. In this manner, a transparent electrode pattern-attached film having a photocurable resin layer pattern for etching was obtained.

Next, the transparent electrode pattern-attached film having a photocurable resin layer pattern for etching was immersed in a resist peeling tank containing a resist peeling solution (N-methyl-2-pyrrolidone, monoethanolamine, and a surfactant (trade name: SURFYNOL 465, manufactured by Air Products & Chemicals, Inc.), liquid temperature 45° C.) and was treated for 200 seconds. Thus, the photocurable resin layer for etching was removed. In this manner, a film having a transparent film and a transparent electrode pattern formed on a transparent film substrate was obtained.

(4. Production of Laminates of Various Examples and Comparative Examples)

Each of the transfer film of the various Examples and Comparative Examples was transferred onto a film having a transparent electrode pattern formed thereon. Specifically, each of the transfer films of various Examples and Comparative Examples, from which the protective film had been peeled off, was used, and the first transparent resin layer, the second transparent resin layer and the temporary support were transferred such that the first transparent resin layer would cover the transparent film and the transparent electrode pattern of a film having a transparent film and a transparent electrode pattern formed on a transparent film substrate (temperature of transparent film substrate: 40° C., rubber roller temperature: 110° C., linear pressure: 3 N/cm, conveyance speed: 2 m/min).

Subsequently, the laminate was patternwise exposed at an amount of exposure of 100 mJ/cm$^2$ (i-line) through the temporary support, using a proximity type exposure machine (manufactured by Hitachi High-Tech Electronics Engineering Co., Ltd.) having an ultrahigh pressure mercury lamp, by setting the distance between the exposure mask (quartz exposure mask having a pattern for forming an overcoat) and the temporary support to 125 μm. After the temporary support was peeled off, the laminate was subjected to a washing treatment for 60 seconds at 32° C. using a 2% aqueous solution of sodium carbonate and was developed. Ultrapure water was sprayed onto the transparent film substrate after the washing treatment, through an ultrahigh pressure washing nozzle, and thus residue was removed. Subsequently, air was blown to remove water on the transparent film substrate, and the laminate was subjected to a post-bake treatment for 30 minutes at 145° C. In this manner, a laminate in which a transparent film, a transparent electrode pattern, a first transparent resin layer and a second transparent resin layer were laminated on a transparent film substrate, was obtained. The laminates described above were all transparent laminates.

<Evaluation of Transparent Laminate>

[Evaluation of Transparent Electrode Pattern Concealability]

The transparent electrode pattern concealability was evaluated as follows.

First, the transparent film substrate of the transparent laminate was adhered to a black PET material, with a transparent adhesive tape (manufactured by 3M Company, trade name: OCA TAPE 8171CL) interposed therebetween, and the entire surface of this transparent film substrate was light-shielded. That is, between the two surfaces of the transparent film, the black PET material was provided on the surface where a transparent film and the like were not laminated.

Subsequently, between the two surfaces of the transparent laminate, light was caused to enter through the surface where the black PET material was not provided, and the reflected light was observed. Specifically, in a dark room, light was caused to enter through the second transparent resin layer side, using a fluorescent lamp (light source), and the reflected light from this second transparent resin layer surface was visually observed from a slant. Grades A, B and C are levels for practical use, and grade A or B is preferred, while grade A is more preferred. The evaluation results are summarized in Table 7.

In Table 7, an example in which "None" is described in the column for the metal oxide particles and the metal oxidation inhibitor means that the respective compounds are not included. The symbol "%" described in the column for the metal oxidation inhibitor represents mass %, and the description in the column for practical level represents the level for practical use according to the various evaluation criteria.

—Evaluation Criteria—

A: The transparent electrode pattern is not visible at all.

B: The transparent electrode pattern is slightly visible, but almost invisible.

C: The transparent electrode pattern is visible, but to an extent that is practically acceptable.

D: The transparent electrode pattern is clearly visible (easily recognizable).

[Evaluation of Developability]

For a transparent laminate obtained by laminating a transparent film, a transparent electrode pattern, a first transparent resin layer and a second transparent resin layer on a transparent film substrate in this layer configuration, developability was evaluated by observing the residue generated after developing, visually and using an optical microscope. Grade A is a level that is practically usable. The evaluation results are summarized in Table 7.

—Evaluation Criteria—

A: Residue cannot be confirmed by visual inspection at the unexposed area.

B: Residue can be confirmed by visual inspection at the unexposed area.

C: Undeveloped parts exist in the unexposed area, and a large amount of residue can be confirmed by visual inspection.

D: The temporary support could not be peeled off from the transfer film that has been transferred, and observation of residue was not achieved.

TABLE 7

| | Material | | | | | | Evaluation | | | |
| | First transparent resin layer | | | | | Second transparent resin layer | Evaluation on copper foil-laminated polyimide | | Evaluation of transparent laminate | |
| | | | | | Amount of metal | | | | Pattern | |
| | Type | Metal oxide particles | Refractive index | Metal oxidation inhibitor | oxidation inhibitor | Type | Refractive index | Develop-ability | Protective properties | conceal-ability | Develop-ability |
| Example 1 | Material-B1 | ZrO$_2$ (refractive index 2.2) | 1.65 | Benzimidazole | 1.84% | Material-A1 | 1.51 | A | A | B | A |
| Example 2 | Material-B1 | ZrO$_2$ (refractive index 2.2) | 1.65 | Benzimidazole | 1.84% | Material-A2 | 1.52 | A | A | B | A |
| Example 3 | Material-B1 | ZrO$_2$ (refractive index 2.2) | 1.65 | Benzimidazole | 1.84% | Material-A3 | 1.51 | A | A | B | A |
| Example 4 | Material-B2 | ZrO$_2$ (refractive index 2.2) | 1.65 | Benzimidazole | 1.84% | Material-A1 | 1.51 | A | A | B | A |
| Example 5 | Material-B3 | ZrO$_2$ (refractive index 2.2) | 1.65 | Benzimidazole | 1.84% | Material-A1 | 1.51 | A | A | B | A |
| Example 6 | Material-B4 | ZrO$_2$ (refractive index 2.2) | 1.65 | Imidazole | 1.84% | Material-A1 | 1.51 | A | B | B | A |
| Example 7 | Material-B5 | ZrO$_2$ (refractive index 2.2) | 1.65 | Benzotriazole | 1.84% | Material-A1 | 1.51 | A | A | B | A |
| Example 8 | Material-B6 | ZrO$_2$ (refractive index 2.2) | 1.65 | Tetrazole | 1.84% | Material-A1 | 1.51 | A | B | B | A |
| Example 9 | Material-B7 | ZrO$_2$ (refractive index 2.2) | 1.65 | Mercaptothiadiazole | 1.84% | Material-A1 | 1.51 | A | B | B | A |
| Example 10 | Material-B8 | SnO$_2$ (refractive index 2.0) | 1.60 | Benzimidazole | 1.84% | Material-A1 | 1.51 | A | A | B | A |
| Example 11 | Material-B9 | TiO$_2$ (refractive index 2.7) | 1.62 | Benzimidazole | 1.84% | Material-A1 | 1.51 | A | A | B | A |
| Example 12 | Material-B10 | ZrO$_2$ (refractive index 2.2) | 1.65 | Benzimidazole | 0.13% | Material-A1 | 1.51 | A | B | B | A |
| Example 13 | Material-B11 | ZrO$_2$ (refractive index 2.2) | 1.65 | Benzimidazole | 0.07% | Material-A1 | 1.51 | A | C | B | A |
| Example 14 | Material-B13 | ZrO$_2$ (refractive index 2.2) | 1.65 | 1-[N,N-bis(2-ethylhexyl)aminomethyl]benzotriazole | 1.84% | Material-A1 | 1.51 | A | A | B | A |
| Example 15 | Material-B14 | ZrO$_2$ (refractive index 2.2) | 1.65 | 1-[N,N-bis(2-ethylhexyl)aminomethyl]methylbenzotriazole | 1.84% | Material-A1 | 1.51 | A | A | B | A |
| Example 16 | Material-B15 | ZrO$_2$ (refractive index 2.2) | 1.65 | 2,2'-{[(Methyl-1H-benzotriazol-1-yl)methyl]imino}bisethanol | 1.84% | Material-A1 | 1.51 | A | B | B | A |

TABLE 7-continued

| | Material | | | | | | | Evaluation | | | |
|---|---|---|---|---|---|---|---|---|---|---|---|
| | First transparent resin layer | | | | | Second transparent resin layer | | Evaluation on copper foil-laminated polyimide | | Evaluation of transparent laminate Pattern | |
| | | Metal oxide particles | Refractive index | Metal oxidation inhibitor | Amount of metal oxidation inhibitor | | Refractive index | Develop-ability | Protective properties | conceal-ability | Develop-ability |
| | Type | | | | | Type | | | | | |
| Example 17 | Material-B16 | ZrO$_2$ (refractive index 2.2) | 1.65 | Carboxybenzotriazole | 1.84% | Material-A1 | 1.51 | A | A | B | A |
| Comparative Example 1 | Material-B12 | ZrO$_2$ (refractive index 2.2) | 1.65 | None | — | Material-A1 | 1.51 | A | D | B | A |
| Comparative Example 2 | None | None | — | None | — | Material-A1 | 1.51 | A | D | D | A |
| Practically usable level | — | — | — | — | — | — | — | A | A~C | A~C | A |

From Table 7, it can be seen that the transfer films of Examples 1 to 17 can protect the metal surface of the object both in the exposed areas and the unexposed areas, without impairing other performance (developability or pattern concealability).

The refractive indices of the transparent laminates of the various Examples and Comparative Examples were measured by the method for measuring the refractive index for a laminate as described above, the measured values of the refractive indices of the first transparent resin layer and the second transparent resin layer were the same values as the measured values of the refractive indices in the transfer film, respectively.

On the other hand, in Comparative Example 1 that did not include a metal oxidation inhibitor, the metal surface could be protected at the exposed area where the second transparent resin layer and the first transparent resin layer were maintained; however, the metal surface was not protected at the unexposed area where the second transparent resin layer and the first transparent resin layer were removed. Furthermore, Comparative Example 2 in which the first transparent resin layer was not formed, gave results with markedly deteriorated pattern concealability and protective properties.

In Examples 1 to 5 and 10 to 13, in regard to the unexposed area after post-bake, which was produced for the evaluation of protective properties, the surface of the region from which the transparent resin layer was removed was analyzed using TRIFT II manufactured by Ulvac-Phi, Inc., and as a result, it was confirmed that complex ions of Cu and benzimidazole had been produced. Furthermore, in Examples 7 and 14 to 17, it was confirmed that complex ions of Cu and various benzotriazole compounds had been produced at the surface of the unexposed area after post-bake, which was produced for the evaluation of protective properties.

(Production of Image Display Device (Touch Panel))

A film including each of the transparent laminates of the Examples manufactured previously was bonded to a liquid crystal display device manufactured by the method described in paragraphs 0097 to 0119 of JP2009-47936A, and a front glass plate was adhered thereto. Thus, image display devices including the transparent laminates of the Examples, which included a capacitive input device as a constituent element, were produced by a known method.

<Evaluation of Capacitive Input Device and Image Display Device>

The capacitive input devices and the image display devices including the transparent laminates of the Examples could have the visibility of the transparent electrode pattern suppressed to a level that was free of problem for practical use.

The second transparent resin layer and the first transparent resin layer did not have defects such as air bubbles, and image display devices having excellent display characteristics were obtained.

EXPLANATION OF REFERENCES

1: transparent substrate (transparent film substrate or front face plate)
2: mask layer
3: transparent electrode pattern (first transparent electrode pattern)
3a: pad part
3b: connection part
4: transparent electrode pattern (second transparent electrode pattern)
5: insulating layer
6: metal wiring section
7: second transparent resin layer (preferably having a function as a transparent protective layer)
8: opening
10: capacitive input device
11: transparent film
12: first transparent resin layer (may have a function as a transparent insulating layer)
13: transparent laminate
14: partial region on metal wiring section
21: region in which a transparent electrode pattern, a second transparent resin layer, and a first transparent resin layer are laminated such that the first transparent resin layer is contacted with the transparent electrode pattern 22: non-patterned region
α: taper angle
26: temporary support
29: protective release layer (protective film)
30: transfer film
31: terminal of lead wiring
33: cured area of first transparent resin layer and second transparent resin layer
34: opening corresponding to terminal of lead wiring (uncured area of first transparent resin layer and second curable transparent resin layer)
X-X1: cross-section

What is claimed is:

1. A transfer film comprising:
a temporary support; and
a transparent resin layer containing a metal oxidation inhibitor,
wherein the transparent resin layer has a refractive index of 1.60 or higher, and
the metal oxidation inhibitor is at least one selected from the group consisting of imidazole, benzimidazole, tetrazole, mercaptothiadiazole, benzotriazole, 1-[N,N-bis(2-ethylhexyl)aminomethyl]benzotriazole, 1-[N,N-bis(2-ethylhexyl)aminomethyl]methylbenzotriazole, 2,2-{[(methyl-1H-benzotriazol-1-yl)methyl]imino}bisethanol, and carboxybenzotriazole.

2. The transfer film according to claim 1, wherein the transparent resin layer contains metal oxide particles.

3. The transfer film according to claim 1,
wherein the transparent resin layer is a first transparent resin layer,
the transfer film further comprises a second transparent resin layer between the temporary support and the first transparent resin layer, and
the second transparent resin layer has photosensitivity.

4. The transfer film according to claim 3, wherein the second transparent resin layer contains a polymerizable compound and a photopolymerization initiator.

5. The transfer film according to claim 3, wherein the second transparent resin layer is an alkali-developable layer.

6. The transfer film according to claim 3, wherein the second transparent resin layer has a refractive index of less than 1.60.

7. The transfer film according to claim 1, wherein the content of the metal oxidation inhibitor is 0.1% by mass or more with respect to the total mass of the transparent resin layer.

8. The transfer film according to claim 1, wherein the transparent resin layer has photocuring properties and/or thermosetting properties.

9. A method for manufacturing a laminate, the method comprising:
preparing the transfer film according to claim 1;
laminating the transparent resin layer of the transfer film on a transparent electrode pattern disposed on a base material, such that the transparent resin layer is brought into contact with the transparent electrode pattern; and
peeling the temporary support, in this order.

10. A transfer film comprising:
a temporary support; and
a transparent resin layer,
wherein the transparent resin layer contains a metal oxidation inhibitor and metal oxide particles, and
the metal oxidation inhibitor is at least one selected from the group consisting of imidazole, benzimidazole, tetrazole, mercaptothiadiazole, benzotriazole, 1-[N,N-bis(2-ethylhexyl)aminomethyl]benzotriazole, 1-[N,N-bis(2-ethylhexyl)aminomethyl]methylbenzotriazole, 2,2-{[(methyl-1H-benzotriazol-1-yl)methyl]imino}bisethanol, and carboxybenzotriazole.

11. The transfer film according to claim 10, wherein the metal oxide particles are titanium oxide particles, titanium composite oxide particles, zirconium oxide particles, or tin oxide particles.

12. The transfer film according to claim 10,
wherein the transparent resin layer is a first transparent resin layer,
the transfer film further comprises a second transparent resin layer between the temporary support and the first transparent resin layer, and
the second transparent resin layer is an alkali-developable layer having photosensitivity.

13. A method for manufacturing a laminate, the method comprising:
preparing the transfer film according to claim 10;
laminating the transparent resin layer of the transfer film on a transparent electrode pattern disposed on a base material, such that the transparent resin layer is brought into contact with the transparent electrode pattern; and
peeling the temporary support, in this order.

14. A laminate comprising:
a base material;
a transparent electrode pattern disposed on the base material;
a first transparent resin layer disposed adjacently to the transparent electrode pattern; and
a second transparent resin layer disposed on the first transparent resin layer,
wherein the first transparent resin layer contains a metal oxidation inhibitor, the first transparent resin layer has a refractive index of 1.60 or higher, and
the metal oxidation inhibitor is at least one selected from the group consisting of imidazole, benzimidazole, tetrazole, mercaptothiadiazole, benzotriazole, 1-[N,N-bis(2-ethylhexyl)aminomethyl]benzotriazole, 1-[N,N-bis(2-ethylhexyl)aminomethyl]methylbenzotriazole, 2,2-{[(methyl-1H-benzotriazol-1-yl)methyl]imino}bisethanol, and carboxybenzotriazole.

15. The laminate according to claim 14, wherein the base material is a transparent film substrate.

16. The laminate according to claim 15,
the transparent electrode pattern, the first transparent resin layer, and the second transparent resin layer are provided on both surfaces of the transparent film substrate.

17. The laminate according to claim 16, further comprising a transparent film having a refractive index of 1.60 to 1.78 and a film thickness of 55 to 110 nm, between the transparent electrode pattern and the transparent film substrate.

18. The laminate according to claim 14, further comprising a metal wiring section that is electrically connected to the transparent electrode pattern.

19. The laminate according to claim 18, wherein a metal oxidation inhibitor is provided on the metal wiring section in a region from which the first transparent resin layer and the second transparent resin layer have been removed.

20. The laminate according to claim 14, wherein the first transparent resin layer and/or the second transparent resin layer are patterned.

21. A capacitive input device comprising the laminate according to claim 14.

22. A laminate comprising:
a base material;
a transparent electrode pattern disposed on the base material;
a first transparent resin layer disposed adjacently to the transparent electrode pattern; and
a second transparent resin layer disposed on the first transparent resin layer,
wherein the first transparent resin layer contains a metal oxidation inhibitor and metal oxide particles, and
the metal oxidation inhibitor is at least one selected from the group consisting of imidazole, benzimidazole, tetrazole, mercaptothiadiazole, benzotriazole, 1-[N,N-bis(2-ethylhexyl)aminomethyl]benzotriazole, 1-[N,N-bis(2-ethylhexyl)aminomethyl]methylbenzotriazole, 2,2-{[(methyl-1H-benzotriazol-1-yl)methyl]imino}bisethanol, and carboxybenzotriazole.

23. A capacitive input device comprising the laminate according to claim 22.

24. A transfer film comprising:
a temporary support; and
a transparent resin layer containing a metal oxidation inhibitor,
wherein the transparent resin layer has a refractive index of 1.60 or higher, and
the transparent resin layer exhibits water-solubility that completely dissolves and/or disperses, in a case in which the transparent resin layer is immersed in water at 25° C., in an immersion time of 10 minutes/μm or less per unit film thickness.

25. A transfer film comprising:
a temporary support; and
a transparent resin layer containing a metal oxidation inhibitor,
wherein the transparent resin layer has a refractive index of 1.60 or higher, and
the transparent resin layer comprises at least one polymer selected from the group consisting of an acrylic polymer having an acid group, a polyvinyl ether/maleic acid anhydride polymer, water-soluble salts of carboxyalkyl celluloses, water-soluble cellulose ethers, water-soluble salts of carboxyalkyl starches, polyvinyl alcohol derivatives, polyvinylpyrrolidone, polyacrylamides, water-soluble polyamides, water-soluble salts of polyacrylic acid, gelatin, an ethylene oxide polymer, water-soluble salts of a family of starches and analogues thereof, a styrene/maleic acid copolymer, and a maleate resin.

* * * * *